US010879146B2

(12) United States Patent
Yanagida

(10) Patent No.: US 10,879,146 B2
(45) Date of Patent: Dec. 29, 2020

(54) ELECTRONIC COMPONENT AND MANUFACTURING METHOD THEREOF

(71) Applicant: ROHM CO., LTD., Kyoto (JP)

(72) Inventor: Hideaki Yanagida, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/373,253

(22) Filed: Apr. 2, 2019

(65) Prior Publication Data

US 2019/0311965 A1 Oct. 10, 2019

(30) Foreign Application Priority Data

Apr. 6, 2018 (JP) .................. 2018-074077
Apr. 6, 2018 (JP) .................. 2018-074078

(51) Int. Cl.
| H01L 23/31 | (2006.01) |
| H01L 21/48 | (2006.01) |
| H01L 23/498 | (2006.01) |
| H01L 23/13 | (2006.01) |
| H01L 21/56 | (2006.01) |
| H01L 23/538 | (2006.01) |
| H01L 23/00 | (2006.01) |

(52) U.S. Cl.
CPC ........ *H01L 23/3135* (2013.01); *H01L 21/481* (2013.01); *H01L 21/4853* (2013.01); *H01L 21/561* (2013.01); *H01L 23/13* (2013.01); *H01L 23/49811* (2013.01); *H01L 23/49838* (2013.01); *H01L 23/5386* (2013.01); *H01L 24/08* (2013.01); *H01L 2224/08225* (2013.01)

(58) Field of Classification Search
CPC ..... H01L 23/3135; H01L 23/31; H01L 21/48; H01L 21/561
USPC ........................................ 257/774
See application file for complete search history.

(56) References Cited

U.S. PATENT DOCUMENTS

| 2014/0252607 | A1 | 9/2014 | Miyauchi et al. |
| 2017/0317000 | A1* | 11/2017 | Nishimura ............ H01L 23/13 |
| 2018/0019177 | A1* | 1/2018 | Harada ............... H01L 23/5389 |

FOREIGN PATENT DOCUMENTS

| JP | 2013110402 | 6/2013 |
| JP | 2013197263 | 9/2013 |

* cited by examiner

*Primary Examiner* — Fazli Erdem
(74) *Attorney, Agent, or Firm* — Hamre, Schumann, Mueller & Larson, P.C.

(57) ABSTRACT

An electronic component includes a substrate which has a first major surface on one side and a second major surface on the other side, a chip which has a mounting surface on one side and a non-mounting surface on the other side and is disposed on the first major surface of the substrate in a posture that the mounting surface faces the first major surface of the substrate, a sealing insulation layer which seals the chip so as to expose the non-mounting surface above the first major surface of the substrate, and a cover layer which covers the non-mounting surface of the chip.

14 Claims, 65 Drawing Sheets

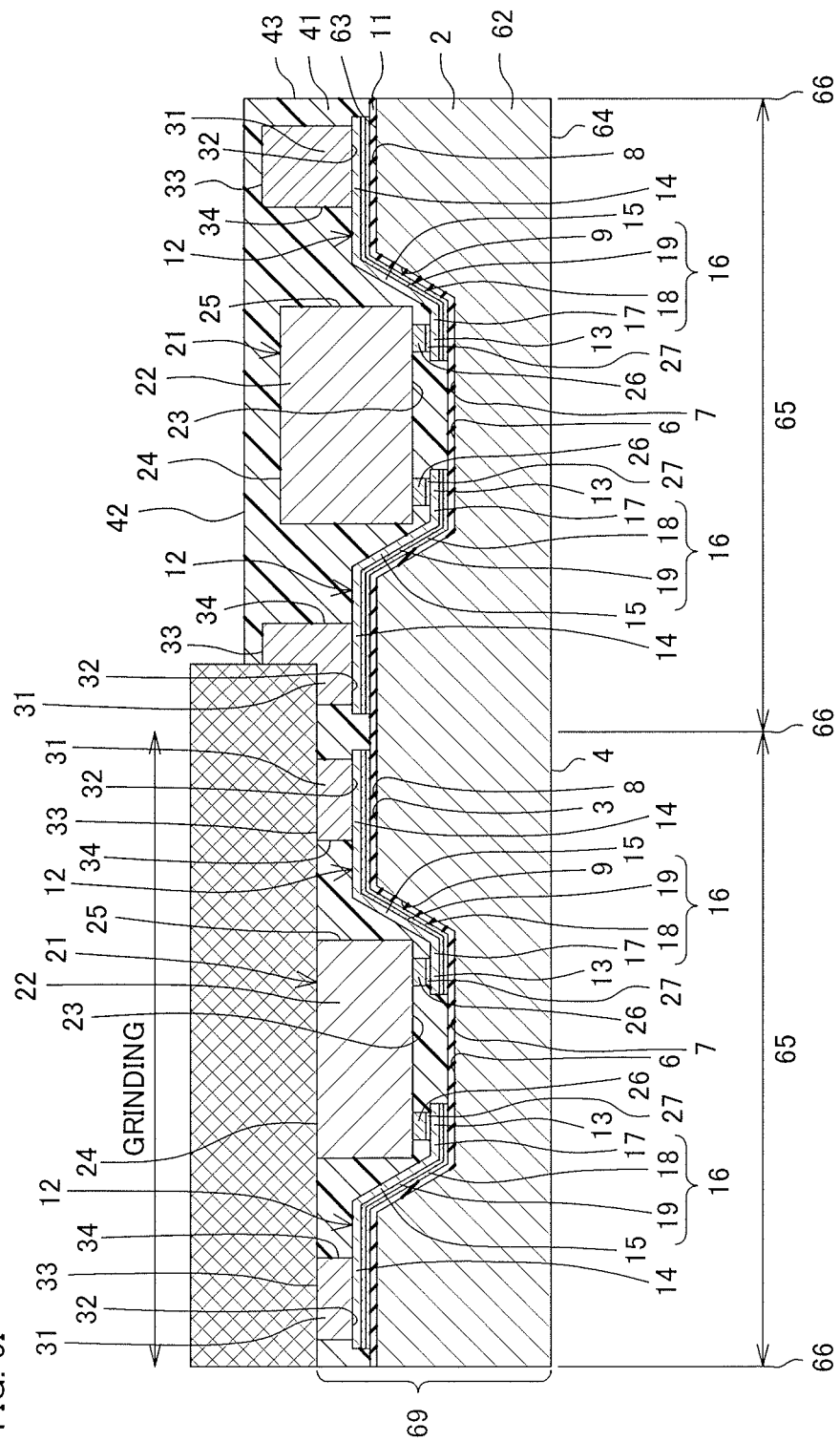

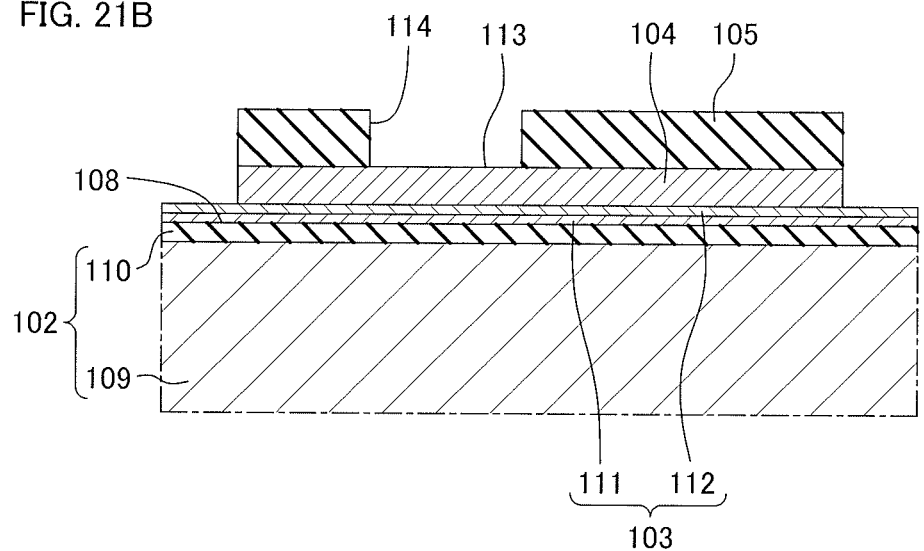
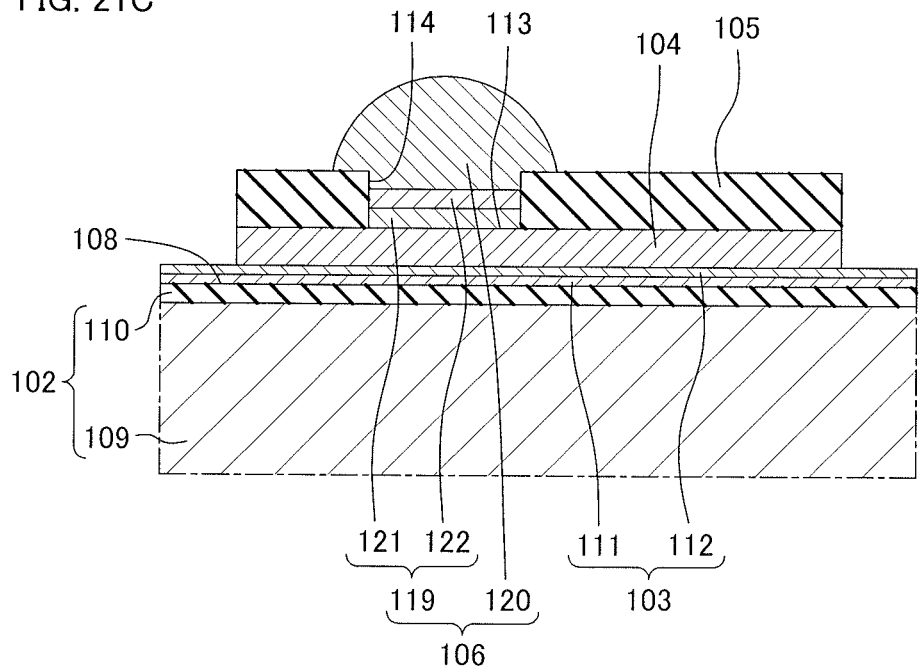

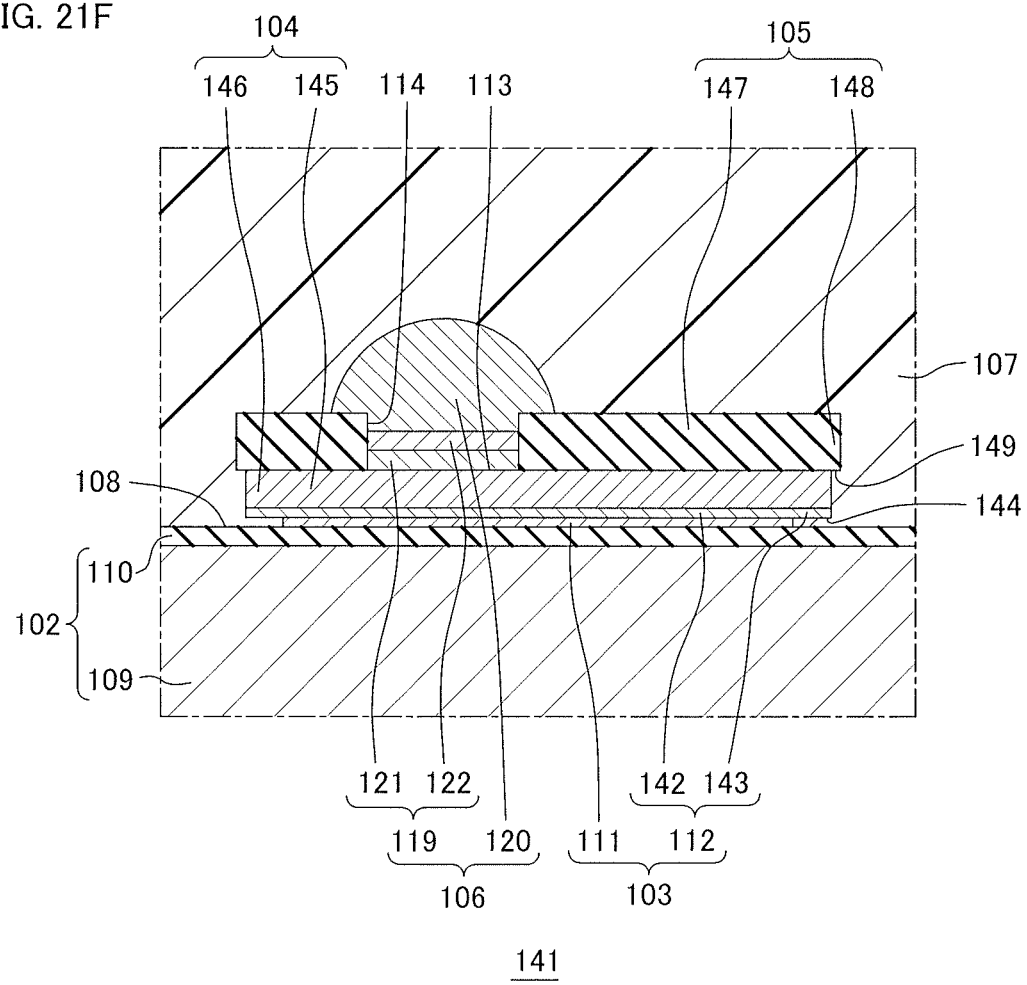

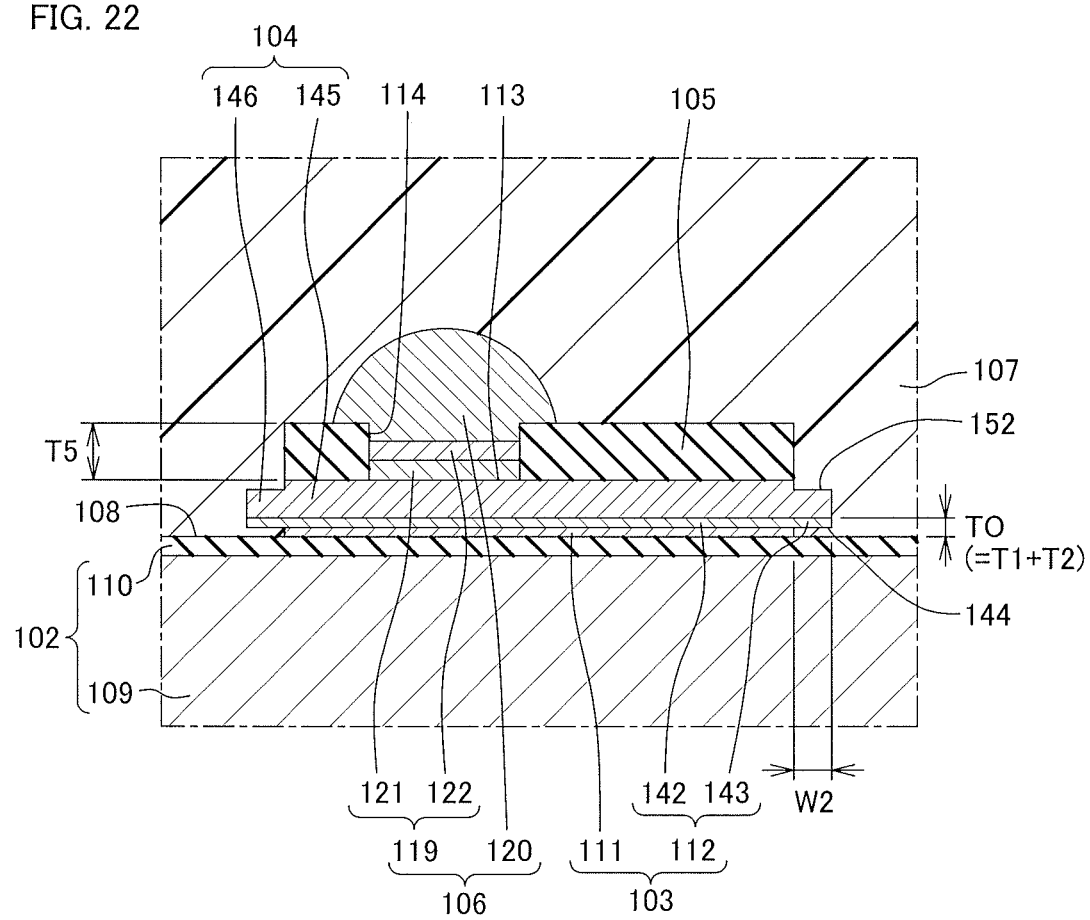

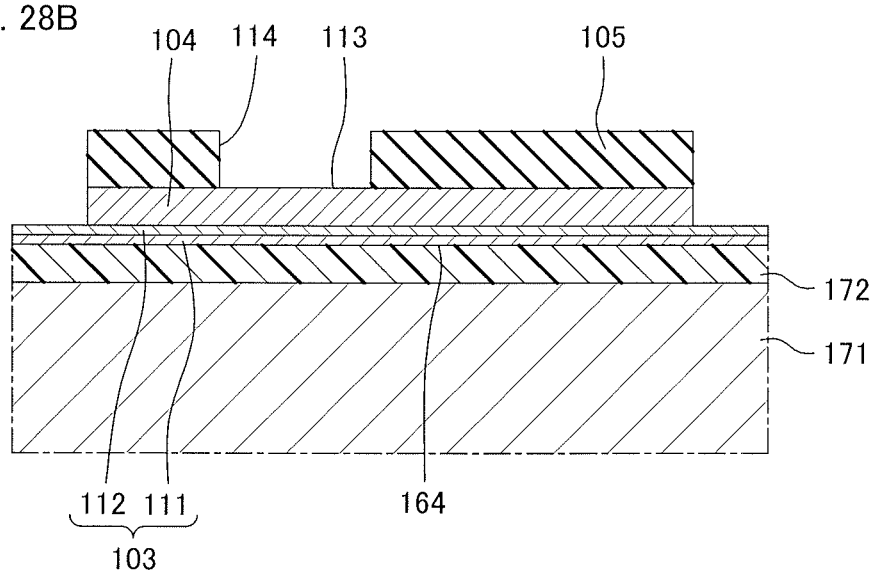
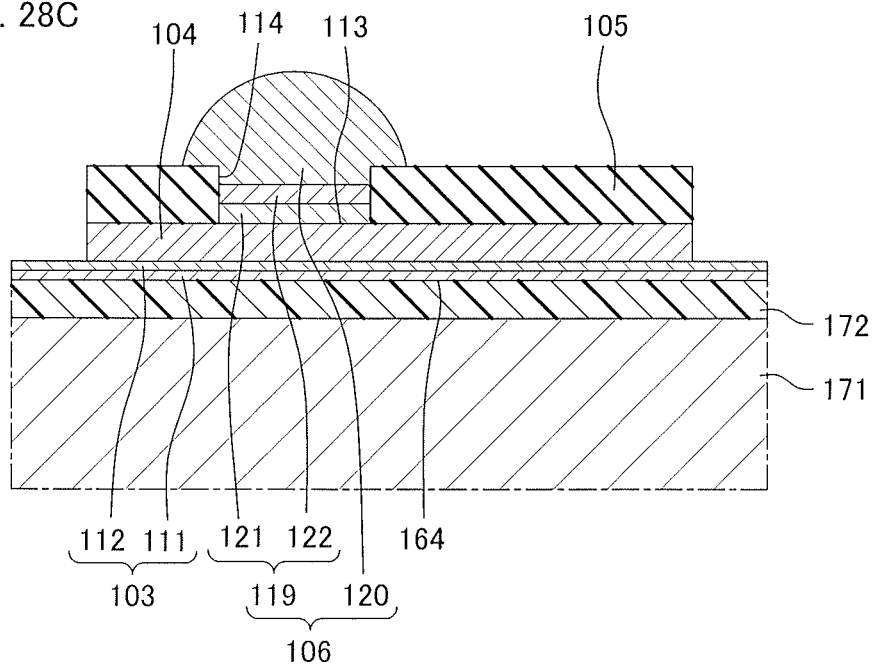

ELECTRONIC COMPONENT AND MANUFACTURING METHOD THEREOF

CROSS REFERENCE TO RELATED APPLICATIONS

This application claims the benefit of priority to Japanese Patent Application No. 2018-074077 filed on Apr. 6, 2018, and Japanese Patent Application No. 2018-074078 filed on Apr. 6, 2018. The entire contents of these applications are hereby incorporated herein by reference.

BACKGROUND OF THE INVENTION

1. Field of the Invention

The present invention relates to an electronic component and a manufacturing method thereof.

2. Description of the Related Art

Chips to be mounted on mounting substrates include a chip that is constituted of a monofunctional device or a chip that is constituted of a composite functional device. Examples of such a monofunctional device include a resistor, a capacitor, a coil, a diode, a transistor and others. The composite functional device is constituted with a combination of a plurality of monofunctional devices.

A wiring layout of the mounting substrate is ordinarily set on the basis of an electrode pitch of a chip. However, for convenience of the wiring layout, there is a case in which a wiring pitch of the mounting substrate is necessarily set greater than the electrode pitch of the chip. In this case, the chip is mounted on the mounting substrate through a pitch conversion substrate which is called an interposer.

JP2013-197263 discloses an example of an electronic component having a structure in which a chip is disposed on a pitch conversion substrate. The electronic component includes a wiring body (substrate) having one surface and the other surface, an external terminal formed on one surface of the wiring body, a semiconductor chip disposed on the other surface of the wiring body and a sealing resin for sealing the semiconductor chip on the other surface of the wiring body.

SUMMARY OF THE INVENTION

One preferred embodiment of the present invention provides an electronic component including a substrate which has a first major surface on one side and a second major surface on the other side, a chip which has a mounting surface on one side and a non-mounting surface on the other side and which is disposed on the first major surface of the substrate in a posture that the mounting surface faces the first major surface of the substrate, a sealing insulation layer which seals the chip so as to expose the non-mounting surface above the first major surface of the substrate, and a cover layer which covers the non-mounting surface of the chip.

One preferred embodiment of the present invention provides a method for manufacturing an electronic component including a step of preparing a base substrate that has a first major surface on one side and a second major surface on the other side, a step of preparing a chip that has a mounting surface on one side and a non-mounting surface on the other side, a step of setting a component region corresponding to the electronic component on the first major surface and disposing the chip at the component region in a posture that the mounting surface faces the first major surface, a step of sealing the chip on the first major surface by a sealing insulation layer, thereby forming a sealing structure that includes the base substrate, the chip and the sealing insulation layer, a step of grinding the sealing structure together with the chip from the non-mounting surface-side of the chip, thereby thinning the sealing structure, a step of forming a cover layer which covers the non-mounting surface of the chip, and a dicing step of cutting the sealing structure along the component region.

The aforementioned or other objects, features, and effects of the present invention will be clarified by the following description of preferred embodiments given below with reference to the accompanying drawings.

BRIEF DESCRIPTION OF THE DRAWINGS

FIG. 5A to FIG. 5M are cross-sectional views showing various process steps in an example of a method for manufacturing the electronic component shown in FIG. 1.

FIG. 21A to FIG. 21F are cross-sectional views showing various process steps in an example of a method for manufacturing the wiring structure body shown in FIG. 19.

FIG. 22 is a cross-sectional view which shows a wiring structure body according to a seventh preferred embodiment of the present invention.

FIG. 28A to FIG. 28F are cross-sectional views showing various process steps in an example of a method for manufacturing the wiring structure body shown in FIG. 26.

DETAILED DESCRIPTION OF THE PREFERRED EMBODIMENTS

Figure 1:
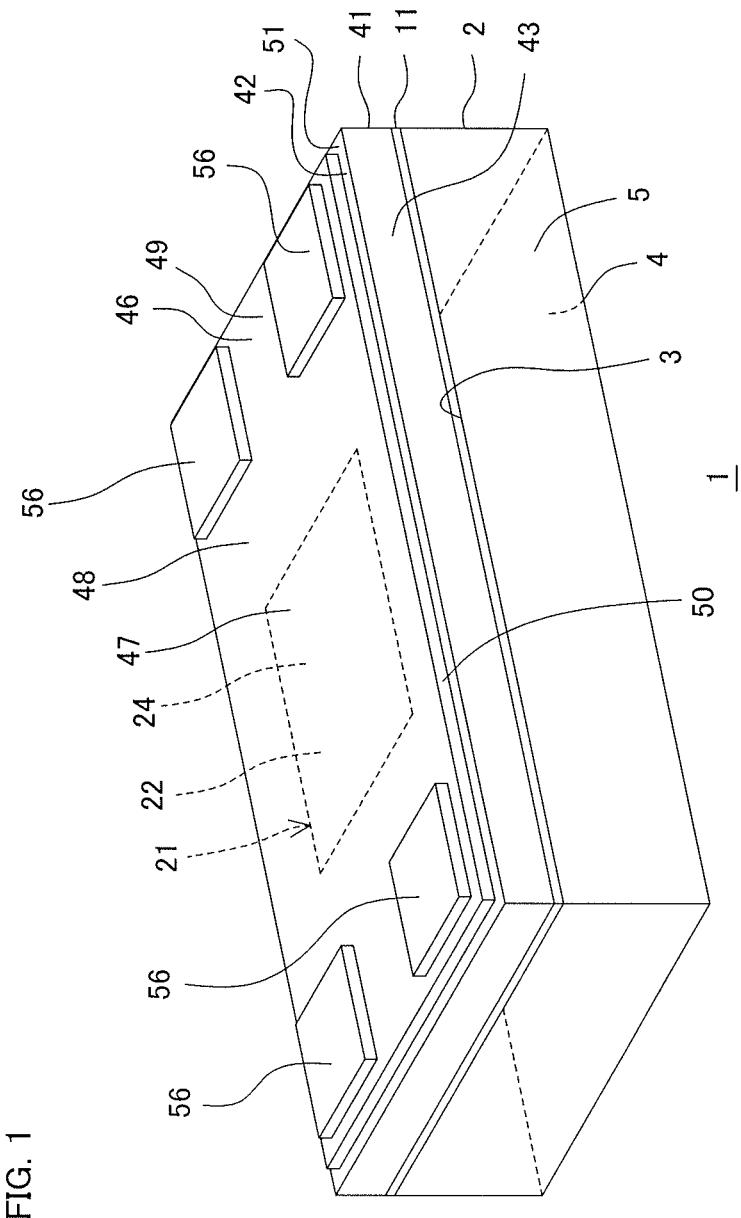
FIG. 1 is a perspective view which shows an electronic component according to a first preferred embodiment of the present invention.

In the electronic component disclosed in JP2013-197263, the chip disposed on the substrate is merely sealed by the sealing resin. In this case, the size of the electronic component is determined by the size of the substrate and the size of the chip and, therefore, the demand for downsizing cannot be satisfactorily met.

Thus, one preferred embodiment of the present invention provides an electronic component which can be downsized and a method for manufacturing such an electronic component.

One preferred embodiment of the present invention provides an electronic component including a substrate which has a first major surface on one side and a second major surface on the other side, a chip which has a mounting surface on one side and a non-mounting surface on the other side and which is disposed on the first major surface of the substrate in a posture that the mounting surface faces the first major surface of the substrate, a sealing insulation layer which seals the chip so as to expose the non-mounting surface above the first major surface of the substrate, and a cover layer which covers the non-mounting surface of the chip.

According to the electronic component, the sealing insulation layer is thinned to such an extent that the non-mounting surface of the chip is exposed from the sealing insulation layer. Thereby, the sealing insulation layer can be reduced in thickness. On the other hand, the non-mounting surface of the chip is covered with the cover layer. Thereby, the chip can be protected appropriately. Thus, it is possible to appropriately downsize the electronic component.

One preferred embodiment of the present invention provides a method for manufacturing an electronic component including a step of preparing a base substrate that has a first major surface on one side and a second major surface on the other side, a step of preparing a chip that has a mounting surface on one side and a non-mounting surface on the other side, a step of setting a component region corresponding to the electronic component on the first major surface and disposing the chip at the component region in a posture that the mounting surface faces the first major surface, a step of sealing the chip on the first major surface by a sealing insulation layer, thereby forming a sealing structure which includes the base substrate, the chip and the sealing insulation layer, a step of grinding the sealing structure together with the chip from the non-mounting surface-side of the chip, thereby thinning the sealing structure, a step of forming a cover layer which covers the non-mounting surface of the chip, and a dicing step of cutting the sealing structure along the component region.

According to the manufacturing method, in the step of thinning the sealing structure, the sealing insulation layer is ground to such an extent that the non-mounting surface of the chip is exposed. Thereby, the sealing structure can be reduced in thickness. Since the chip is ground in a state of being sealed in the sealing insulation layer in the step of thinning the sealing structure, it is possible to prevent damage of the chip resulting from the grinding. Further, the non-mounting surface of the chip is covered with the cover layer in the subsequent step. Thereby, the chip can be protected appropriately. Thus, it is possible to appropriately downsize the electronic component.

Hereinafter, preferred embodiments of the present invention will be described in detail with reference to the attached drawings.

Figure 2:
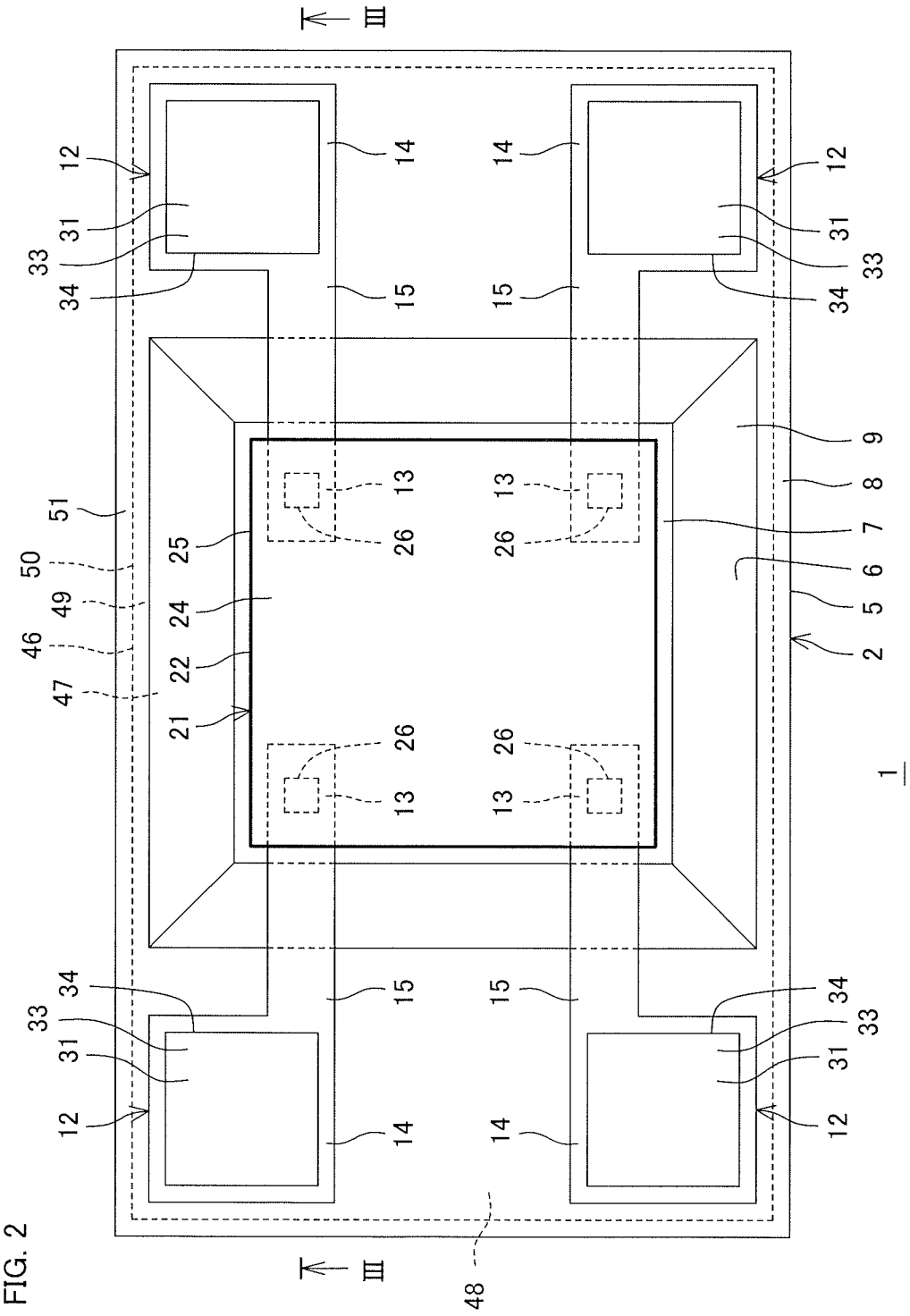
FIG. 2 is a plan view which shows an internal structure of the electronic component shown in FIG. 1.
Figure 3:
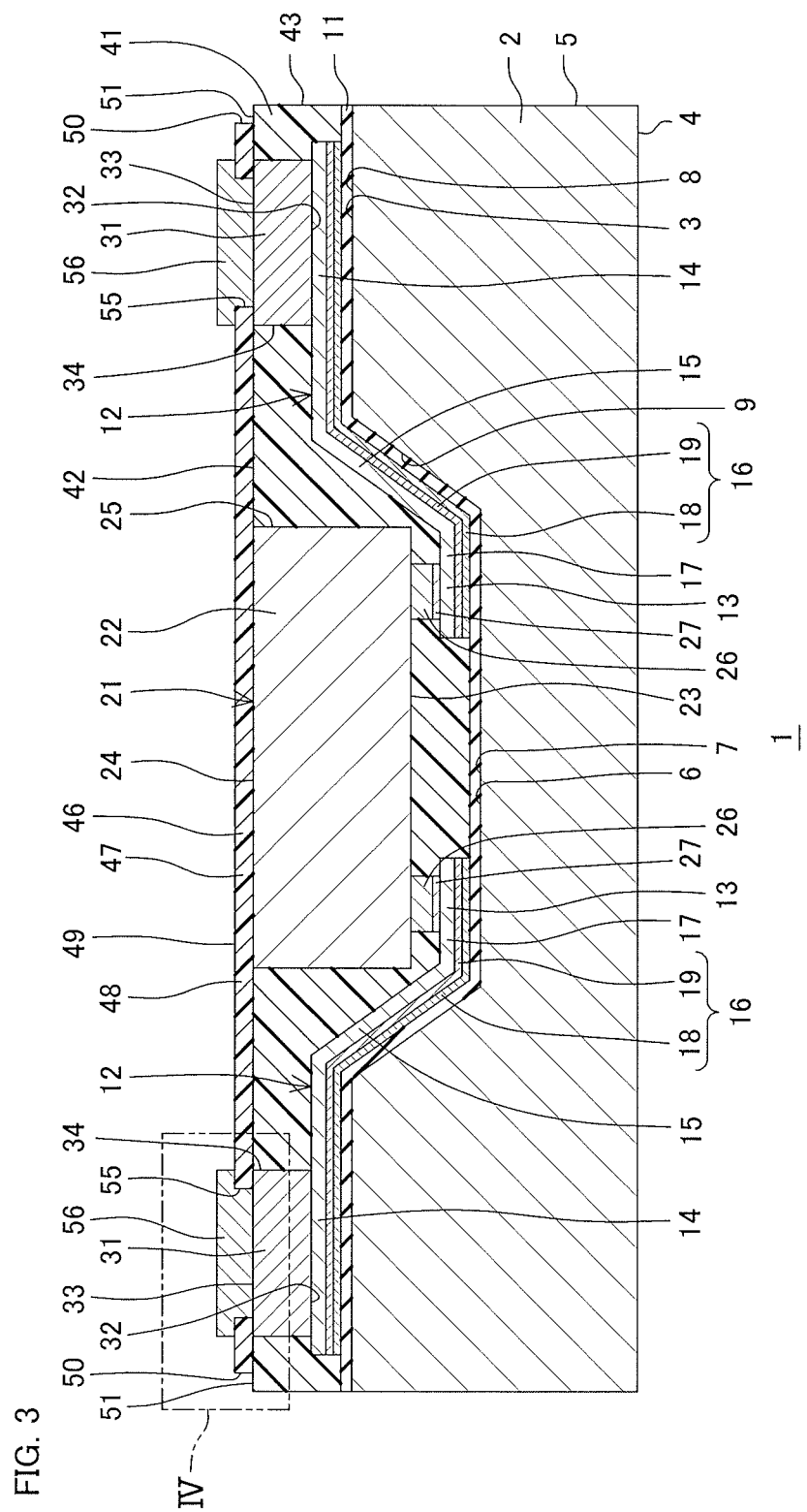
FIG. 3 is a cross-sectional view which is taken along line III-III shown in FIG. 2.
Figure 4:
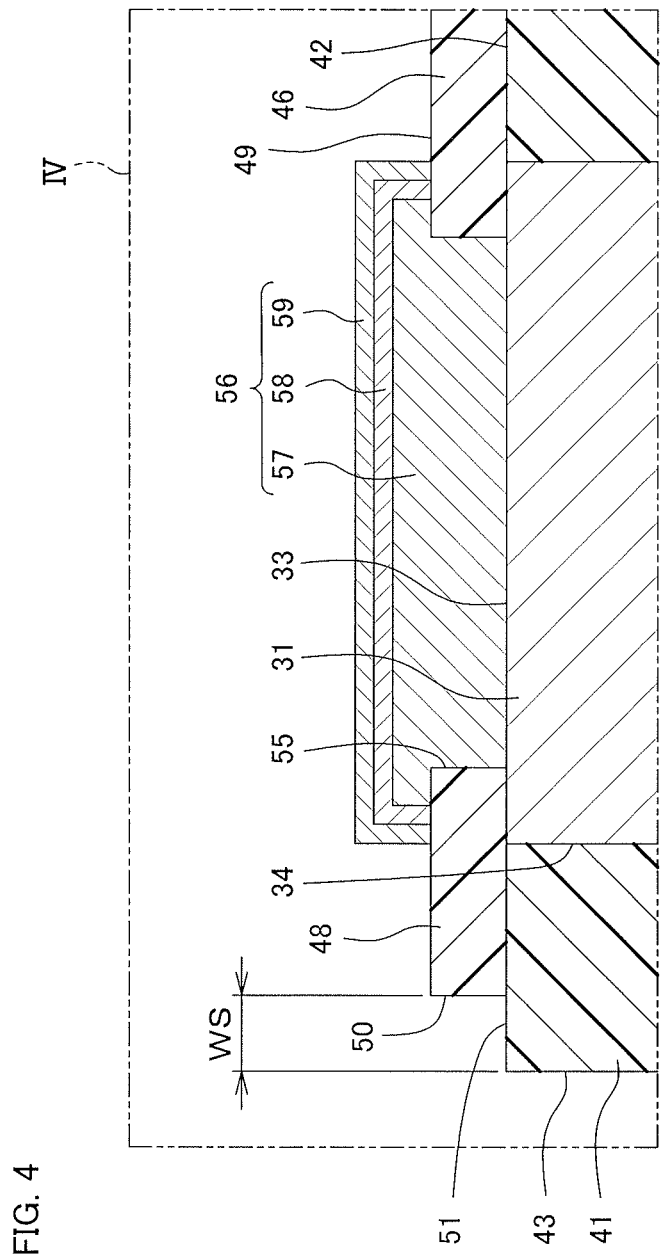
FIG. 4 is an enlarged view of a region IV shown in FIG. 3.

FIG. 1 is a perspective view which shows an electronic component 1 according to the first preferred embodiment of the present invention. FIG. 2 is a plan view which shows an internal structure of the electronic component 1 shown in FIG. 1. FIG. 3 is a cross-sectional view which is taken along line III-III shown in FIG. 2. FIG. 4 is an enlarged view of a region IV shown in FIG. 3.

The electronic component 1 includes an interposer 2 as a pitch conversion substrate. The interposer 2 has a first major surface 3 on one side, a second major surface 4 on the other side, and a side surface 5 which connects the first major surface 3 and the second major surface 4.

The first major surface 3 and the second major surface 4 of the interposer 2 are each formed in a quadrangle shape (in a rectangular shape in the preferred embodiment) in a plan view taken from their normal directions (hereinafter, simply referred to as "plan view"). A recess portion 6 which is recessed toward the second major surface 4 is formed on the first major surface 3. The second major surface 4 is formed in a flat shape.

The recess portion 6 is formed at a center portion of the first major surface 3 to be spaced from a peripheral edge of the interposer 2. The recess portion 6 is formed in a quadrangle shape which has four sides substantially parallel to the respective four sides of the interposer 2 in plan view. The recess portion 6 may be formed in a polygonal shape other than a quadrangle shape such as a triangular shape and a hexagonal shape in plan view. The recess portion 6 may be formed in a circular shape or an elliptical shape in plan view.

On the first major surface 3, there is formed a low region 7, a high region 8 and a connection portion 9 by the recess portion 6. The low region 7 is made up of a bottom portion of the recess portion 6. The high region 8 is made up of a region around the recess portion 6. The connection portion 9 connects the low region 7 and the high region 8.

The low region 7 is formed in a quadrangle shape which has four sides substantially parallel to the respective four sides of the interposer 2 in plan view. The high region 8 is formed in a quadrangular annular shape which surrounds the recess portion 6 in plan view. The connection portion 9 has an inclined surface which is inclined downward from the high region 8 to the low region 7. That is, the recess portion 6 is formed in a tapered shape in which an opening is reduced in width from the high region 8 to the low region 7 in a cross-sectional view.

The interposer 2 may include a semiconductor material. The interposer 2 may include at least any one of silicon, a nitride semiconductor material (for example, gallium nitride) and an oxide semiconductor material (for example, gallium oxide) as an example of the semiconductor material. The interposer 2 includes silicon in the preferred embodiment.

The electronic component 1 includes a major surface insulation layer 11 which is formed in a film shape on the first major surface 3. The major surface insulation layer 11 may include an inorganic insulating material. The major surface insulation layer 11 may include at least any one of silicon oxide, silicon nitride, silicon oxynitride, aluminum oxide, aluminum nitride, and aluminum oxynitride.

The electronic component 1 includes a plurality of wiring layers 12 (four layers in the preferred embodiment) which are formed on the major surface insulation layer 11. The plurality of wiring layers 12 are each formed so as to cross the connection portion 9 and extend between the low region 7 and the high region 8. The plurality of wiring layers 12 each include a first pad region 13, a second pad region 14 and a wiring region 15.

In the preferred embodiment, the plurality of first pad regions 13 are formed one each at each of the four corners of the low region 7. The first pad regions 13 are each formed in a quadrangle shape in plan view. In the preferred embodiment, the plurality of second pad regions 14 are formed one each at each of the four corners of the high region 8. The second pad regions 14 are each formed in a quadrangle shape in plan view.

The plurality of wiring regions 15 each connect the first pad region 13 and the second pad region 14 which correspond thereto. The wiring region 15 is drawn around in a line shape at a region between the low region 7 and the high region 8 so as to cross the connection portion 9. The wiring region 15 may be drawn around in any mode.

In the preferred embodiment, each of the wiring layers 12 has a stacked-layer structure which includes a first electrode layer 16 and a second electrode layer 17 stacked in this order from the side of the first major surface 3. The first electrode layer 16 may be a seed layer. The second electrode layer 17 may be a plating layer.

In the preferred embodiment, the first electrode layer 16 has a stacked-layer structure which includes a titanium layer 18 and a copper layer 19 stacked in this order from the side of the first major surface 3. In the preferred embodiment, the second electrode layer 17 has a single layer structure which includes a copper layer (more specifically, a copper plating layer). The second electrode layer 17 may be formed integrally with the copper layer 19 of the first electrode layer 16. The second electrode layer 17 is greater in thickness than the first electrode layer 16. The wiring layer 12 is reduced in resistance value by the second electrode layer 17.

The electronic component 1 includes a chip 21 which is disposed on the first major surface 3. The chip 21 is disposed inside the recess portion 6. The chip 21 includes a chip main body 22 formed in a rectangular parallelepiped shape. The chip main body 22 has a mounting surface 23 on one side, a non-mounting surface 24 on the other side, and a chip side surface 25 which connects the mounting surface 23 and the non-mounting surface 24. The non-mounting surface 24 is free of an electrode. The non-mounting surface 24 is made up of a ground surface.

The thickness of the chip 21 may be 50 μm or more and 1000 μm or less. The thickness of the chip 21 may be 50 μm or more and 100 μm or less, from 100 μm or more and 200 μm or less, from 200 μm or more and 400 μm or less, from 400 μm or more and 600 μm or less, from 600 μm or more and 800 μm or less, or from 800 μm or more and 1000 μm or less.

The chip main body 22 may include at least any one of silicon, a nitride semiconductor material (for example, gallium nitride), an oxide semiconductor material (for example, gallium oxide), glass and ceramic. The chip main body 22 includes a functional device. The functional device may be formed on the side of the mounting surface 23. The functional device may include at least anyone of a resistor, a capacitor, a coil, a diode and a transistor.

The chip 21 may include a monofunctional device or a composite functional device. The composite functional device is constituted with a combination of the plurality of monofunctional devices. The chip 21 may be a discrete device or an IC (Integrated Circuit) device.

The chip 21 includes a plurality of terminal electrodes 26 (four in the preferred embodiment) which are formed on the mounting surface 23. The plurality of terminal electrodes 26 are electrically connected to the functional device. The chip 21 may include an insulation layer which covers the mounting surface 23. On the insulation layer, there may be formed a wiring (wiring layer) which is electrically connected to the terminal electrode 26 and the functional device. In this case, the plurality of terminal electrodes 26 may protrude outside from the insulation layer.

The chip 21 is disposed over the first major surface 3 in a posture that the mounting surface 23 faces the interposer 2. The chip 21 is disposed over the low region 7. The plurality of terminal electrodes 26 are each bonded to the first pad region 13 of the wiring layer 12 through an electroconductive bonding material 27. The electroconductive bonding material 27 may include solder or metallic paste.

The mounting surface 23 of the chip 21 is positioned at a region between the low region 7 and the high region 8. The non-mounting surface 24 of the chip 21 protrudes above the high region 8. The mounting surface 23 and the non-mounting surface 24 have an area less than an area of the low region 7 in plan view. The entirety of the mounting surface 23 faces the low region 7. That is, the chip 21 is positioned inside a region surrounded by a peripheral edge of the low region 7.

The mounting surface 23 and the non-mounting surface 24 may have an area larger than an area of the low region 7 in plan view. In this case, the mounting surface 23 may face a portion of the low region 7 and a portion of the connection portion 9.

The electronic component 1 includes a plurality of electrode bodies 31 which are individually formed on the plurality of second pad regions 14. The plurality of electrode bodies 31 are formed on the corresponding second pad regions 14 in a one-to-one correspondence relationship. The plurality of electrode bodies 31 are formed in a block shape or a pillar shape.

The plurality of electrode bodies 31 each have a single layer structure which includes a copper layer (more specifically, a copper plating layer). The plurality of electrode bodies 31 each have a first electrode surface 32 on one side, a second electrode surface 33 on the other side, and an electrode side surface 34 which connects the first electrode surface 32 and the second electrode surface 33. The first electrode surfaces 32 of the plurality of electrode bodies 31 are each bonded to a corresponding second pad region 14. The second electrode surfaces 33 of the plurality of electrode bodies 31 are each made up of a ground surface.

The electronic component 1 includes a sealing insulation layer 41 which seals the chip 21 on the first major surface 3. The sealing insulation layer 41 includes an organic insulating material. The sealing insulation layer 41 may be made up of a sealing resin. The sealing insulation layer 41 may include a negative type or a positive type photosensitive resin. The sealing insulation layer 41 may include at least anyone of an epoxy resin, a polyimide resin, a polyamide resin, a polybenzoxazole resin, and an acrylic resin.

The sealing insulation layer 41 seals the chip 21 so as to expose the non-mounting surface 24 of the chip 21. The sealing insulation layer 41 also seals the plurality of electrode bodies 31 so as to expose the second electrode surfaces 33 of the plurality of electrode bodies 31. The sealing insulation layer 41 exposes the entirety of the non-mounting surface 24 and the entirety of the second electrode surfaces 33. The sealing insulation layer 41 fills a space between the low region 7 and the mounting surface 23 of the chip 21, and covers the entirety of the chip side surface 25 and the entirety of the electrode side surfaces 34.

The sealing insulation layer 41 includes a sealing major surface 42 and a sealing side surface 43. The sealing major surface 42 faces the first major surface 3 of the interposer 2. More specifically, the sealing major surface 42 is formed so as to be substantially parallel to the first major surface 3.

The sealing major surface 42 is connected to the non-mounting surface 24 of the chip 21 without any difference in level. The sealing major surface 42 has a flat surface which extends continuously from the non-mounting surface 24. That is, the sealing insulation layer 41 has an outer surface which is formed so as to be flush with the non-mounting surface 24. The sealing major surface 42 forms one ground surface with the non-mounting surface 24.

The sealing major surface 42 is connected to the second electrode surfaces 33 of the plurality of electrode bodies 31 without any difference in level. The sealing major surface 42 has a flat surface which extends continuously from the plurality of second electrode surfaces 33. That is, the sealing insulation layer 41 has an outer surface which is formed so as to be flush with the plurality of second electrode surfaces 33. The sealing major surface 42 forms one ground surface with the plurality of second electrode surfaces 33.

That is, the sealing major surface 42 forms one flat surface with the non-mounting surface 24 and the plurality of second electrode surfaces 33. The flat surface is made up of a ground surface and formed so as to be substantially parallel to the second major surface 4 of the interposer 2.

The sealing side surface 43 extends toward the interposer 2 from a peripheral edge of the sealing major surface 42. The sealing side surface 43 is connected to the side surface 5 of the interposer 2 without any difference in level. The sealing side surface 43 is formed to be flush with the side surface 5 of the interposer 2.

The electronic component 1 includes a cover layer 46 which covers the non-mounting surface 24 of the chip 21 on the sealing major surface 42. The cover layer 46 exposes a peripheral edge portion of the sealing major surface 42. More specifically, the cover layer 46 includes a covering portion 47 and an extension portion 48.

The covering portion 47 covers the entirety of the non-mounting surface 24 of the chip 21. The extension portion 48 is drawn out onto the sealing major surface 42 from the covering portion 47. The extension portion 48 is drawn out up to a region which is close to the peripheral edge (sealing side surface 43) of the sealing major surface 42. That is, the extension portion 48 is formed to be spaced inwardly from the peripheral edge (sealing side surface 43) of the sealing major surface 42. An exposed portion which is exposed from the cover layer 46 in the sealing major surface 42 is formed in an annular shape (more specifically, in a quadrangular annular shape) so as to surround the cover layer 46 in plan view.

Further, the cover layer 46 includes a cover major surface 49 and a cover side surface 50. The cover major surface 49 is formed so as to be substantially parallel to the non-mounting surface 24 of the chip 21. The cover side surface 50 is positioned at a region that is spaced inwardly from the sealing side surface 43 in plan view. Thereby, a step portion 51 is formed at a region between the cover side surface 50 and the sealing side surface 43.

The step portion 51 is formed so as to surround the cover layer 46 (more specifically, in a quadrangular annular shape) in plan view. With reference to FIG. 4, a width WS of the step portion 51 may be 1 µm or more under conditions that the non-mounting surface 24 of the chip 21 is covered entirely. The width WS is a width in a direction which is orthogonal to a direction in which the step portion 51 extends. The width WS is preferably 10 µm or more.

The thickness of the cover layer 46 is less than that of the sealing insulation layer 41. The thickness of the cover layer 46 is less than that of the chip 21. The thickness of the cover layer 46 may be equal to one-half or less than that of the chip 21. The thickness of the cover layer 46 may be less than one-half of that of the chip 21. The thickness of the cover layer 46 may be equal to one-fourth or less than that of the chip 21. The thickness of the cover layer 46 may be less than one-fourth of that of chip 21. The thickness of the cover layer 46 may be equal to one-hundredth or more than that of the chip 21. The thickness of the cover layer 46 may be equal to one-thousandth or more than that of the chip 21.

The thickness of the cover layer 46 may be 1 µm or more and 50 µm or less. The thickness of the cover layer 46 may be 1 µm or more and 2 µm or less, from 2 µm or more and 4 µm or less, from 4 µm or more and 6 µm or less, from 6 µm or more and 8 µm or less, or from 8 µm or more and 10 µm or less. The thickness of the cover layer 46 may be 1 µm or more and 10 µm or less, from 10 µm or more and 20 µm or less, from 20 µm or more and 30 µm or less, from 30 µm or more and 40 µm or less, or from 40 µm or more and 50 µm or less.

The cover layer 46 may have a single layer structure made up of a single insulating material layer. The cover layer 46 may have a stacked-layer structure in which a plurality of insulating material layers are stacked. The cover layer 46 may include an organic insulating material and/or an inorganic insulating material.

The cover layer 46 may have a negative type or a positive type photosensitive resin as an example of the organic insulating material. The cover layer 46 may include at least any one of an epoxy resin, a polyimide resin, a polyamide resin, a polybenzoxazole resin and an acrylic resin. The cover layer 46 may include at least any one of silicon oxide, silicon nitride, silicon oxynitride, aluminum oxide, aluminum nitride and aluminum oxynitride as an example of the inorganic insulating material.

A plurality of openings 55 (four in the preferred embodiment) are formed in the cover layer 46. The plurality of openings 55 expose individually the corresponding second electrode surfaces 33 of the electrode bodies 31.

The electronic component 1 includes a plurality of external electrode layers 56 which are electrically connected to the plurality of electrode bodies 31. The plurality of external electrode layers 56 are connected to the second electrode surfaces 33 of the electrode bodies 31 inside the corresponding openings 55. Each of the external electrode layers 56 protrudes above the cover major surface 49. Each of the external electrode layers 56 includes an overlap portion which covers the cover major surface 49.

With reference to FIG. 4, the plurality of external electrode layers 56 each have a stacked-layer structure which includes a plurality of electrode layers. In the preferred embodiment, the plurality of external electrode layers 56 each have a stacked-layer structure including an Ni layer 57, a Pd layer 58 and an Au layer 59 which are stacked in this order from the second electrode surface 33-side of the electrode body 31.

The Ni layer 57 is connected to the second electrode surface 33 of the electrode body 31 inside the opening 55. The Ni layer 57 protrudes above the cover major surface 49. The Ni layer 57 has an overlap portion which covers the cover major surface 49.

The Pd layer 58 covers an outer surface of the Ni layer 57 on the cover major surface 49. The thickness of the Pd layer 58 is less than that of the Ni layer 57. The Au layer 59 covers an outer surface of the Pd layer 58 on the cover major surface 49. The thickness of the Au layer 59 is less than that of the Ni layer 57.

As described so far, according to the electronic component 1, the sealing insulation layer 41 is thinned to such an extent that the non-mounting surface 24 of the chip 21 is exposed from the sealing insulation layer 41. Thereby, the sealing insulation layer 41 can be reduced in thickness. On the other hand, the non-mounting surface 24 of the chip 21 is covered with the cover layer 46. Thereby, the chip 21 can be protected appropriately. Thus, it is possible to appropriately downsize the electronic component 1.

FIG. 5A to FIG. 5M are cross-sectional views showing various process steps in an example of a method for manufacturing the electronic component 1 shown in FIG. 1.

Figure 5A:
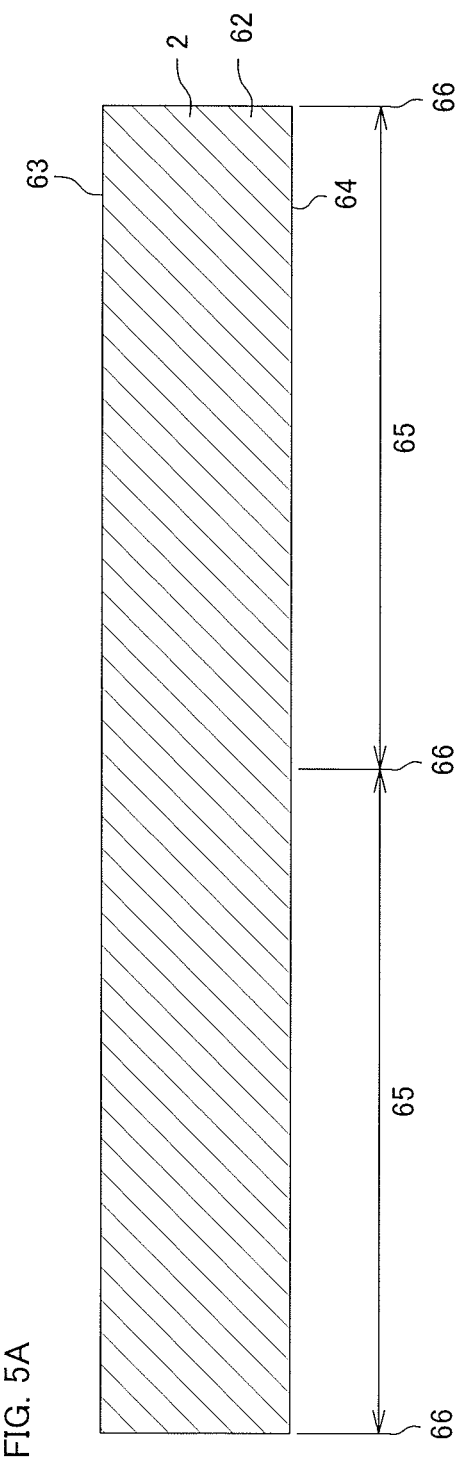

With reference to FIG. 5A, a base substrate 62 is prepared. The base substrate 62 serves as a base of the interposer 2. The base substrate 62 may be a silicon wafer in a disk shape. The base substrate 62 has a first major surface 63 on one side and a second major surface 64 on the other side. The first major surface 63 and the second major surface 64 of the base substrate 62 correspond respectively to the first major surface 3 and the second major surface 4 of the interposer 2.

Then, a plurality of component regions 65 and a boundary region 66 are set in the first major surface 63 of the base substrate 62. The plurality of component regions 65 are each a region in which the electronic component 1 is formed. The plurality of component regions 65 may be set in a matrix shape in plan view. The boundary region 66 is a region which demarcates the plurality of component regions 65. The boundary region 66 may be set in a lattice shape. The boundary region 66 is given as a dicing line.

Figure 5B:
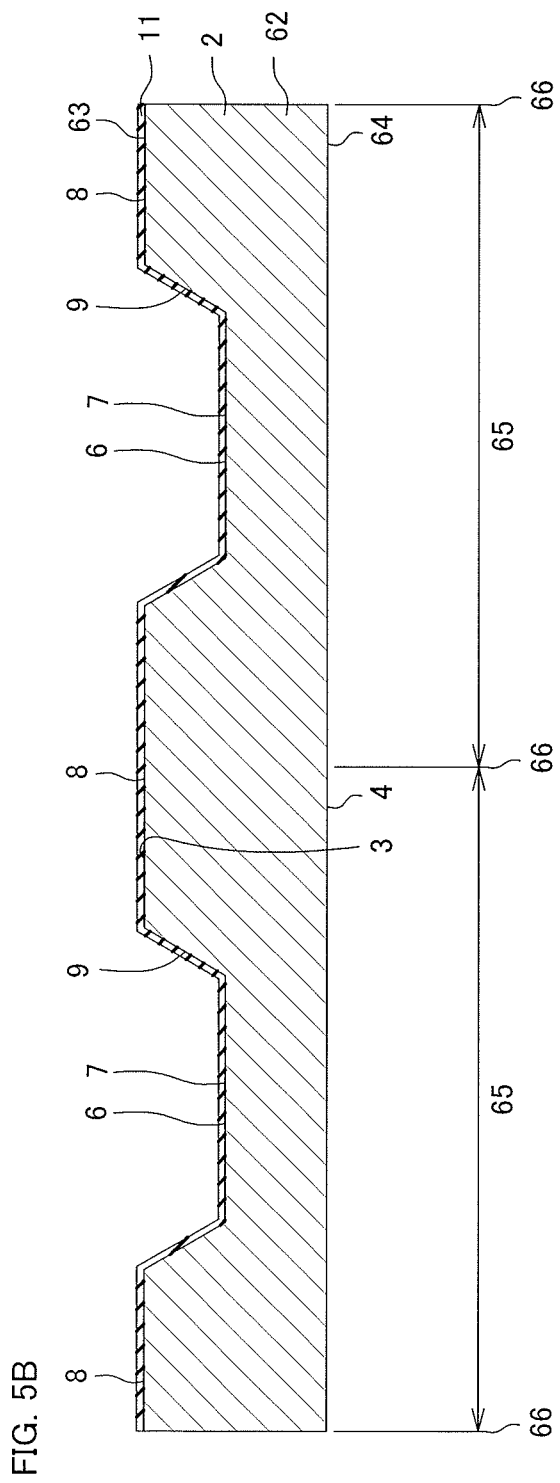

Then, with reference to FIG. 5B, at each of the component regions 65, the recess portion 6 is formed in the first major surface 63 of the base substrate 62. The recess portion 6 is formed by selectively digging down the first major surface 63, for example, by etching through a mask (not shown).

Then, the major surface insulation layer 11 is formed on the first major surface 63 of the base substrate 62. The major surface insulation layer 11 may be formed by a CVD (Chemical Vapor Deposition) method or thermal oxidation treatment. The major surface insulation layer 11 may be a silicon oxide film.

Figure 5C:
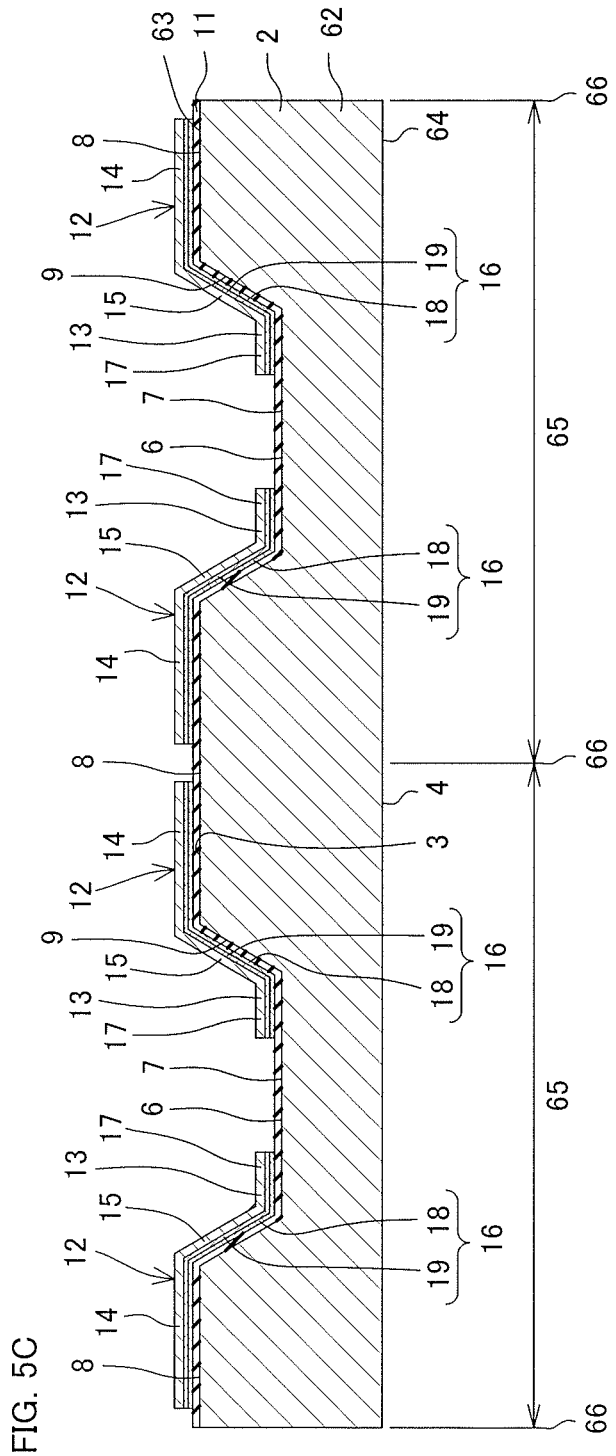

Then, with reference to FIG. 5C, the plurality of wiring layers 12 are formed on the major surface insulation layer 11. In this step, the first electrode layer 16 is first formed on the entire front surface of the major surface insulation layer 11. The step of forming the first electrode layer 16 includes a step of forming a titanium layer 18 and a copper layer 19 in this order from the side of the major surface insulation layer 11. The titanium layer 18 and the copper layer 19 may be each formed by a sputtering method. The titanium layer 18 and the copper layer 19 are each formed as a seed layer.

Then, a mask (not shown) having a predetermined pattern is formed on the first electrode layer 16. The mask (not shown) has a plurality of openings which expose a region at which a plurality of second electrode layers 17 are to be formed in the first electrode layer 16.

Then, the plurality of second electrode layers 17 are formed on the first electrode layer 16. The plurality of second electrode layers 17 are formed on a portion which is exposed from the plurality of openings of the mask (not shown) in the first electrode layer 16. The second electrode layer 17 may be formed by an electrolytic copper plating method. The mask (not shown) is removed thereafter.

Then, a portion which is exposed from the second electrode layer 17 in the first electrode layer 16 is removed. An unnecessary portion of the first electrode layer 16 may be removed by etching in which the second electrode layer 17 is used as a mask. Thereby, a plurality of wiring layers 12 having a predetermined pattern are formed.

Figure 5D:
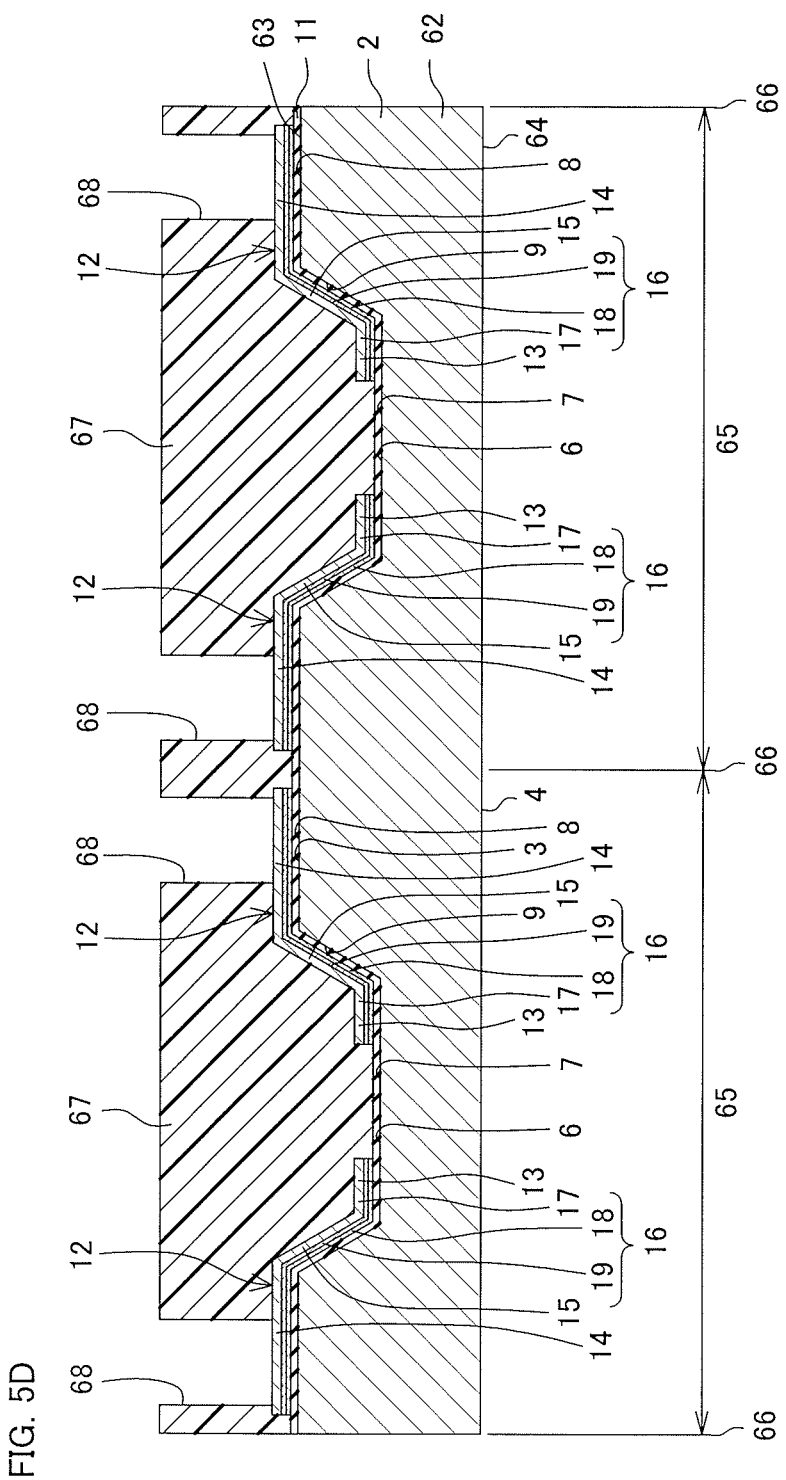

Then, with reference to FIG. 5D, a mask 67 having a predetermined pattern is formed on the major surface insulation layer 11. The mask 67 has a plurality of openings 68 which expose individually the first pad regions 13 of the plurality of wiring layers 12.

Figure 5E:
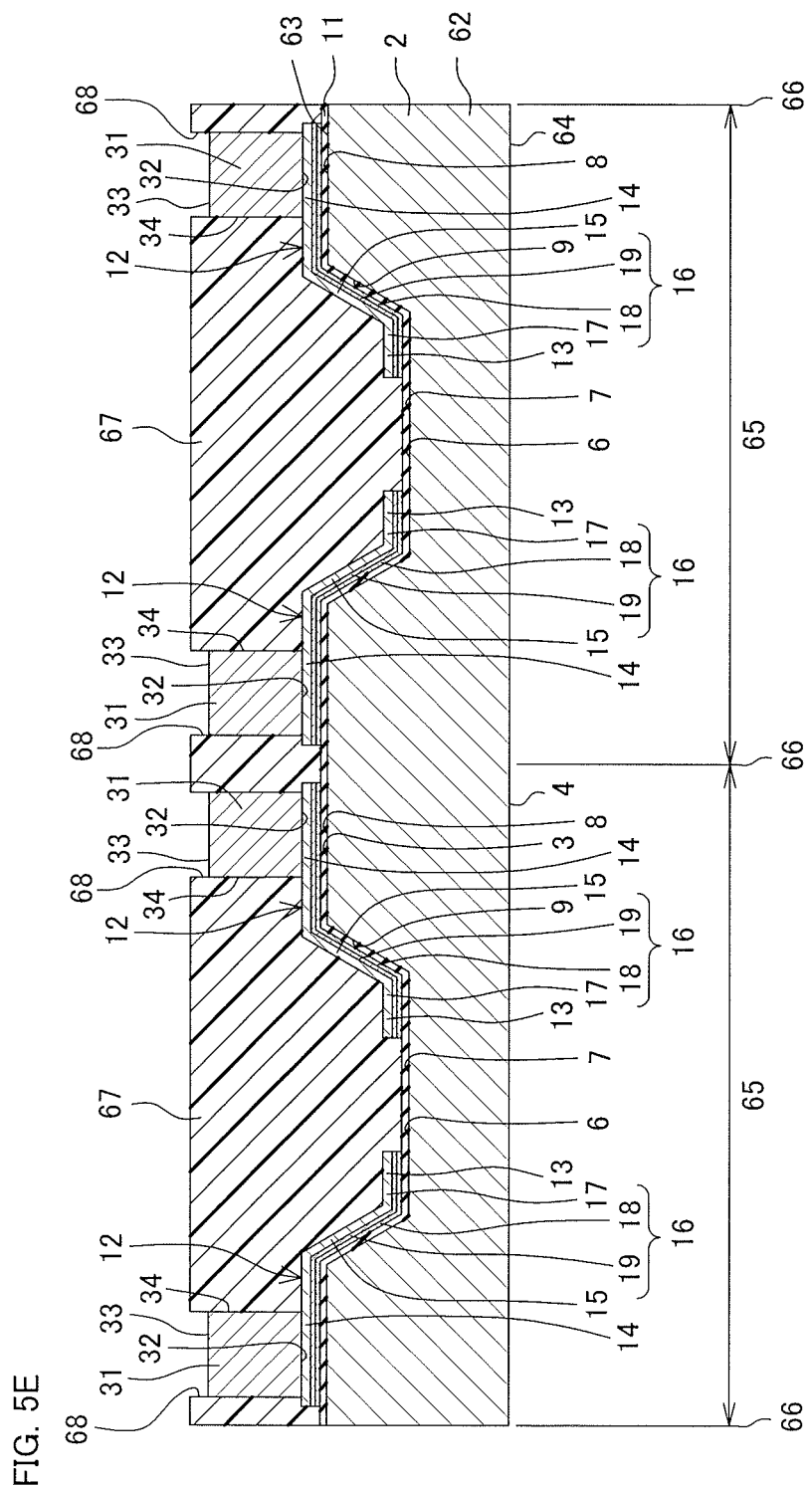

Then, with reference to FIG. 5E, the plurality of electrode bodies 31 are each formed on a corresponding first pad region 13. The plurality of electrode bodies 31 may be formed by an electrolytic copper plating method.

Figure 5F:
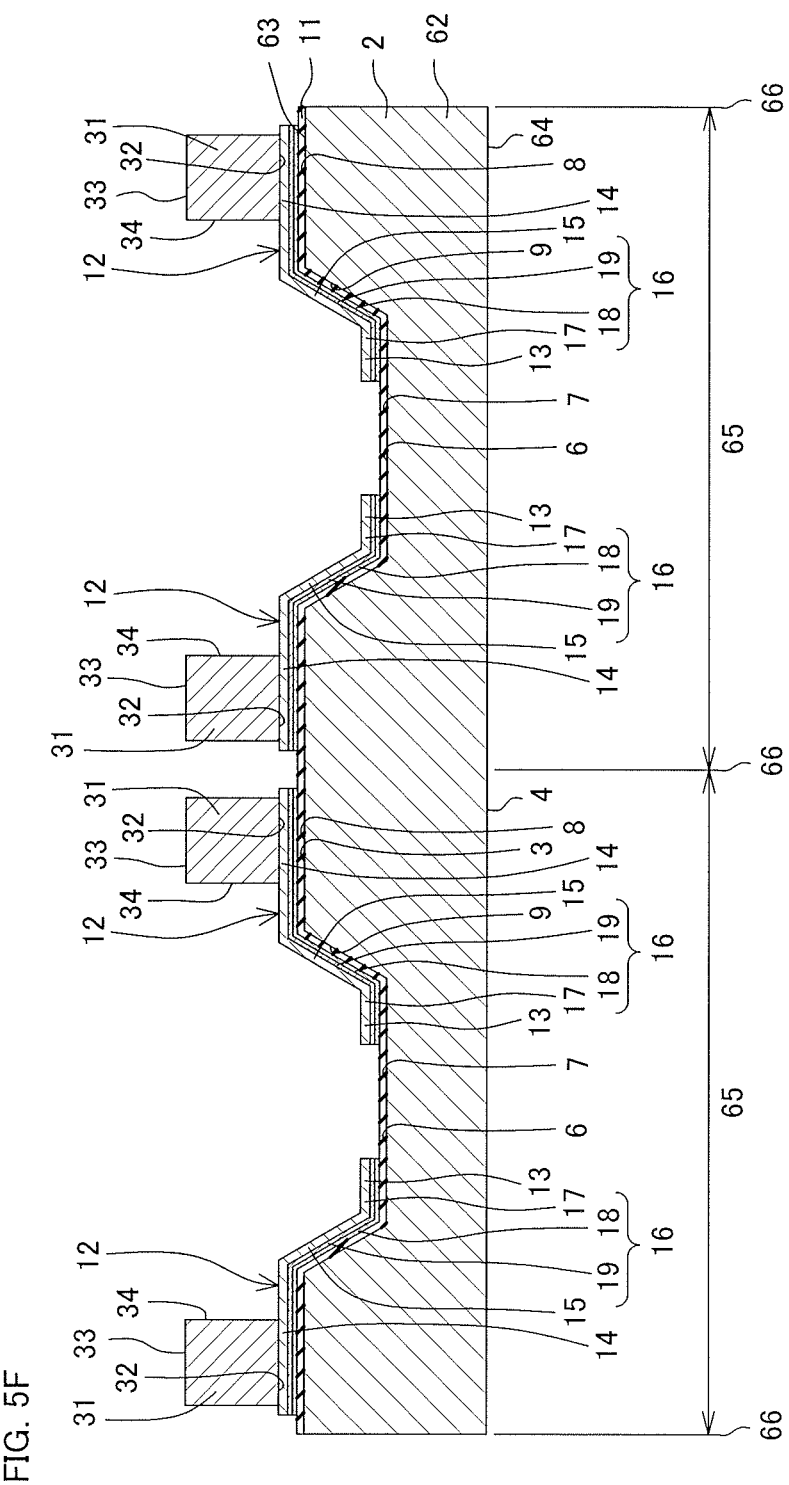

Then, with reference to FIG. 5F, the mask 67 is removed. Thereby, the plurality of electrode bodies 31 remain in a state that they are erected on the corresponding first pad regions 13.

Figure 5G:
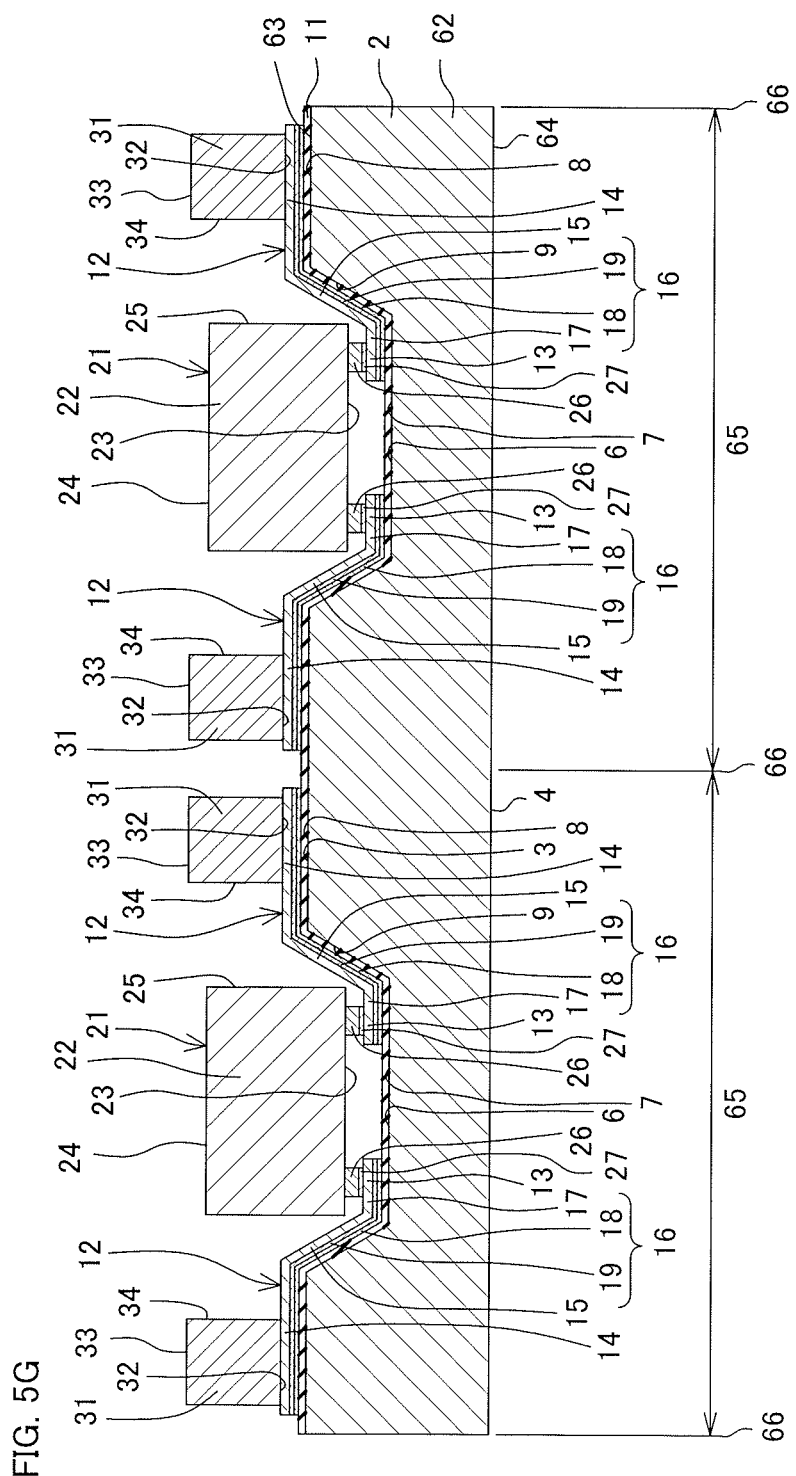

Then, with reference to FIG. 5G, the plurality of chips 21 are each disposed in a corresponding component region 65. The chips 21 are each disposed in each component region 65 in a state that the mounting surface 23 faces the base substrate 62. The terminal electrode 26 of the chip 21 is bonded to the first pad region 13 of the corresponding wiring layer 12 through the electroconductive bonding material 27.

Figure 5H:
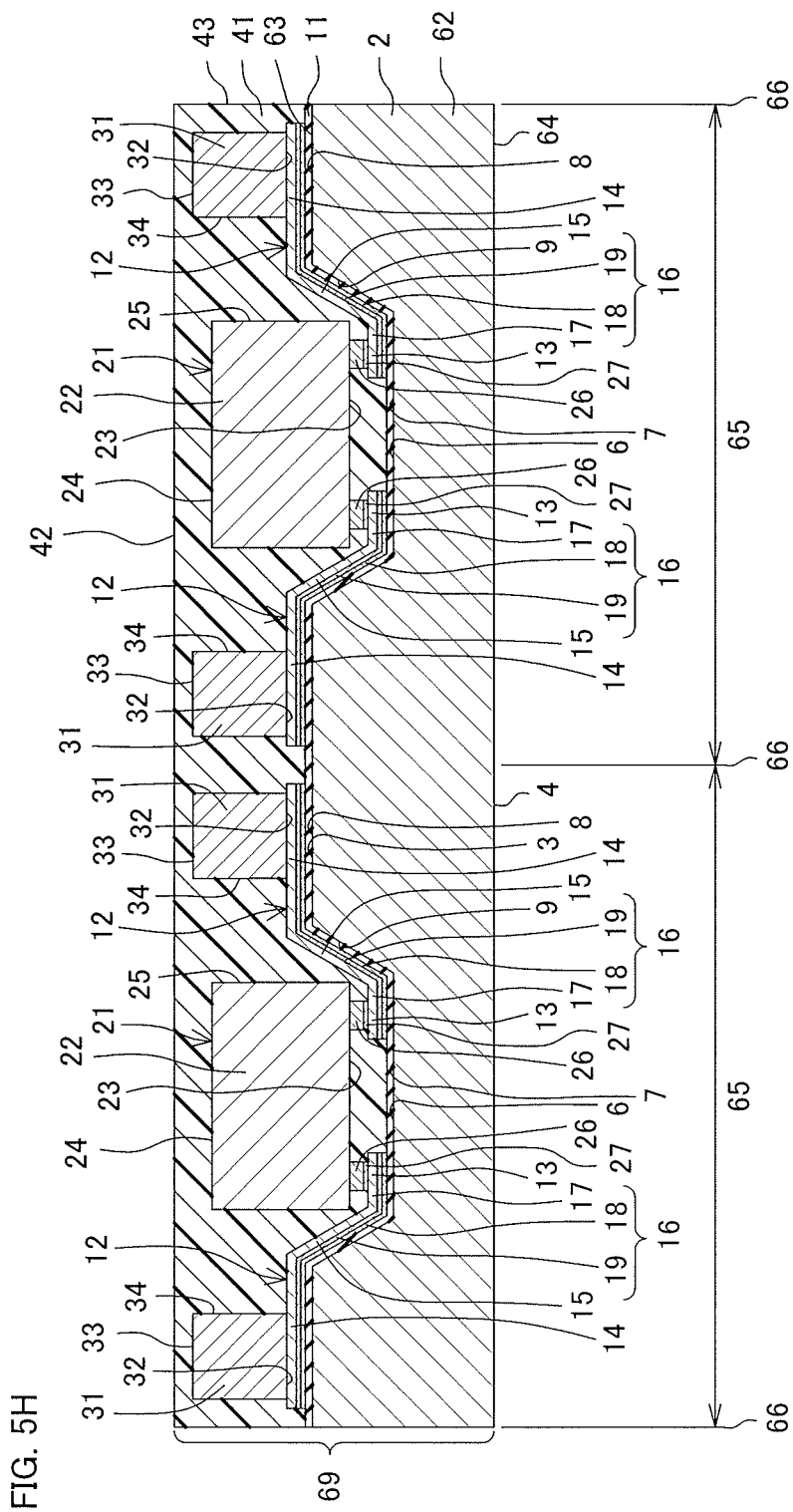

Then, with reference to FIG. 5H, the sealing insulation layer 41 is formed on the first major surface 63. The sealing insulation layer 41 covers collectively the entirety of the chip 21 and the entirety of the plurality of electrode bodies 31. Thereby, a sealing structure 69 is formed which includes the base substrate 62, the chip 21 and the sealing insulation layer 41.

Then, with reference to FIG. 5I, the sealing structure 69 is ground from the non-mounting surface 24-side of the chip 21. That is, the sealing major surface 42 of the sealing insulation layer 41 is ground. The sealing structure 69 may be ground by a CMP (Chemical Mechanical Polishing) method.

The step of grinding the sealing structure 69 includes a first grinding step in which the sealing major surface 42 is ground until the non-mounting surface 24 of the chip 21 and the second electrode surfaces 33 of the plurality of electrode bodies 31 are exposed. The step of grinding the sealing structure 69 also includes a second grinding step in which after the first grinding step, the sealing major surface 42 is ground continuously, thereby grinding and thinning the chip 21 and the plurality of electrode bodies 31. Thereby, the chip 21 is adjusted for thickness and the electronic component 1 is also adjusted for a final thickness.

Figure 5J:
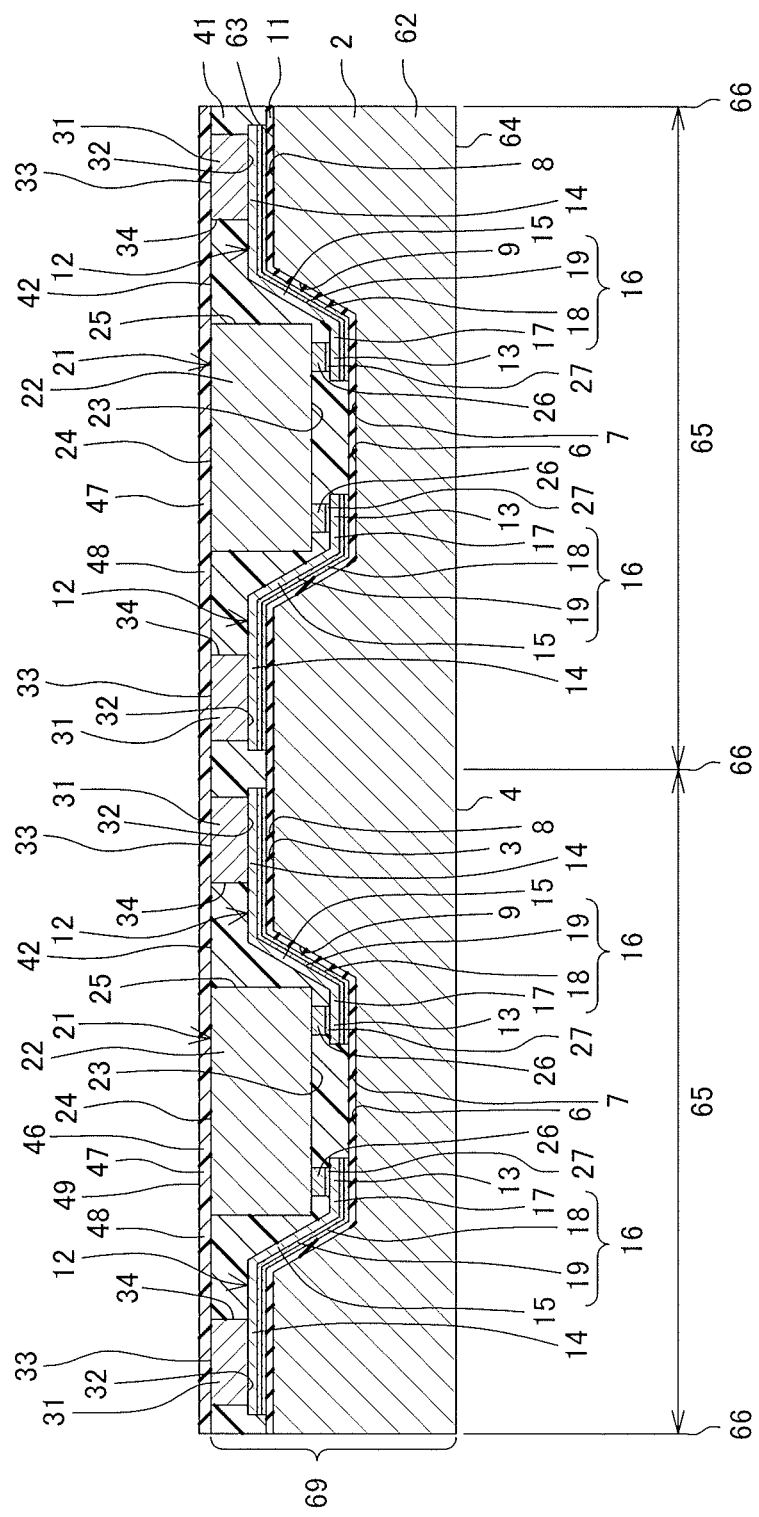

Then, with reference to FIG. 5J, an insulating material layer which serves as a base of the cover layer 46 is formed on the sealing major surface 42 of the sealing structure 69. In the preferred embodiment, a resin layer is formed as an example of the insulating material layer. The resin layer is formed so as to cover substantially the entirety of the sealing major surface 42.

The resin layer may be formed by using a photosensitive resin solvent. In this case, the photosensitive resin solvent is coated by a spin coating method on the sealing major surface 42 so as to cover substantially the entirety of the sealing major surface 42. Thereby, the resin layer is formed.

A resin layer which is made up of a photosensitive resin film may be formed. In this case, the photosensitive resin film is stuck on the sealing major surface 42 so as to cover substantially the entirety of the sealing major surface 42. Thereby, the resin layer is formed.

Figure 5K:
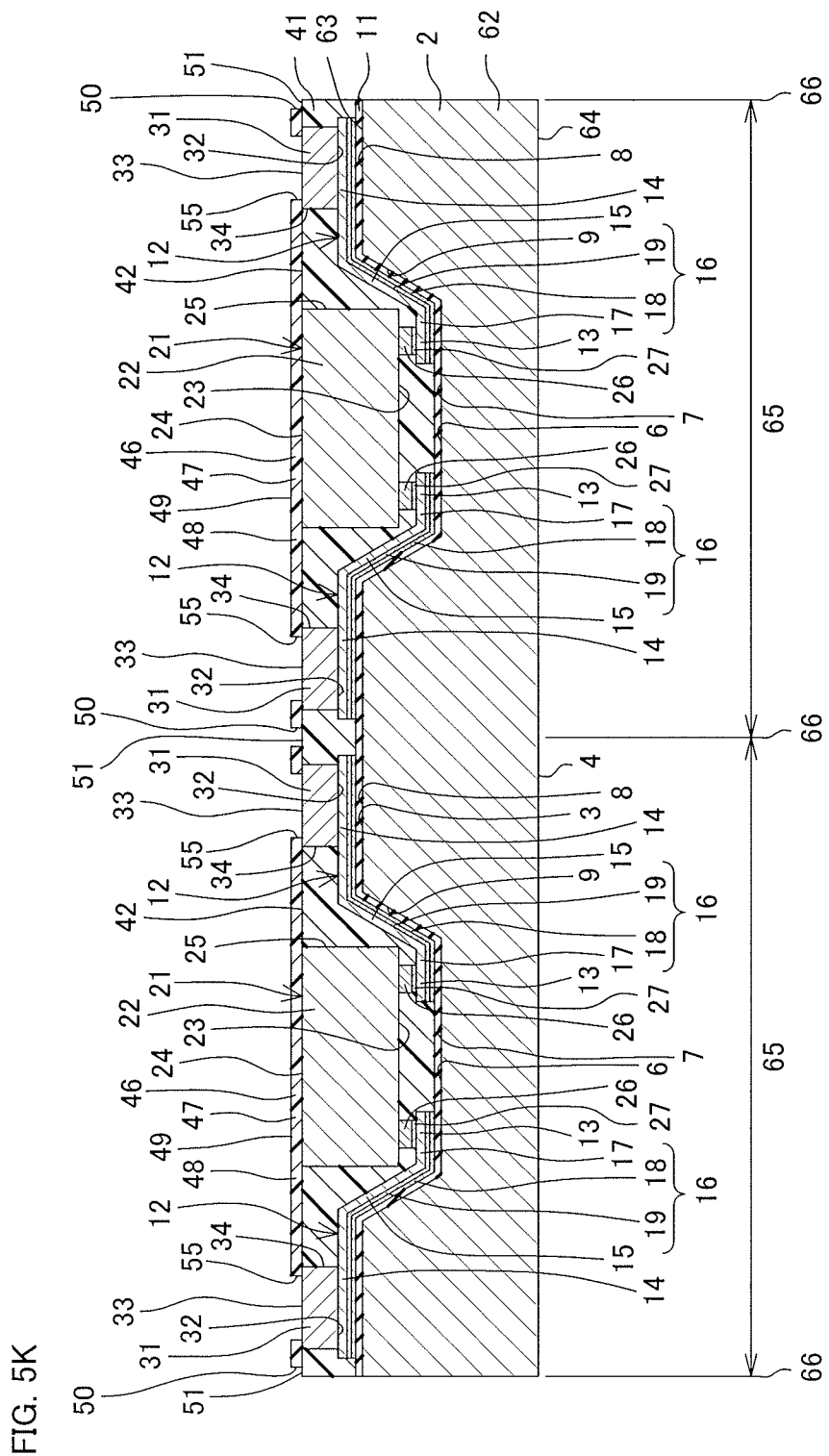

Then, with reference to FIG. 5K, after being photoexposed in a pattern corresponding to the cover layer 46, the resin layer is developed. Thereby, the cover layer 46 made up of the resin layer is formed. In this step, the cover layer 46 is formed which covers the non-mounting surface 24 of the chip 21 and also has the plurality of openings 55 which expose individually the second electrode surfaces 33 of the electrode bodies 31.

Further, in this step, the cover layer 46 having a peripheral edge at a region that is spaced inwardly from a peripheral edge of each component region 65, in plan view taken in a normal direction to the first major surface 63 is formed in each of the component regions 65. A region between mutually adjacent cover layers 46 in the sealing major surface 42 is given as a dicing region 70 (dicing street).

The cover layer 46 can be formed also by an insulation layer (not shown) including an inorganic insulating material. In this case, the insulation layer is formed so as to cover substantially the entirety of the sealing major surface 42. The insulation layer may be formed by a CVD method.

Then, a mask (not shown) having a predetermined pattern which corresponds to the cover layer 46 is formed on the insulation layer. The mask (not shown) covers a region at which the cover layer 46 is to be formed and has an opening which exposes a region at which a step portion 51 and a plurality of openings 55 are to be formed. Then, an unnecessary portion of the insulation layer is removed by etching through the mask. Thereby, the cover layer 46 having a predetermined pattern is formed.

Figure 5L:
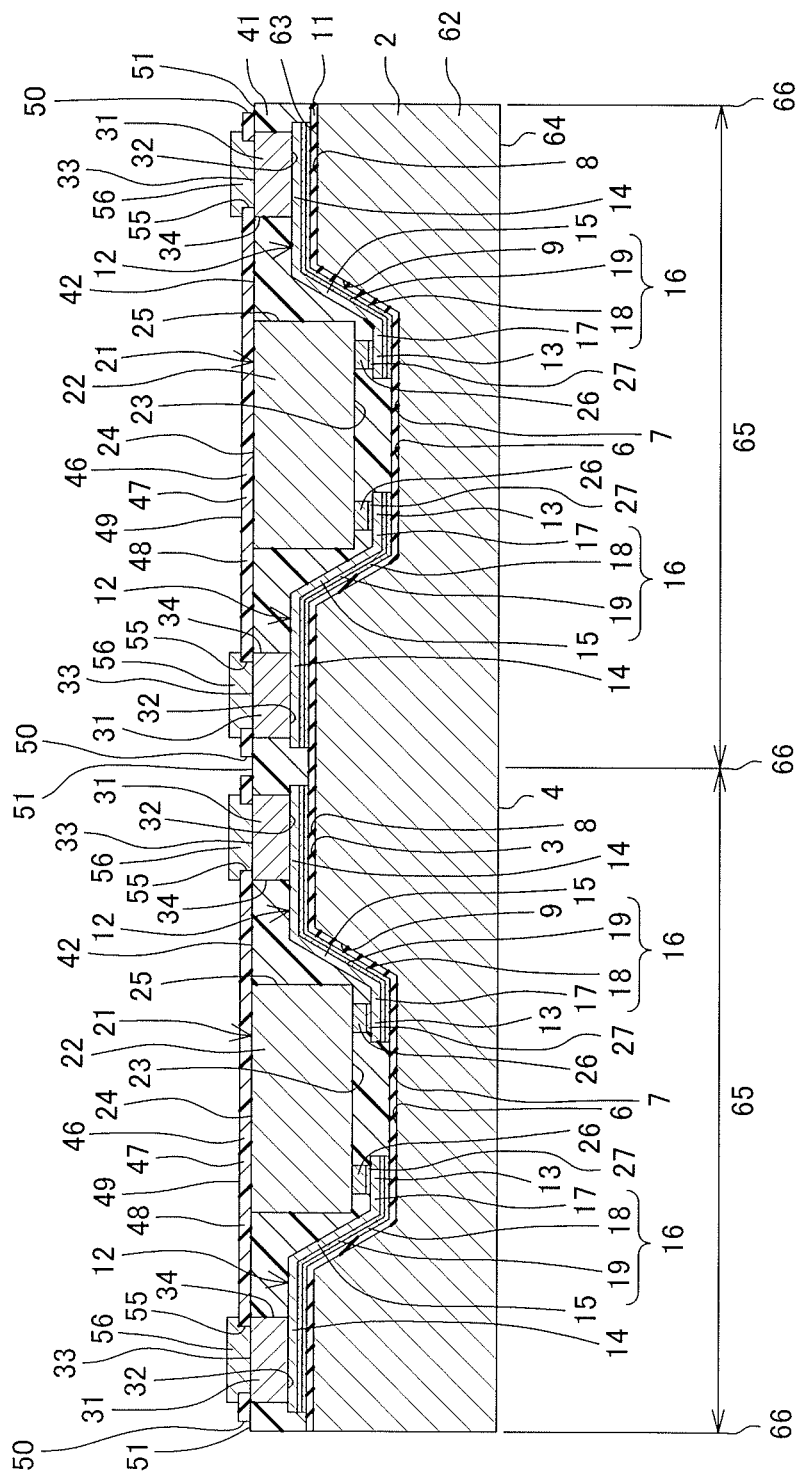

Then, with reference to FIG. 5L, the plurality of external electrode layers 56 are each formed inside a corresponding opening 55. The step of forming the external electrode layer 56 includes a step of forming an Ni layer 57, a Pd layer 58 and an Au layer 59 in this order from the second electrode surface 33-side of the electrode body 31. The Ni layer 57, the Pd layer 58 and the Au layer 59 may be individually formed by an electroless plating method. Thereby, the external electrode layer 56 is formed.

Figure 5M:
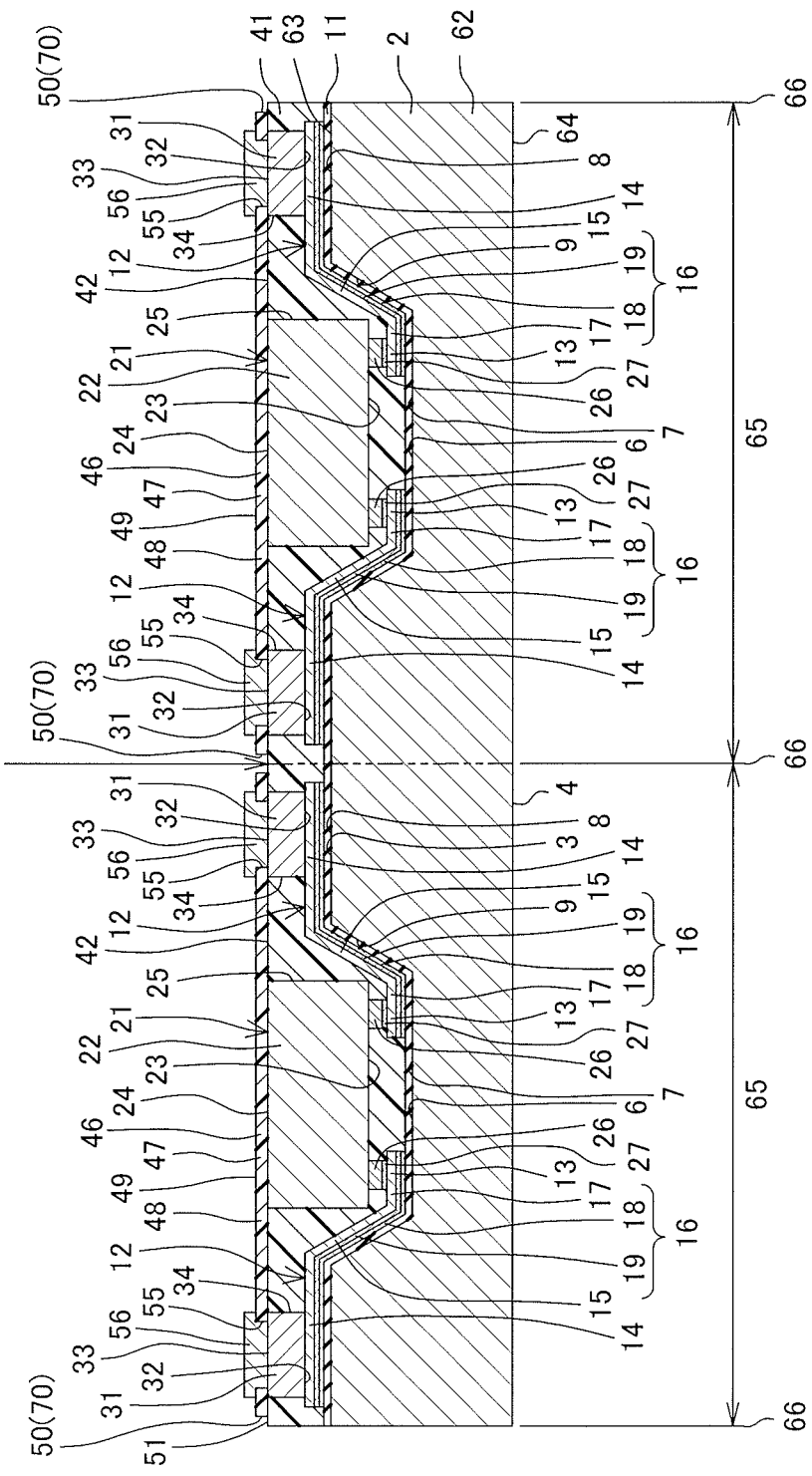

Then, with reference to FIG. 5M, the sealing structure 69 is cut along the dicing region 70 (boundary region 66). The sealing structure 69 is cut by using a dicing blade. Thereby, the plurality of electronic components 1 are cut out. The electronic component 1 is manufactured by the steps including the above.

As described so far, according to the method for manufacturing the electronic component 1, in a step of thinning the sealing structure 69 (refer to FIG. 5I), the sealing insulation layer 41 is ground until the non-mounting surface 24 of the chip 21 is exposed. Thereby, the sealing structure 69 can be reduced in thickness. Further, in the step of thinning the sealing structure 69, the chip 21 is ground in a state of being sealed in the sealing insulation layer 41 and, therefore, it is possible to prevent damage of the chip 21 resulting from the grinding.

Further, the non-mounting surface 24 of the chip 21 is covered with the cover layer 46 in a step of forming the cover layer 46 (refer to FIG. 5J). Thereby, the chip 21 can be protected appropriately. Thus, it is possible to appropriately downsize the electronic component 1.

Further, according to the method for manufacturing the electronic component 1, in the step of forming the cover layer 46 (refer to FIG. 5J), there is formed the cover layer 46 having a peripheral edge at a region that is spaced inwardly from a peripheral edge of the component region 65. A region between the plurality of cover layers 46 which are mutually adjacent is given as the dicing region 70.

Thereby, in the dicing step (refer to FIG. 5M), there is eliminated a necessity for cutting the cover layer 46, thus making it possible to prevent clogging or deterioration of the dicing blade caused by the cover layer 46. It is, thereby, possible to cut appropriately the sealing insulation layer 41 and also to prevent a deteriorated quality of the electronic component 1. The above-described structure is in particular effective in such a case that the cover layer 46 includes a resin layer (organic insulating material).

Figure 6:
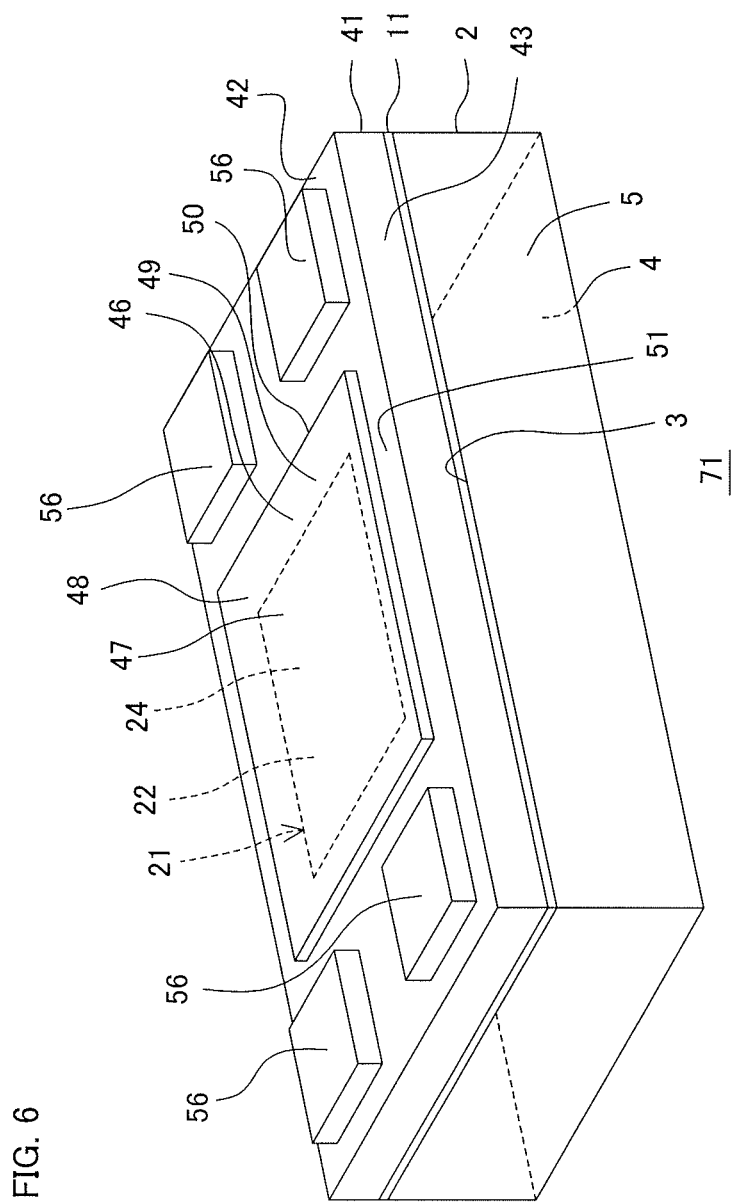
FIG. 6 is a perspective view which shows an electronic component according to a second preferred embodiment of the present invention.
Figure 7:
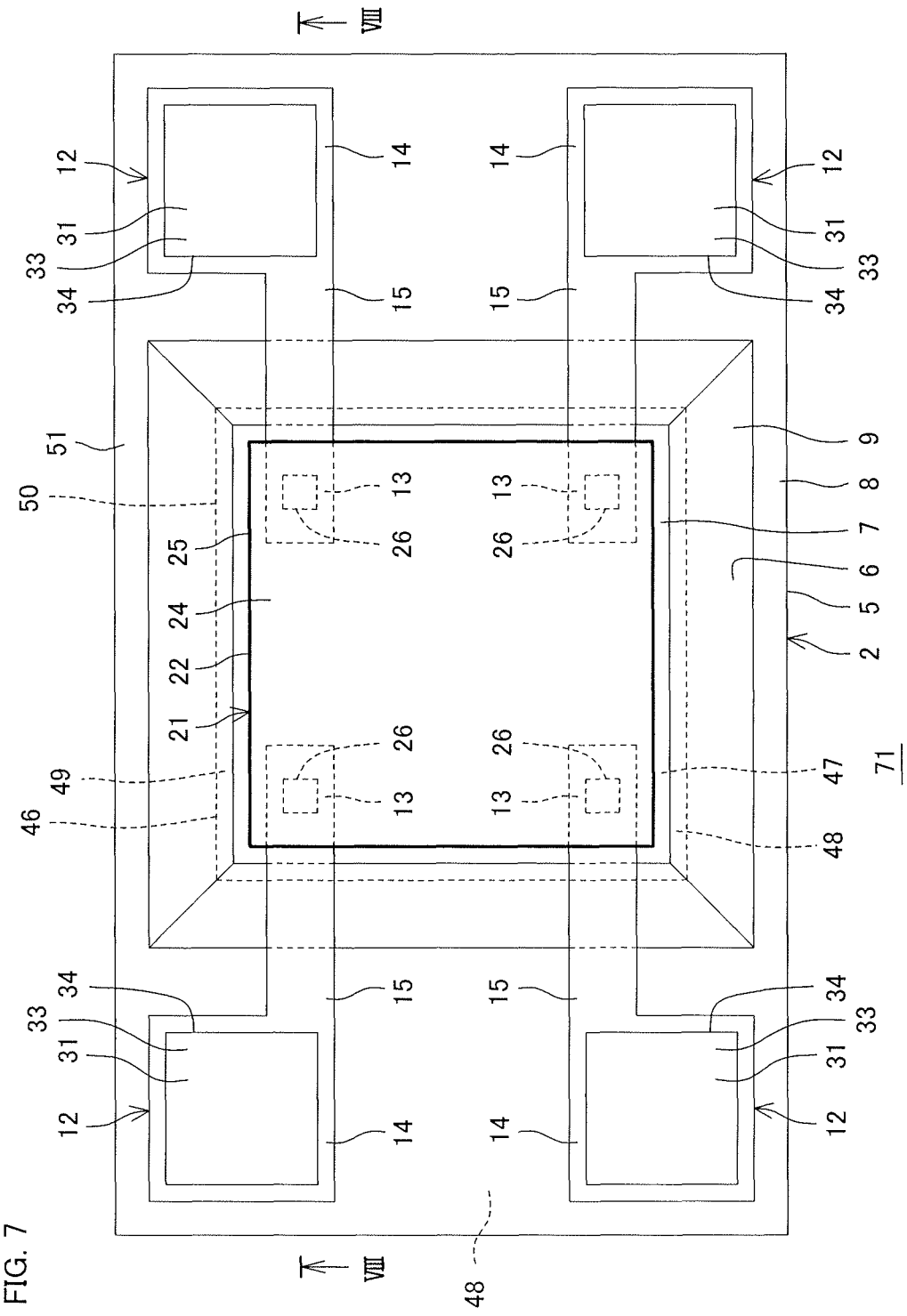
FIG. 7 is a plan view which shows an internal structure of the electronic component shown in FIG. 6.
Figure 8:
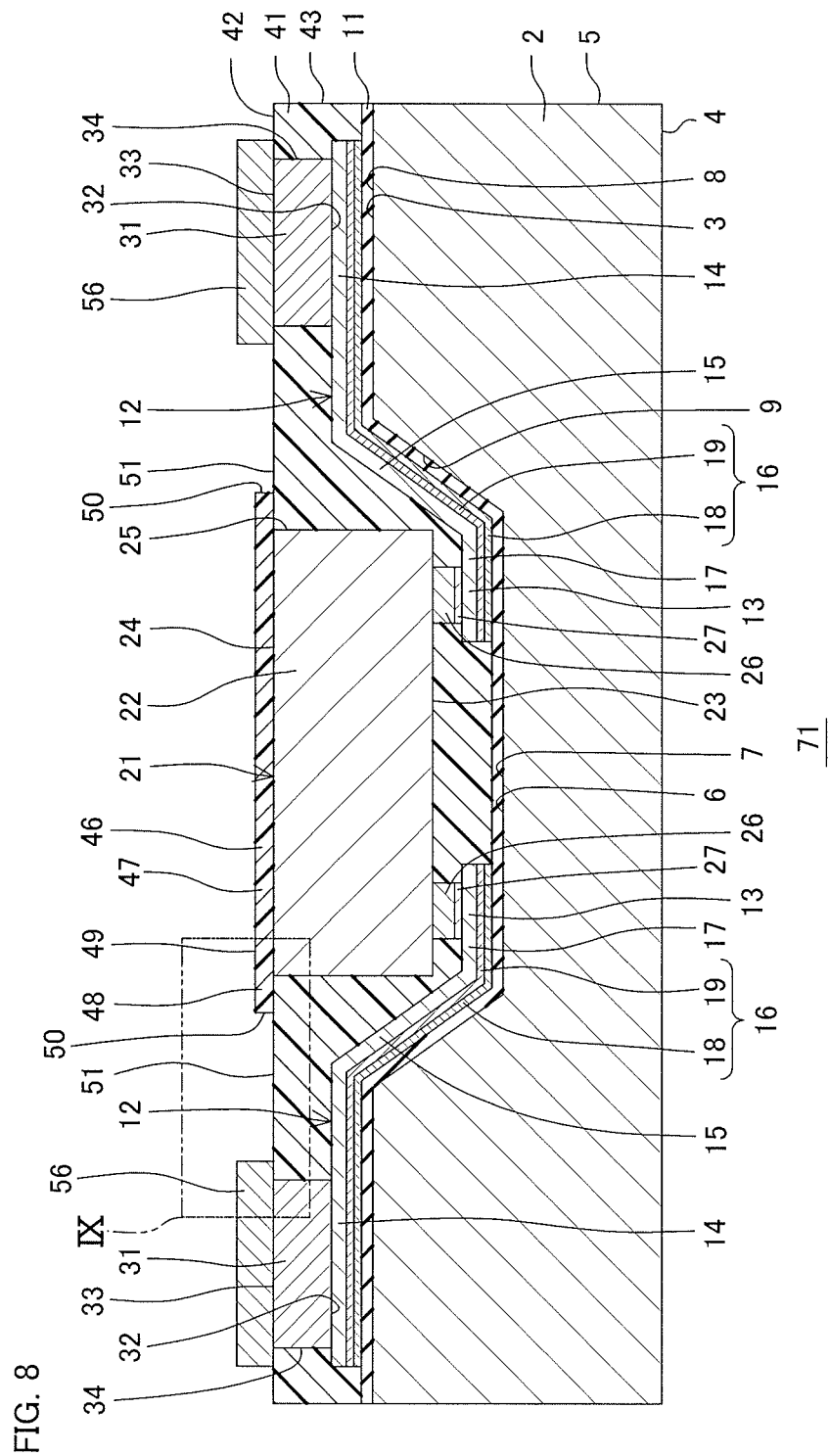
FIG. 8 is a cross-sectional view which is taken along line VIII-VIII shown in FIG. 7.
Figure 9:
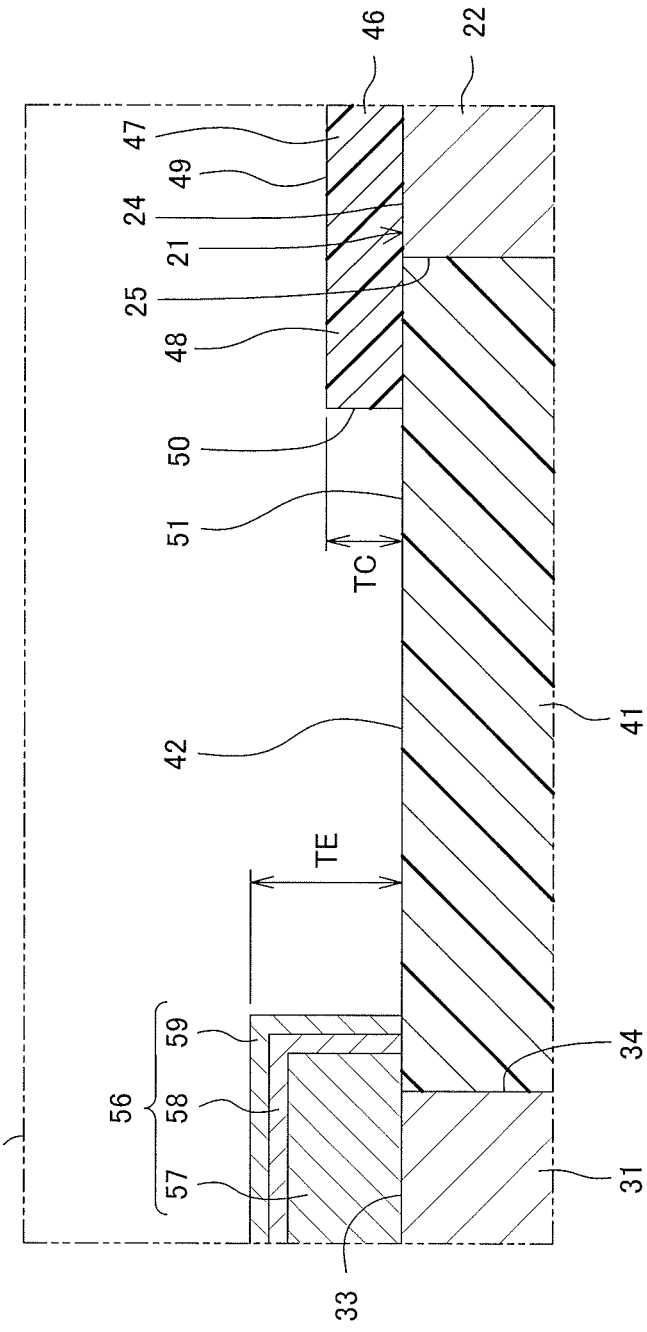
FIG. 9 is an enlarged view of a region IX shown in FIG. 8.

FIG. 6 is a perspective view which shows an electronic component 71 according to the second preferred embodiment of the present invention. FIG. 7 is a plan view which shows an internal structure of the electronic component 71 shown in FIG. 6. FIG. 8 is a cross-sectional view which is taken along line VIII-VIII shown in FIG. 7. FIG. 9 is an enlarged view of a region IX shown in FIG. 8. In the following, structures corresponding to the structures in the electronic component 1 will be given the same reference signs, and a description thereof is omitted.

A cover layer 46 according to the electronic component 71 is formed only at a center portion of a sealing insulation layer 41 in plan view. The cover layer 46 (covering portion 47) covers the entirety of a non-mounting surface 24 of a chip 21. The cover layer 46 (extension portion 48) is formed to be spaced toward the side of a recess portion 6 from a plurality of external electrode layers 56 in plan view.

The entirety of the cover layer 46 may be positioned inside a region surrounded by a peripheral edge of the recess portion 6 in plan view. A cover side surface 50 of the cover layer 46 is positioned at a region that is spaced inwardly from a sealing side surface 43 in plan view. A step portion 51 is formed at a region between the cover side surface 50 and the sealing side surface 43 on a sealing major surface 42.

The plurality of external electrode layers 56 are not in contact with the cover layer 46. The plurality of external electrode layers 56 cover a second electrode surface 33 of a corresponding electrode body 31 on the sealing major surface 42. The plurality of external electrode layers 56 may cover a portion of the sealing major surface 42.

With reference to FIG. 9, it is preferable that a thickness TC of the cover layer 46 is equal to or less than a thickness TE of the plurality of external electrode layers 56 (TC≤TE). It is more preferable that the thickness TC is less than the thickness TE (TC<TE).

According to the above-described structure, the cover layer 46 can be prevented from being brought into contact with a connection target when the electronic component 71 is connected to the connection target. Thereby, it is possible to connect appropriately the plurality of external electrode layers 56 to the connection target. It is also possible to prevent probe needles from making contact with the cover layer 46 when the electronic component 71 is subjected to an electrical test. Thereby, the probe needles can be appropriately come into contact with the plurality of external electrode layers 56. Thus, it is possible to smoothly perform the electrical test. As a matter of course, if no problem is found, a cover layer 46 that has a thickness TC exceeding the thickness TE of the external electrode layer 56 may be formed (TE<TC).

As described so far, the electronic component 71 is also able to provide substantially the same technical effects as those described with respect to the electronic component 1. The electronic component 71 can be manufactured only by changing the layout of a mask for forming the cover layer 46 in the previously described step of forming the cover layer 46 (refer to FIG. 5K).

Figure 10:
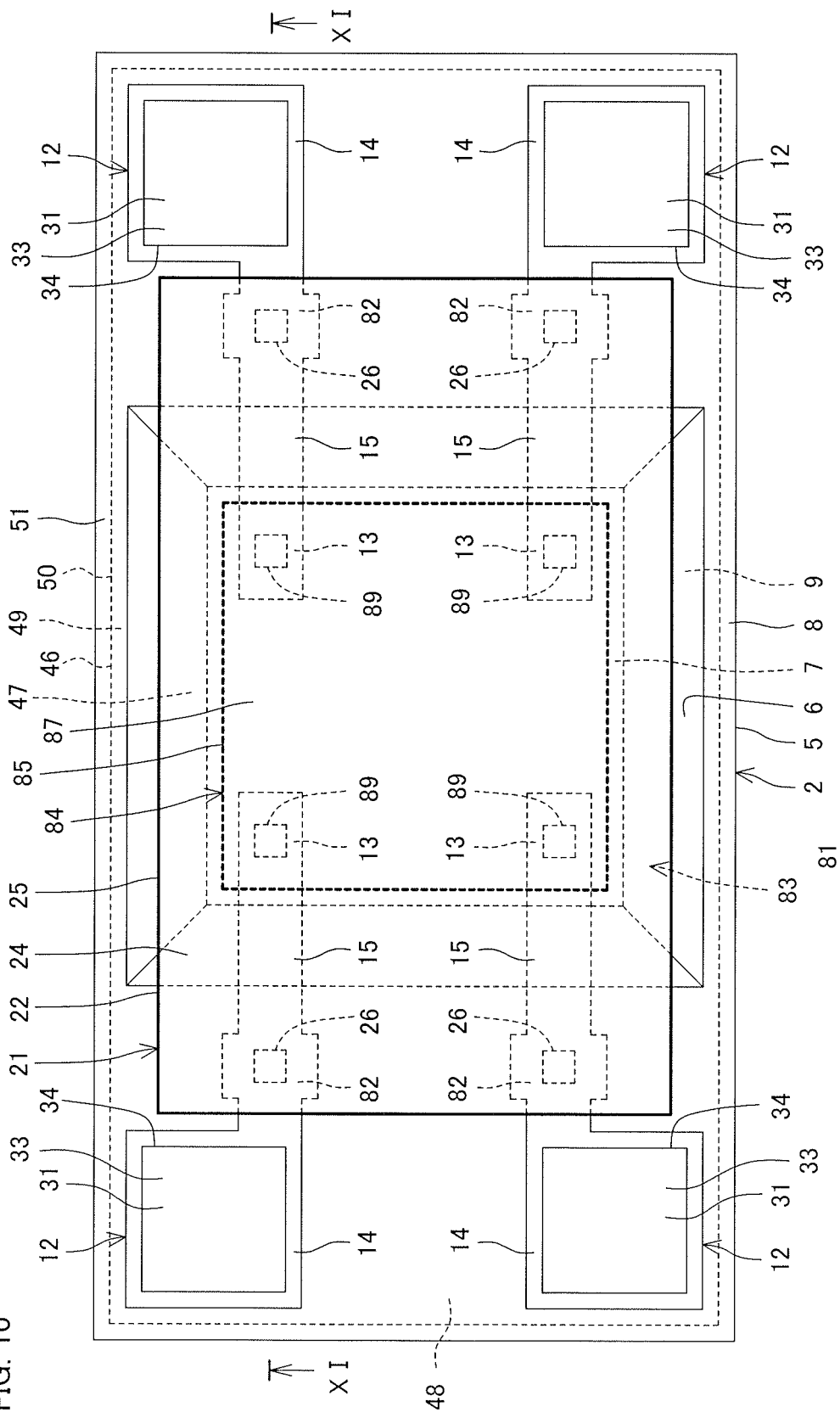
FIG. 10 is a plan view which shows an internal structure of an electronic component according to a third preferred embodiment of the present invention.
Figure 11:
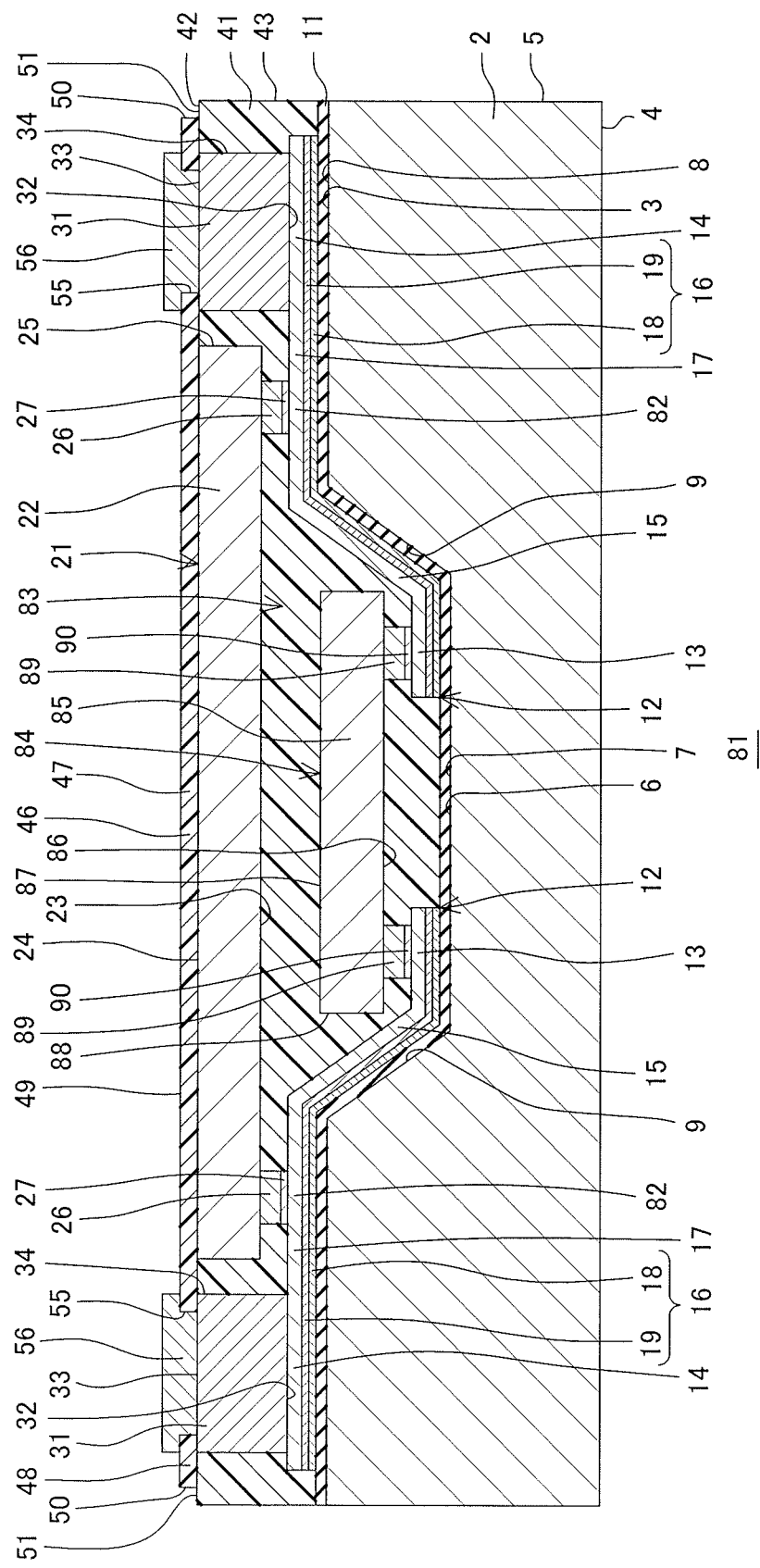
FIG. 11 is a cross-sectional view which is taken along line of XI-XI shown in FIG. 10.

FIG. 10 is a plan view which shows an internal structure of an electronic component 81 according to the third preferred embodiment of the present invention. FIG. 11 is a cross-sectional view which is taken along line XI-XI shown in FIG. 10. In the following, structures corresponding to the structures in the electronic component 1 will be given the same reference signs, and a description thereof is omitted.

In the preferred embodiment, a plurality of wiring layers 12 each include a third pad region 82 formed at a high region 8. The third pad region 82 is interposed at a portion positioned at the high region 8 in a wiring region 15. That is, the wiring region 15 includes a portion which connects a first pad region 13 and the third pad region 82. The wiring region 15 also includes a portion which connects a second pad region 14 and the third pad region 82.

A chip 21 is disposed at the high region 8 so as to cover a recess portion 6. A terminal electrode 26 of the chip 21 is bonded to the third pad region 82 of the corresponding wiring layer 12 through an electroconductive bonding material 27 at the high region 8. A recessed space 83 is formed at a region between a mounting surface 23 of the chip 21 and the recess portion 6.

The electronic component 81 includes a second chip 84 (lower chip) which is disposed inside the recess portion 6 (recessed space 83). The second chip 84 overlaps with the chip 21 in plan view. That is, the second chip 84 is disposed three-dimensionally with respect to the chip 21.

The second chip 84 includes a second chip main body 85 formed in a rectangular parallelepiped shape. The second chip main body 85 has a second mounting surface 86 on one side, a second non-mounting surface 87 on the other side and a second chip side surface 88 which connects the second mounting surface 86 and the second non-mounting surface 87. The non-mounting surface 24 is free of an electrode.

The second chip main body 85 may include at least any one of silicon, a nitride semiconductor material (for example, gallium nitride), an oxide semiconductor material (for example, gallium oxide), glass and ceramic. The second chip main body 85 includes a functional device. The functional device may be formed on the side of the second mounting surface 86. The functional device may include at least any one of a resistor, a capacitor, a coil, a diode and a transistor.

The second chip 84 may include a monofunctional device or a composite functional device. The composite functional device is constituted with a combination of the plurality of monofunctional devices. The second chip 84 may be a discrete device or an IC (Integrated Circuit) device.

The second chip 84 includes a plurality of second terminal electrodes 89 (four in the preferred embodiment) which are formed on the second mounting surface 86. The plurality of second terminal electrodes 89 are connected electrically to the functional device. The second chip 84 may include an insulation layer which covers the second mounting surface 86. On the insulation layer, there may be formed a wiring (wiring layer) which is electrically connected to the second terminal electrode 89 and the functional device. In this case, the plurality of second terminal electrode 89 may protrude outside from the insulation layer.

The second chip 84 is disposed over a low region 7 in a posture that the second mounting surface 86 faces the low region 7. The plurality of second terminal electrodes 89 are each bonded to the first pad region 13 of the corresponding wiring layer 12 through an electroconductive bonding material 90. Thereby, the second chip 84 is electrically connected to the chip 21 through the wiring layer 12. The electroconductive bonding material 90 may include solder or metallic paste.

The second mounting surface 86 and the second non-mounting surface 87 are positioned at a region between the low region 7 and the high region 8 of an interposer 2. The second non-mounting surface 87 may protrude above the high region 8 of the interposer 2. In this case, the second non-mounting surface 87 is positioned at a region between the high region 8 and the mounting surface 23 of the chip 21.

The second mounting surface 86 and the second non-mounting surface 87 have an area which is less than an area of the low region 7 in plan view. The entirety of the second mounting surface 86 faces the low region 7. That is, the second chip 84 is positioned inside a region surrounded by a peripheral edge of the low region 7. The second mounting surface 86 and the second non-mounting surface 87 may have an area that exceeds an area of the low region 7 in plan view. The second mounting surface 86 may face a portion of the low region 7 and a portion of the connection portion 9.

A sealing insulation layer 41 seals the second chip 84 inside the recess portion 6 (recessed space 83). The sealing insulation layer 41 seals the chip 21 so that the entirety of the non-mounting surface 24 of the chip 21 can be exposed outside the recess portion 6 (recessed space 83). The sealing insulation layer 41 also seals each of electrode bodies 31 so that the entirety of a second electrode surface 33 of each of the electrode bodies 31 can be exposed outside the recess portion 6 (recessed space 83).

As described so far, the electronic component 81 is also able to provide substantially the same technical effects as those described previously with respect to the electronic component 1. Further, in the electronic component 81, the chip 21 and the second chip 84 are disposed three-dimensionally on the first major surface 3 of the interposer 2. Thereby, where the electronic component 81 is mounted on a mounting substrate, it is possible to mount the chip 21 and the second chip 84 three-dimensionally with respect to the mounting substrate.

Therefore, as compared with a case where the chip 21 and the second chip 84 are individually mounted on the mounting substrate, it is possible to reduce an area of the mounting substrate which is exclusively occupied by the chip 21 and the second chip 84. Further, since the chip 21 and the second chip 84 can be mounted on the mounting substrate by a single step, it is possible to prevent a mounting step from being complicated.

The electronic component 81 can be manufactured by executing a step in which the chip 21 is disposed at the high region 8 after the second chip 84 is disposed at the low region 7 in the previously described step of disposing the chip 21 (refer to FIG. 5G).

The step of disposing the second chip 84 includes a step in which the second terminal electrode 89 of the second chip 84 is connected to the first pad region 13 of the corresponding wiring layer 12. The step of disposing the chip 21 includes a step in which a terminal electrode 26 of the chip 21 is connected to the third pad region 82 of the corresponding wiring layer 12. The cover layer 46 according to the previously described second preferred embodiment may be adopted in the electronic component 81.

In the preferred embodiment, a description has been given of a case where one second chip 84 is disposed inside the recess portion 6 (recessed space 83). However, the plurality of (two or more) second chips 84 may be disposed inside the recess portion 6 (recessed space 83). In this case, the plurality of second chips 84 may be electrically connected to each other through the wiring layer 12 or another wiring layer. The plurality of second chips 84 may also be electrically connected to the chip 21 through the wiring layer 12 or another wiring layer.

Figure 12:
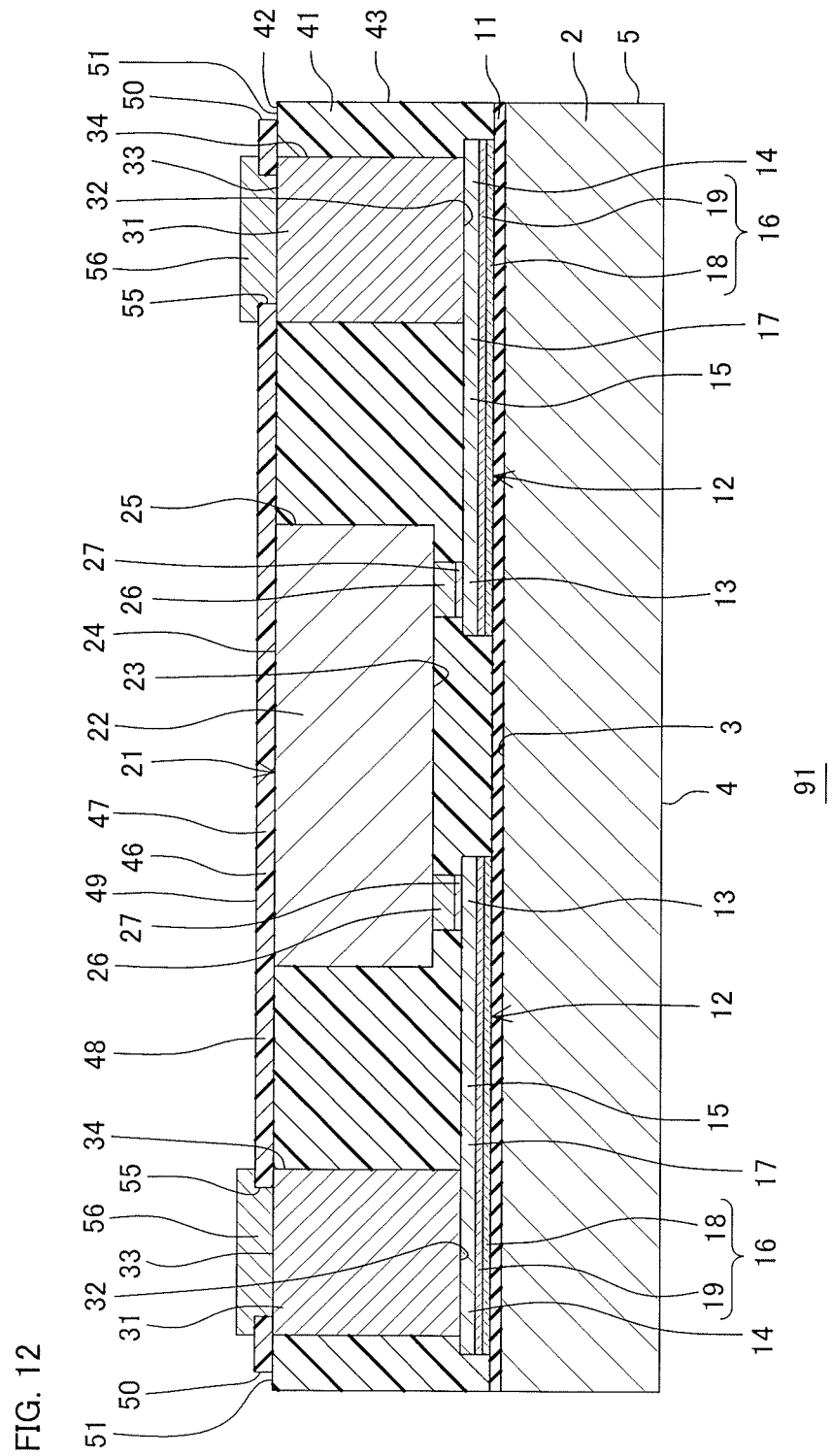
FIG. 12 is a cross-sectional view which shows an electronic component according to a fourth preferred embodiment of the present invention.

FIG. 12 is a cross-sectional view which shows an electronic component 91 according to the fourth preferred embodiment of the present invention. In the following, structures corresponding to the structures in the electronic component 1 will be given the same reference signs, and a description thereof is omitted.

In the electronic component 91, a first major surface 3 of an interposer 2 is made up of a flat surface. That is, no recess portion 6 is formed on the first major surface 3. Thereby, the first major surface 3 and a second major surface 4 are formed as flat surfaces which are substantially parallel to each other.

As described so far, the electronic component 91 is also able to provide substantially the same technical effects as those described previously with respect to the electronic component 1. The electronic component 91 can be manufactured by omitting the previously described step of forming the recess portion 6 (refer to FIG. 5B). Such a structure that the first major surface 3 is made up of a flat surface is also applicable to the previously described second preferred embodiment.

A description has been so far given of the first to the fourth preferred embodiments of the present invention. However, the present invention can be carried out in still other modes.

Figure 13:
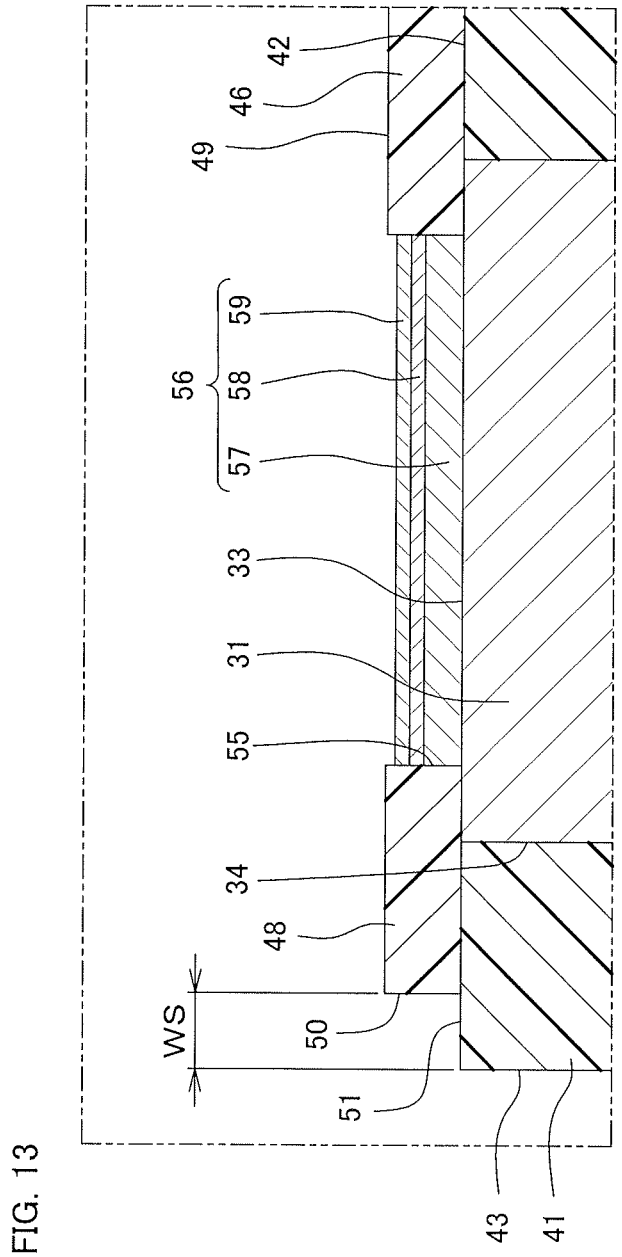
FIG. 13 is a cross-sectional view which shows a first modified example of an external electrode layer of the electronic component shown in FIG. 1.

The external electrode layer 56 according to the previously described first preferred embodiment may have a structure which is shown in FIG. 13. FIG. 13 is a cross-sectional view which shows the first modified example of the external electrode layer 56 of the electronic component 1 shown in FIG. 1. In the following, structures corresponding to the structures in the electronic component 1 will be given the same reference signs, and a description thereof is omitted.

With reference to FIG. 13, the entirety of the plurality of external electrode layers 56 may be formed individually so as to be housed inside an opening 55. More specifically, the plurality of external electrode layers 56 may have a front surface which is positioned on the side of a sealing insulation layer 41 in relation to a cover major surface 49 inside a corresponding opening 55. In this case, an Ni layer 57, a Pd layer 58 and an Au layer 59 may be in contact with an inner wall surface of the corresponding opening 55.

Even the above-described structure is able to provide substantially the same technical effects as those described previously with respect to the electronic component 1. The external electrode layer 56 according to the first modified example is also applicable to the third preferred embodiment and the fourth preferred embodiment.

Figure 14:
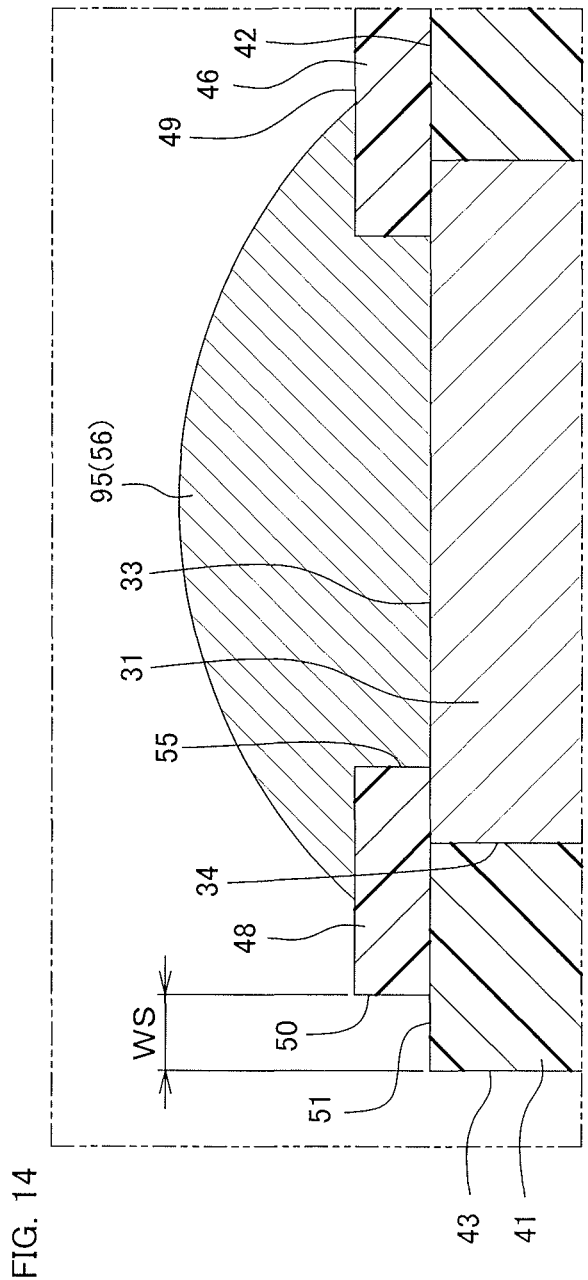
FIG. 14 is a cross-sectional view which shows a second modified example of an external electrode layer of the electronic component shown in FIG. 1.

The external electrode layer 56 according to previously described first preferred embodiment may have a structure shown in FIG. 14. FIG. 14 is a cross-sectional view which shows the second modified example of the external electrode layer 56 of the electronic component 1 shown in FIG. 1. In the following, structures corresponding to the structures in the electronic component 1 will be given the same reference signs, and a description thereof is omitted.

With reference to FIG. 14, the plurality of external electrode layers 56 may each include a solder layer 95 in place of the stacked-layer structure which includes the Ni layer 57, the Pd layer 58 and the Au layer 59. The solder layer 95 may be formed in a hemispherical shape. The solder layer 95 protrudes above the cover major surface 49. The solder layer 95 may overlap with the cover major surface 49.

Even the above-described structure is also able to provide substantially the same technical effects as those described previously in the electronic component 1. The external electrode layer 56 according to the second modified example is also applicable to the third preferred embodiment and the fourth preferred embodiment.

Figure 15:
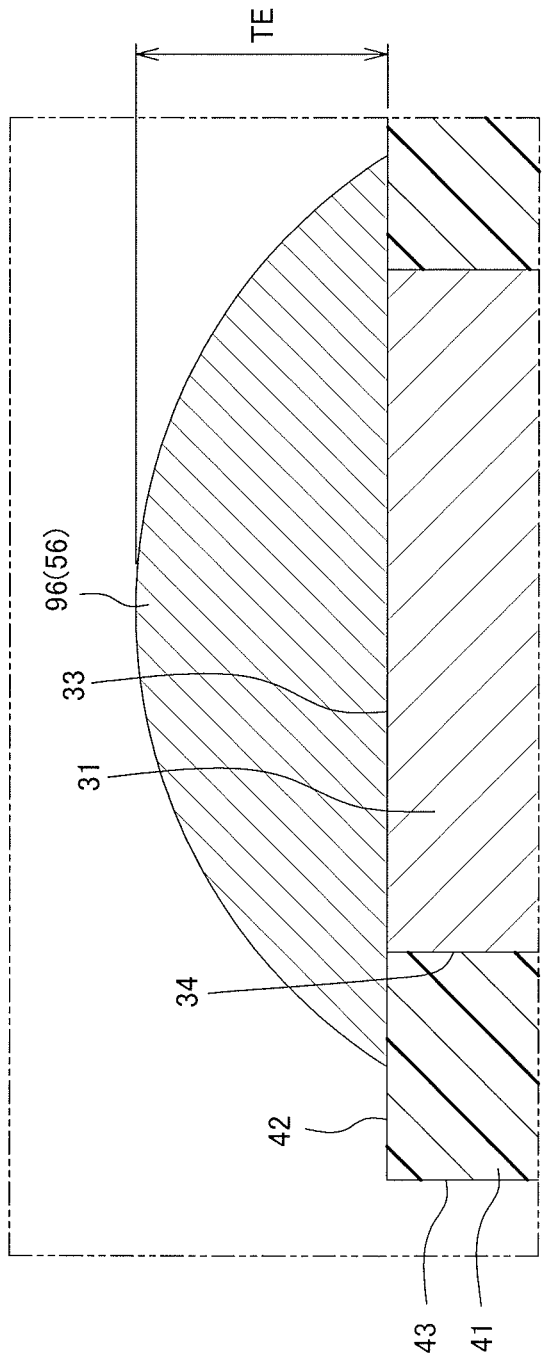
FIG. 15 is a cross-sectional view which shows a modified example of an external electrode layer of the electronic component shown in FIG. 6.

The external electrode layer 56 according to the previously described second preferred embodiment may have a structure which is shown in FIG. 15. FIG. 15 is a cross-sectional view which shows a modified example of the external electrode layer 56 of the electronic component 71 shown in FIG. 6. In the following, structures corresponding to the structures in the electronic component 71 will be given the same reference signs, and a description thereof is omitted.

With reference to FIG. 15, the plurality of external electrode layers 56 may each include a solder layer 96 in place of the stacked-layer structure which includes the Ni layer 57, the Pd layer 58 and the Au layer 59. The solder layer 96 may be formed in a hemispherical shape. The solder layer 96 may overlap with the sealing major surface 42. Even the above-described structure is also able to provide substantially the same technical effects as those described previously in the electronic component 71.

In the first to the fourth preferred embodiments which have been described previously, a mode may be adopted in which no external electrode layer 56 is formed. In this case, the second electrode surface 33 of the electrode body 31 may be formed as an external terminal which is connected externally.

In the previously described first to fourth preferred embodiments, the external electrode layer 56 may include a single layer structure or a stacked-layer structure which includes at least anyone of the Ni layer 57, the Pd layer 58 and the Au layer 59. For example, the external electrode layer 56 may have a two-layer structure which includes the Ni layer 57 and the Au layer 59 or may have a single layer structure which includes only the Ni layer 57.

The manufacturing method according to the previously described first to fourth preferred embodiments may also include a grinding step of grinding the second major surface 64 of the base substrate 62. In this case, the second major surface 4 of the interposer 2 is given as a ground surface. The step of grinding the base substrate 62 is executed to reduce the thickness of the interposer 2. Therefore, it is possible to further downsize the electronic components 1, 71, 81 and 91.

The step of grinding the base substrate 62 can be executed at any timing. The step of grinding the base substrate 62 may be executed prior to the step of forming the major surface insulation layer 11 or may be executed prior to the dicing step.

In the previously described first to fourth preferred embodiments, a description has been given of an example in which the interposer 2 is made of a semiconductor material (silicon). However, the interposer 2 may include an organic insulating material or an inorganic insulating material in place of the semiconductor material.

In this case, the interposer 2 may include at least any one of an epoxy resin, a polyimide resin, a polyamide resin, a polybenzoxazole resin and an acrylic resin as an example of the organic insulating material.

The interposer 2 may also include at least any one of silicon oxide, silicon nitride, silicon oxynitride, aluminum oxide, aluminum nitride and aluminum oxynitride as an example of the inorganic insulating material. Where the interposer 2 is made of an insulating material, the major surface insulation layer 11 may be removed.

In the previously described first to fourth preferred embodiments, a description has been given of an example in which the sealing insulation layer 41 is made up of a sealing resin layer including an organic insulating material. However, the sealing insulation layer 41 may include an inorganic insulating material in place of the organic insulating material. The sealing insulation layer 41 may include at least anyone of silicon oxide, silicon nitride, silicon oxynitride, aluminum oxide, aluminum nitride and aluminum oxynitride as an example of the inorganic insulating material.

In the previously described first to fourth preferred embodiments, the first major surface 3 of the interposer 2 may be roughened. The first major surface 3 may include an uneven structure as an example of a rough surface. The roughened first major surface 3 enables increasing an adhesion force of the major surface insulation layer 11, etc., to the first major surface 3.

The roughened first major surface 3 can be formed, for example, by roughening the first major surface 63 of the base substrate 62 prior to the step of forming the major surface insulation layer 11 (also refer to FIG. 5B). The roughening step may include etching, a sandblasting method, a laser irradiation method and any other known roughening methods.

In the previously described first to fourth preferred embodiments, where the electronic components 1, 71, 81 and 91 are manufactured by using a semiconductor material, the property of semiconductor material or a manufacturing method of a semiconductor device, the electronic components 1, 71, 81 and 91 may be each called as "a semiconductor device".

The case where they are manufactured by using a semiconductor material, the property of semiconductor material or a manufacturing method of a semiconductor device may include a case that the interposer 2 includes a semiconductor material such as silicon or a case that the chip 21 includes a semiconductor device such as a diode and a transistor, or a case that the above described cases are both established.

The present specification shall not restrict any mode of combination of the features shown in the first to the fourth preferred embodiments. The first to fourth preferred embodiments can be combined in any given form or in any given mode among these embodiments. That is, there may be adopted such a mode that the features shown in the first to the fourth preferred embodiments are combined in any given form or in any given mode.

Figure 16:
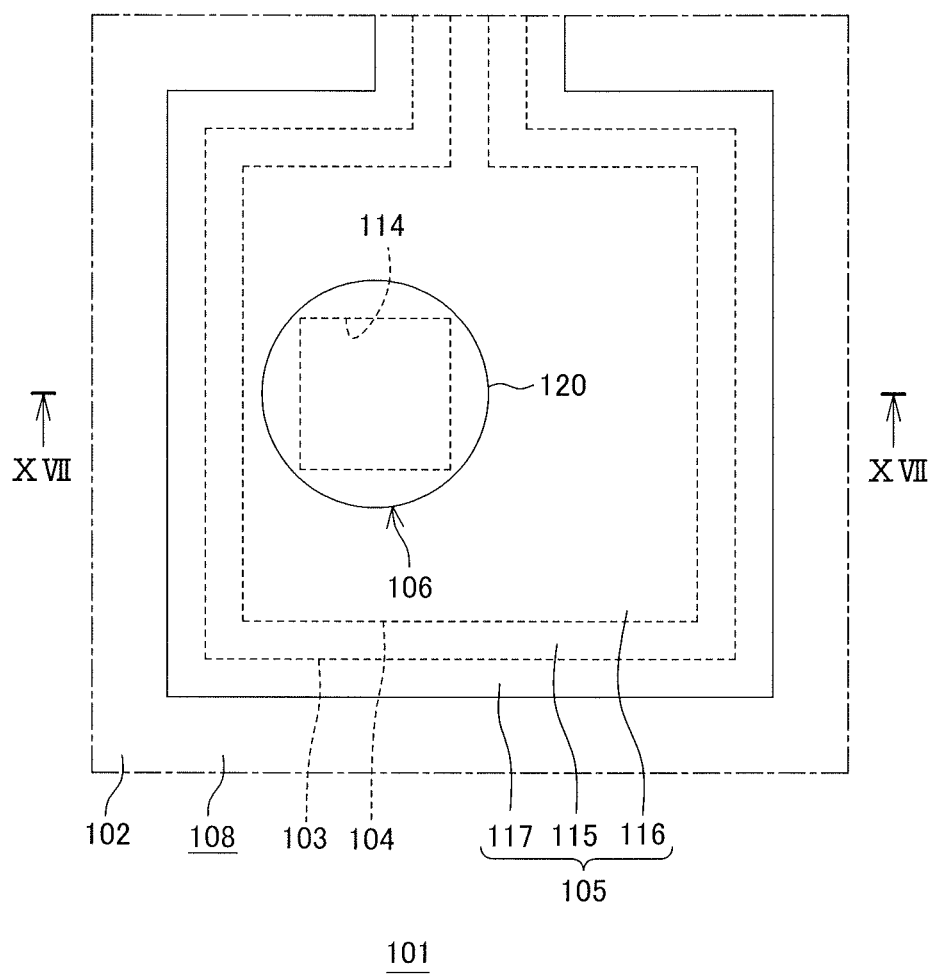
FIG. 16 is a plan view which shows a wiring structure body according to a fifth preferred embodiment of the present invention.
Figure 17:
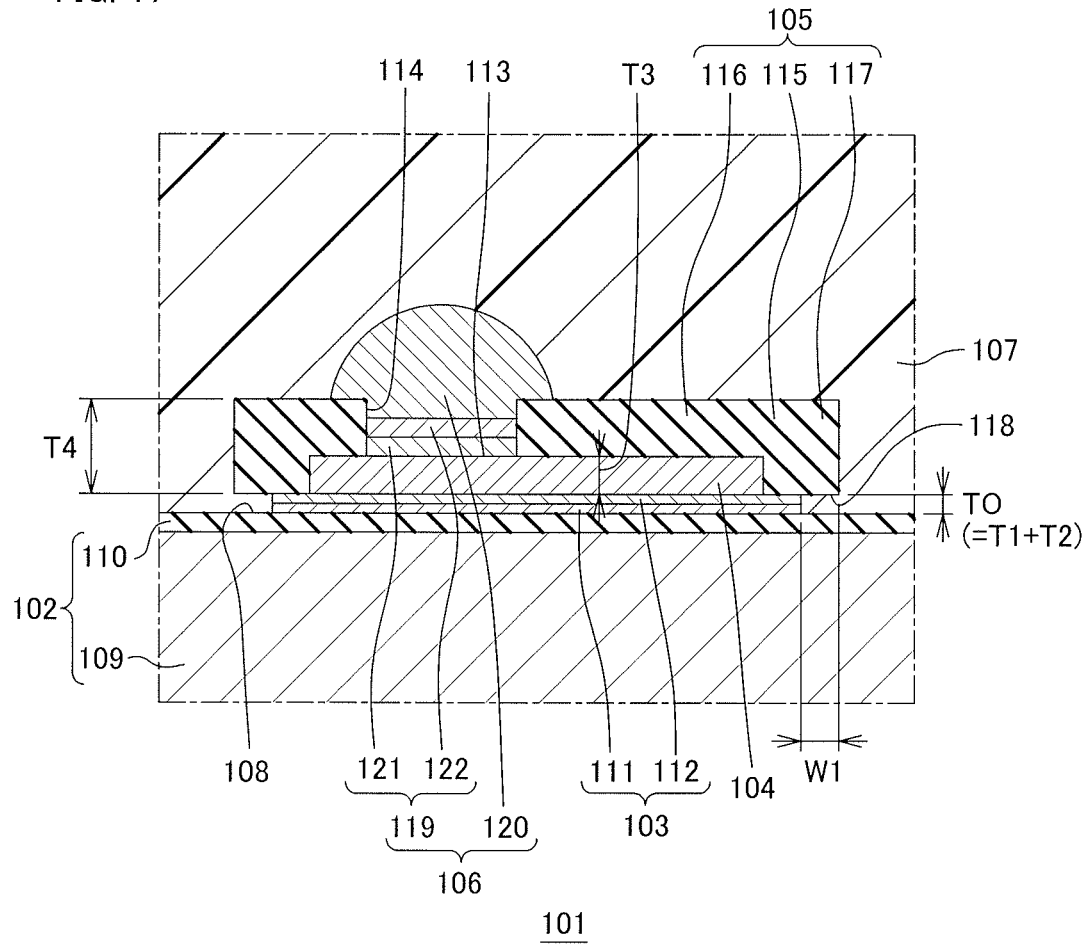
FIG. 17 is a cross-sectional view which is taken along line XVII-XVII shown in FIG. 16.

FIG. 16 is a plan view which shows a wiring structure body 101 according to the fifth preferred embodiment of the present invention. FIG. 17 is a cross-sectional view which is taken along line XVII-XVII shown in FIG. 16.

With reference to FIG. 16 and FIG. 17, the wiring structure body 101 is a wiring member interposed between a chip component and a connection target when the chip component is bonded to the connection target. In FIG. 16 and FIG. 17, for the convenience of description, there is shown such a state that the chip component is not connected to the wiring structure body 101.

The wiring structure body 101 forms a current path between the chip component and the connection target. The wiring structure body 101 transmits an electric signal from the connection target to the chip component and also transmits an electric signal from the chip component to the connection target. The chip component may include a functional device. The chip component may be a discrete device made up of a single functional device. The chip component may be an integrated circuit device provided with multiple functional devices.

The wiring structure body 101 includes a support substrate 102, a base electrode layer 103, a wiring layer 104, an insulation layer 105, a bump structure 106 and a sealing insulation layer 107. In FIG. 16, an internal structure of the wiring structure body 101 is shown by seeing through the sealing insulation layer 107.

The support substrate 102 has a major surface 108. More specifically, the support substrate 102 includes a base body 109 and a major surface insulation layer 110. The base body 109 may be a semiconductor substrate as well. The semiconductor substrate may include silicon. The major surface insulation layer 110 covers a major surface of the base body 109. The major surface 108 of the support substrate 102 is formed by the major surface insulation layer 110. The major surface insulation layer 110 may include silicon oxide or silicon nitride.

The base electrode layer 103 is formed in a film shape on the major surface 108 of the support substrate 102. The base electrode layer 103 may be drawn around in a line shape on the major surface 108. The base electrode layer 103 may be drawn around in any mode. In the preferred embodiment, the base electrode layer 103 includes a line-shaped region and a quadrangle-shaped region in a plan view taken from a normal direction of the major surface 108 of the support substrate 102 (hereinafter, simply referred to as "plan view"). FIG. 16 shows the quadrangle-shaped region of the base electrode layer 103.

The base electrode layer 103 has a stacked-layer structure including a first electrode layer 111 and a second electrode layer 112 which are stacked in this order from the side of the support substrate 102. A side surface of the second electrode layer 112 may be formed so as to be flush with a side surface of the first electrode layer 111. The side surface of the second electrode layer 112 may protrude outside in relation to the side surface of the first electrode layer 111. The side surface of the second electrode layer 112 may be formed inside in relation to the side surface of the first electrode layer 111.

The first electrode layer 111 includes at least one of titanium and chromium. In the preferred embodiment, the first electrode layer 111 includes titanium (more specifically, a titanium seed layer). The second electrode layer 112 includes at least one of copper and gold. In the preferred embodiment, the second electrode layer 112 includes copper (more specifically, a copper seed layer).

A total thickness T0 of the base electrode layer 103 may be 0.1 µm or more and 1.5 µm or less. The total thickness T0 may be 0.1 µm or more and 0.5 µm or less, from 0.5 µm or more and 1.0 µm or less, or from 1.0 µm or more and 1.5 µm or less.

A thickness T1 of the first electrode layer 111 may be 0.05 µm or more and 0.5 µm or less. The thickness T1 may be 0.05 µm or more and 0.1 µm or less, from 0.1 µm or more and 0.2 µm or less, from 0.2 µm or more and 0.3 µm or less, from 0.3 µm or more and 0.4 µm or less, or from 0.4 µm or more and 0.5 µm or less.

A thickness T2 of the second electrode layer 112 may be 0.05 µm or more and 1.0 µm or less. The thickness T2 may be 0.05 µm or more and 0.1 µm or less, from 0.1 µm or more and 0.5 µm or less, or from 0.5 µm or more and 1.0 µm or less.

The thickness T1 of the first electrode layer 111 and the thickness T2 of the second electrode layer 112 may be combined in the numerical value ranges described above. The thickness T2 of the second electrode layer 112 may be equal to or more than the thickness T1 of the first electrode layer 111 (T1≤T2).

The wiring layer 104 is formed in a film shape on the base electrode layer 103. The wiring layer 104 has a planar shape corresponding to the base electrode layer 103 in plan view. In the preferred embodiment, the wiring layer 104 is drawn around in a line shape along the base electrode layer 103. The wiring layer 104 includes a line-shaped region and a quadrangle-shaped region in plan view.

The wiring layer 104 is formed to be spaced inward of the base electrode layer 103 from a peripheral edge portion of the base electrode layer 103, and exposes the peripheral edge portion of the base electrode layer 103. A thickness T3 of the wiring layer 104 may be 0.05 µm or more and 20 µm or less. The thickness T3 may be 0.05 µm or more and 5 µm or less, from 5 µm or more and 10 µm or less, from 10 µm or more and 15 µm or less, or from 15 µm or more and 20 µm or less.

It is preferable that the thickness T3 of the wiring layer 104 is equal to or more than the total thickness T0 of the base electrode layer 103 (T0≤T3). It is more preferable that the thickness T3 exceeds the total thickness T0 (T0<T3).

The wiring layer 104 includes at least any one of copper, nickel and gold. The wiring layer 104 preferably includes the same electroconductive material as that of the second electrode layer 112. In the preferred embodiment, the wiring layer 104 includes copper (more specifically, copper plating layer).

The wiring layer 104 includes a pad portion 113 (connection portion) which is to be connected externally. The pad portion 113 is formed at any given region of the wiring layer 104. FIG. 16 shows an example in which the pad portion 113 is formed at the quadrangle-shaped region of the wiring layer 104.

The insulation layer 105 is formed on the base electrode layer 103. The insulation layer 105 has a planar shape corresponding to a planar shape of the base electrode layer 103. In the preferred embodiment, the insulation layer 105 is drawn around in a line shape along the base electrode layer 103. The insulation layer 105 includes a line-shaped region and a quadrangle-shaped region in plan view.

More specifically, the insulation layer 105 is formed in the peripheral edge portion of the base electrode layer 103. The insulation layer 105 covers the wiring layer 104 so as to expose the pad portion 113. Thereby, a pad opening 114 for exposing the pad portion 113 of the wiring layer 104 is formed in the insulation layer 105.

The insulation layer 105 protrudes to a region outside the base electrode layer 103 from above the peripheral edge portion of the base electrode layer 103. The insulation layer 105 protrudes in a transverse direction along a major surface of the base electrode layer 103. The insulation layer 105 faces the major surface 108 in a normal direction of the major surface 108 at the region outside the base electrode layer 103.

More specifically, the insulation layer 105 includes a base portion 115, a covering portion 116 and a protruding portion 117. The base portion 115 is formed on the peripheral edge portion of the base electrode layer 103. The covering portion 116 extends from the base portion 115 toward above the wiring layer 104 and demarcates the pad opening 114.

The protruding portion 117 extends from the base portion 115 in a direction opposite to the wiring layer 104. The protruding portion 117 extends in the transverse direction along the major surface of the base electrode layer 103 and protrudes to a region outside the base electrode layer 103. The protruding portion 117 faces the major surface 108 in a normal direction of the major surface 108 at the region outside the base electrode layer 103. The protruding portion 117 defines a space 118 together with the major surface 108 and a side surface of the base electrode layer 103. The space 118 is recessed toward the side of the base electrode layer 103

A ratio W1/T0, which is a ratio of a width W1 of the protruding portion 117 in relation to the total thickness T0 of the base electrode layer 103, may be 1 or more and 10 or less. It is preferable that the ratio W1/T0 is 1 or more and 2 or less, from 2 or more and 4 or less, from 4 or more and 6 or less, from 6 or more and 8 or less, or 8 or more and 10 or less. It is preferable that the ratio W1/T0 is 1 or more and 5 or less.

The width W1 may be 0.05 μm or more and 6.0 μm or less. The width W1 may be 0.05 μm or more and 1.0 μm or less, from 1.0 μm or more and 2.0 μm or less, from 2.0 μm or more and 3.0 μm or less, from 3.0 μm or more and 4.0 μm or less, from 4.0 μm or more and 5.0 μm or less, or from 5.0 μm or more and 6. μm or less.

A thickness T4 of the insulation layer 105 may be 0.5 μm or more and 40 μm or less. The thickness T4 may be 0.5 μm or more and 10 μm or less, from 10 μm or more and 20 μm or less, from 20 μm or more and 30 μm or less, or from 30 μm or more and 40 μm or less.

The insulation layer 105 may include an inorganic insulator or an organic insulator. The insulation layer 105 may include at least any one of silicon oxide, silicon nitride, silicon oxynitride, aluminum oxide, aluminum nitride and aluminum oxynitride as an example of the inorganic insulator.

The insulation layer 105 may include at least any one of a polyimide resin, a polyamide resin, an epoxy resin, a polybenzoxazole resin and a phenol resin as an example of the organic insulator. The organic insulator may include a photosensitive resin.

The bump structure 106 is formed on the pad portion 113 of the wiring layer 104. The bump structure 106 includes a UBM (Under Bump Metal) layer 119 and an electroconductive bonding material 120 which are stacked in this order from the side of the wiring layer 104. The UBM layer 119 is formed inside the pad opening 114 of the insulation layer 105.

The UBM layer 119 includes a first electrode layer 121 and a second electrode layer 122 which are stacked in this order from the side of the wiring layer 104. The first electrode layer 121 includes at least one of copper and nickel. The thickness of the first electrode layer 121 may be 0.5 μm or more and 6.0 μm or less. The second electrode layer 122 includes at least one of copper and nickel. The thickness of the second electrode layer 122 may be 0.5 μm or more and 6.0 μm or less.

The electroconductive bonding material 120 may include a portion which is positioned inside the pad opening 114 and a portion which is positioned outside the pad opening 114. The electroconductive bonding material 120 may cover a major surface of the insulation layer 105 outside the pad opening 114.

The electroconductive bonding material 120 includes solder or metallic paste. In the preferred embodiment, the electroconductive bonding material 120 includes solder. The solder may include tin (Sn). The solder may include at least anyone of SnAg alloy, SnSb alloy, SnAgCu alloy, SnZnBi alloy, SnCu alloy, SnCuNi alloy and SnSbNi alloy. The metallic paste may include at least any one of aluminum, copper, silver and gold.

The sealing insulation layer 107 seals the base electrode layer 103, the wiring layer 104, the insulation layer 105 and the bump structure 106 on the major surface 108. The sealing insulation layer 107 enters into the space 118. Where a chip component is connected to the wiring structure body 101 through the electroconductive bonding material 120, the sealing insulation layer 107 also seals the chip component.

The sealing insulation layer 107 may be a photosensitive resin or a thermosetting resin. The sealing insulation layer 107 may include at least anyone of a polyimide resin, a polyamide resin, an epoxy resin, a polybenzoxazole resin and a phenol resin.

FIG. 18A to FIG. 18I are cross-sectional views showing various process steps in an example of a method for manufacturing the wiring structure body 101 shown in FIG. 16.

Figure 18A:
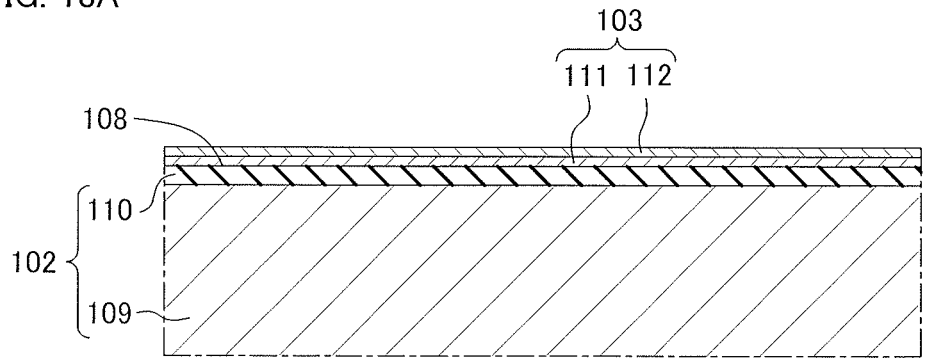
FIG. 18A to FIG. 18I are cross-sectional views showing various process steps in an example of a method for manufacturing the wiring structure body shown in FIG. 16.

With reference to FIG. 18A, the support substrate 102 is prepared. The support substrate 102 is formed by forming the major surface insulation layer 110 on a major surface of a semiconductor substrate (silicon substrate). The major surface insulation layer 110 may be formed by an oxidation treatment method (for example, a thermal oxidation treatment method) or a CVD (Chemical Vapor Deposition) method.

Then, the base electrode layer 103 is formed on the major surface 108 of the support substrate 102. The step of forming the base electrode layer 103 includes a step of forming the first electrode layer 111 and the second electrode layer 112 in this order from the side of the major surface 108. The first electrode layer 111 and the second electrode layer 112 may be each formed by a sputtering method.

Figure 18B:
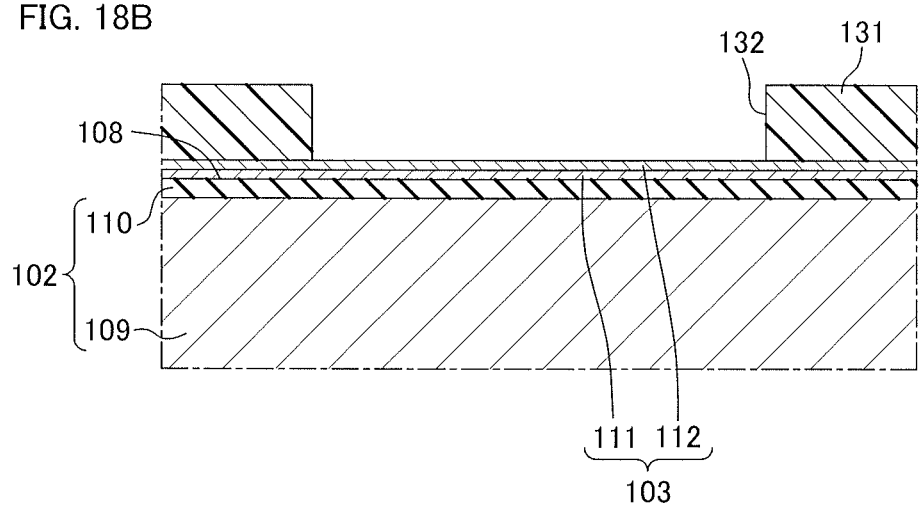

Then, with reference to FIG. 18B, a mask 131 having a predetermined pattern is formed on the base electrode layer 103. The mask 131 has an opening 132 for exposing a region at which the wiring layer 104 is to be formed in the base electrode layer 103. The mask 131 may be a photosensitive resin. The opening 132 of the mask 131 is formed by a development step after a photographic exposure step through a photo-mask.

Figure 18C:
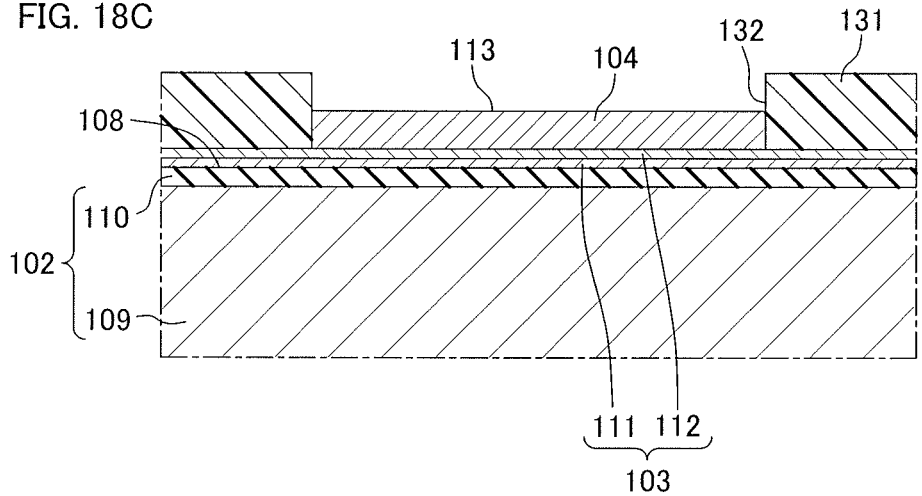

Then, with reference to FIG. 18C, the wiring layer 104 is formed on the base electrode layer 103. The wiring layer 104 is formed on a portion which is exposed from the opening 132 of the mask 131 in the base electrode layer 103. The wiring layer 104 may be formed by an electrolytic copper plating method. After formation of the wiring layer 104, the mask 131 is removed.

Figure 18D:
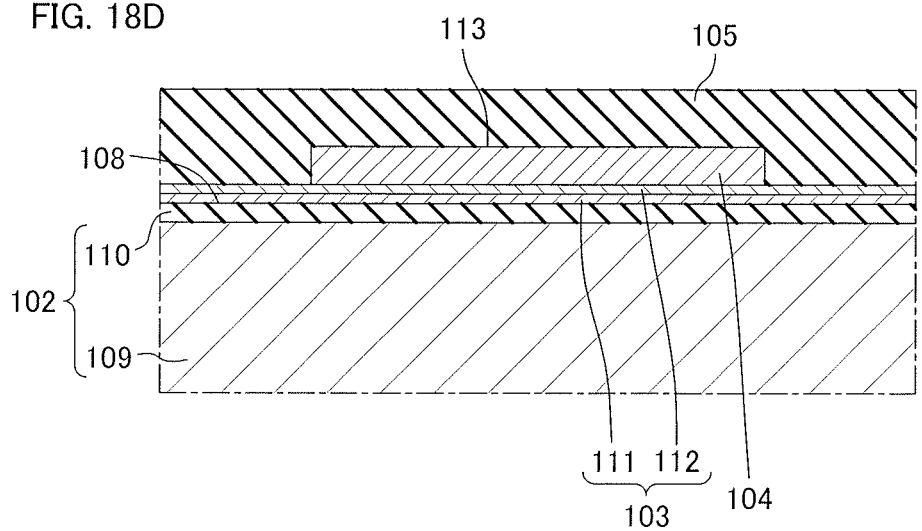

Then, with reference to FIG. 18D, the insulation layer 105 is formed on the base electrode layer 103. The insulation layer 105 covers the wiring layer 104 entirely. Where the insulation layer 105 includes an inorganic insulator, the insulation layer 105 may be formed by a CVD method. Where the insulation layer 105 includes an organic insulator, the insulation layer 105 may be formed by coating a photosensitive resin on the major surface 108.

Figure 18E:
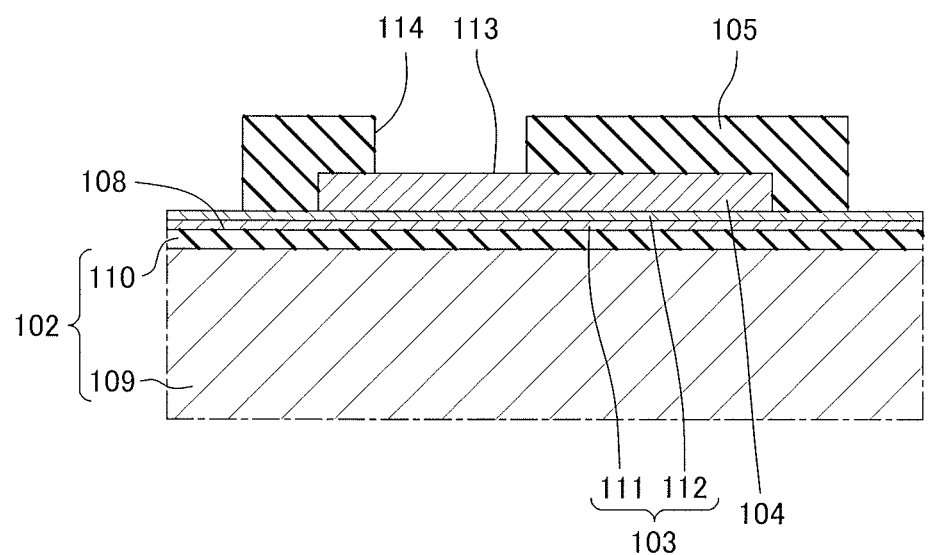

Then, with reference to FIG. 18E, an unnecessary portion of the insulation layer 105 is removed. Where the insulation layer 105 includes an inorganic insulator, the unnecessary portion of the insulation layer 105 may be removed by etching through a mask (not shown). Where the insulation layer 105 includes an organic insulator, the unnecessary portion of the insulation layer 105 may be removed by the photographic exposure step and the development step.

Thereby, the insulation layer 105 with a predetermined pattern having a pad opening 114 is formed.

Figure 18F:
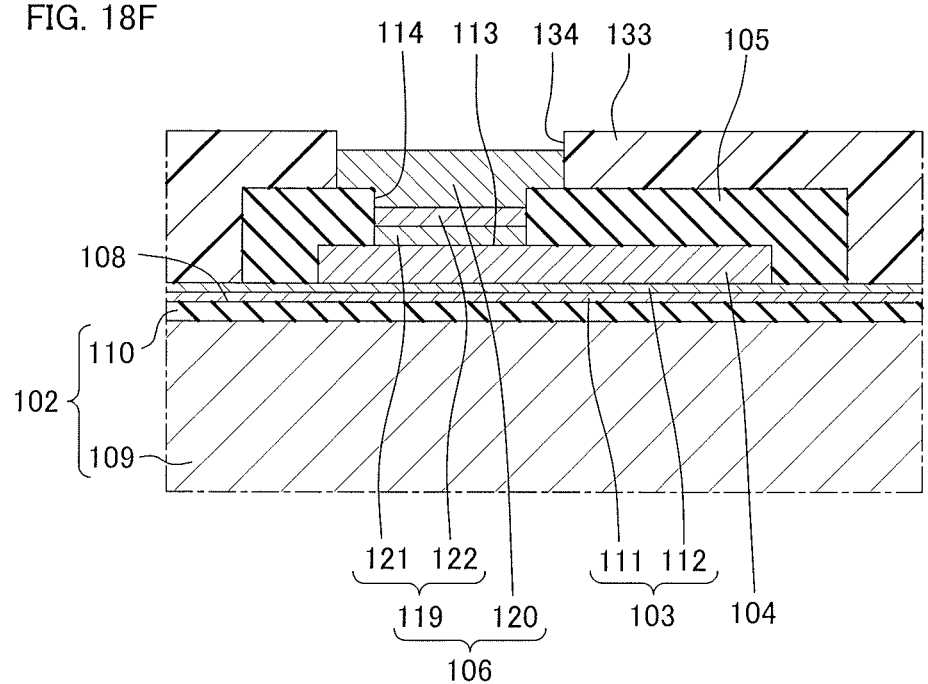

Then, with reference to FIG. 18F, a mask 133 having a predetermined pattern is formed on the base electrode layer 103 so as to cover the insulation layer 105. The mask 133 has an opening 134 for exposing the pad opening 114.

Then, the bump structure 106 is formed on the wiring layer 104. In this step, the UBM layer 119 is first formed on a portion which is exposed from the pad opening 114 in the wiring layer 104. The step of forming the UBM layer 119 includes a step of forming the first electrode layer 121 and the second electrode layer 122 in this order from the side of the wiring layer 104.

The first electrode layer 121 may be formed by an electrolytic copper plating method. The second electrode layer 122 may be formed by an electrolytic nickel plating method. Then, the electroconductive bonding material 120 is formed on the UBM layer 119. The electroconductive bonding material 120 may be formed by an electrolytic solder plating method. Thereafter, the mask 133 is removed.

Figure 18G:
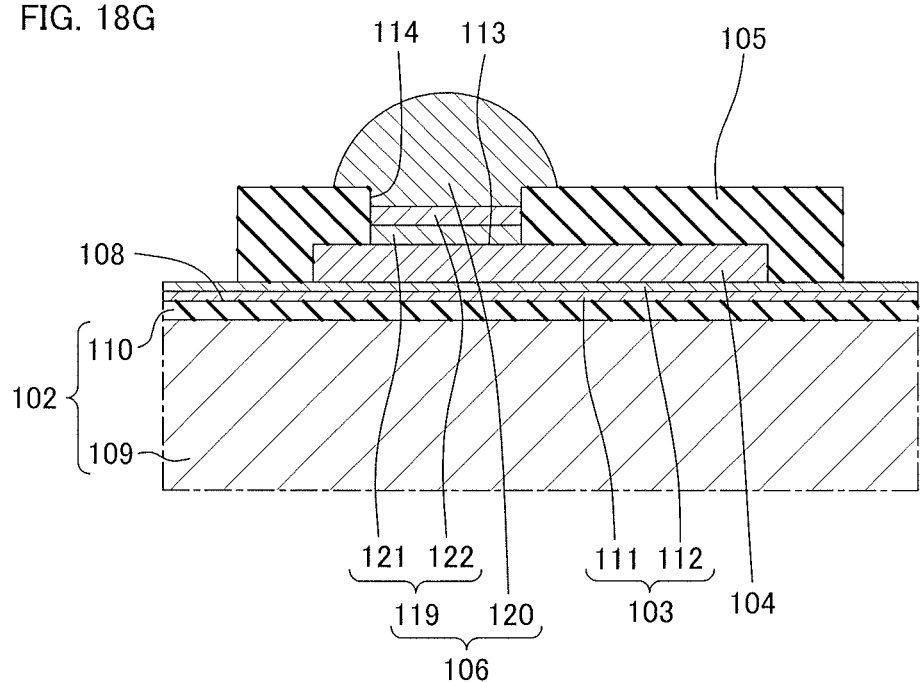

Then, with reference to FIG. 18G, the electroconductive bonding material 120 is heated. Thereby, the electroconductive bonding material 120 is shaped into a hemispherical shape. The step of heating the electroconductive bonding material 120 may be executed at any timing before the step of forming the sealing insulation layer 107.

Figure 18H:
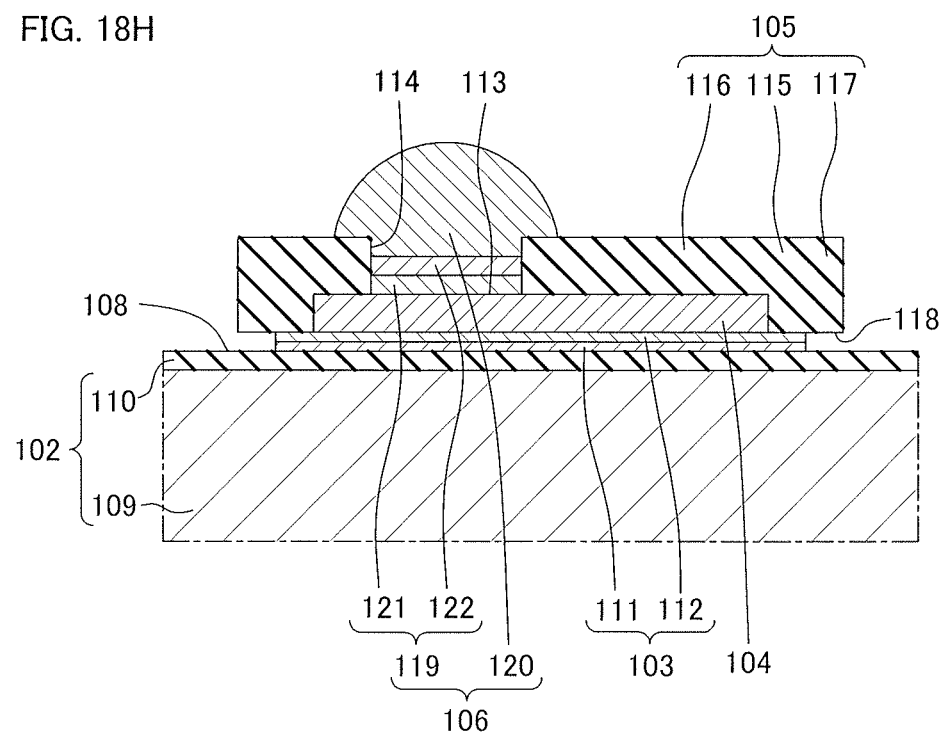

Then, with reference to FIG. 18H, an unnecessary portion of the base electrode layer 103 is removed. In this step, an unnecessary portion of the second electrode layer 112 is first removed. More specifically, a portion which is exposed from the insulation layer 105 in the second electrode layer 112 is removed by etching. The etching may be isotropic etching (for example, wet etching).

In this step, a portion which is positioned directly under a peripheral edge portion of the insulation layer 105 in the second electrode layer 112 is also removed. Thereby, a peripheral edge portion of the second electrode layer 112 is formed at a region which is further inside than the peripheral edge portion of the insulation layer 105.

Then, an unnecessary portion of the first electrode layer 111 is removed. More specifically, a portion which is exposed from the insulation layer 105 in the first electrode layer 111 is removed by etching. The etching may be isotropic etching (for example, wet etching).

In this step, a portion which is positioned directly under the peripheral edge portion of the insulation layer 105 in the first electrode layer 111 is also removed. Thereby, a peripheral edge portion of the first electrode layer 111 is formed at a region further inside than the peripheral edge portion of the insulation layer 105. As described above, there is formed the base electrode layer 103 having a predetermined pattern.

Figure 18I:
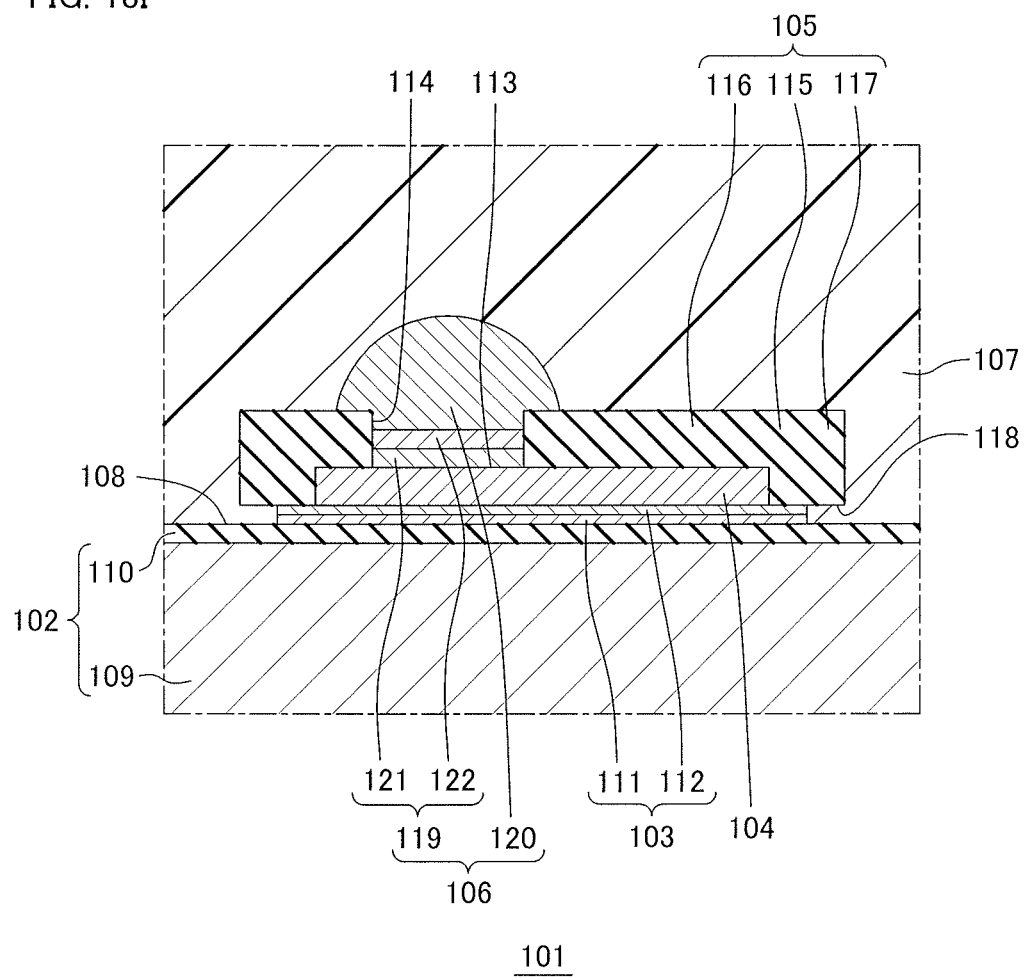

Then, with reference to FIG. 18I, the sealing insulation layer 107 is formed on the major surface 108. The sealing insulation layer 107 fills the space 118, thereby sealing the base electrode layer 103, the wiring layer 104, the insulation layer 105 and the bump structure 106. The sealing insulation layer 107 may be formed by coating a photosensitive resin or a thermosetting resin on the major surface 108. The wiring structure body 101 is formed by the steps including the above.

Where a chip component is connected to the bump structure 106 (electroconductive bonding material 120), the chip component is connected to the bump structure 106 (electroconductive bonding material 120), prior to the step of forming the sealing insulation layer 107.

As described so far, according to the wiring structure body 101, the insulation layer 105 is formed on a peripheral edge portion of the base electrode layer 103 so as to protrude to a region outside the base electrode layer 103 from above the base electrode layer 103. Further, the electroconductive bonding material 120 is formed on the wiring layer 104. Thereby, it is possible to prevent the molten electroconductive bonding material 120 from wetting and spreading by the insulation layer 105 and, thus, possible to prevent the electroconductive bonding material 120 from outflowing.

More specifically, the insulation layer 105 covers the wiring layer 104 and has the pad opening 114 which exposes the pad portion 113 of the wiring layer 104. Inside the pad opening 114, there is formed the bump structure 106 which includes the electroconductive bonding material 120. Thereby, it is possible to prevent the electroconductive bonding material 120 from making contact with the wiring layer 104 and, thus, possible to appropriately prevent the molten electroconductive bonding material 120 from outflowing by the insulation layer 105.

The base electrode layer 103 is also positioned at a region further inside than the insulation layer 105. Therefore, even if the molten electroconductive bonding material 120 oozes outside the wiring layer 104, the electroconductive bonding material 120 can spread to the base electrode layer 103 at a region further inside than the insulation layer 105. Thereby, it is possible to appropriately prevent the electroconductive bonding material 120 from outflowing to a region outside the insulation layer 105.

Further, according to the wiring structure body 101, the space 118 defined at a region between the protruding portion 117 of the insulation layer 105 and the major surface 108 of the support substrate 102 is sealed by the sealing insulation layer 107. Thereby, where the molten electroconductive bonding material 120 is present at the space 118, the electroconductive bonding material 120 can be sealed inside the space 118 by the sealing insulation layer 107. Thus, it is possible to appropriately prevent the electroconductive bonding material 120 from outflowing.

Figure 19:
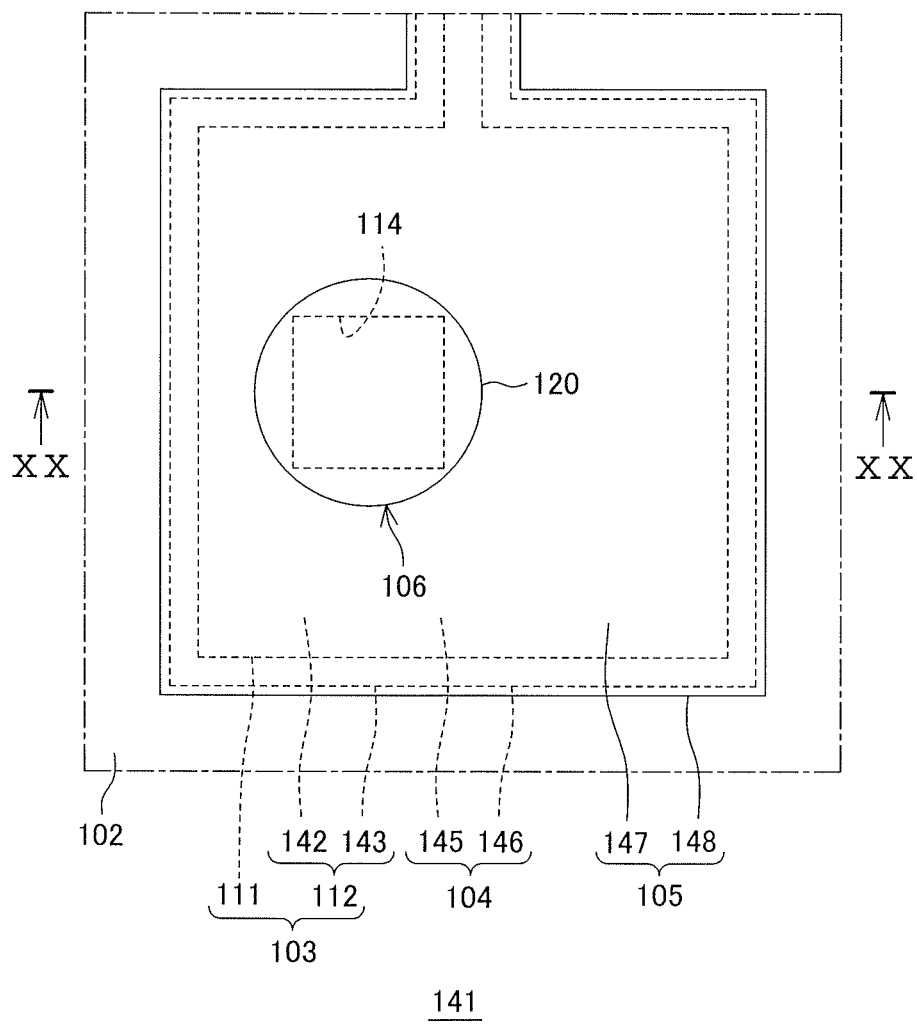
FIG. 19 is a plan view which shows a wiring structure body according to a sixth preferred embodiment of the present invention.
Figure 20:
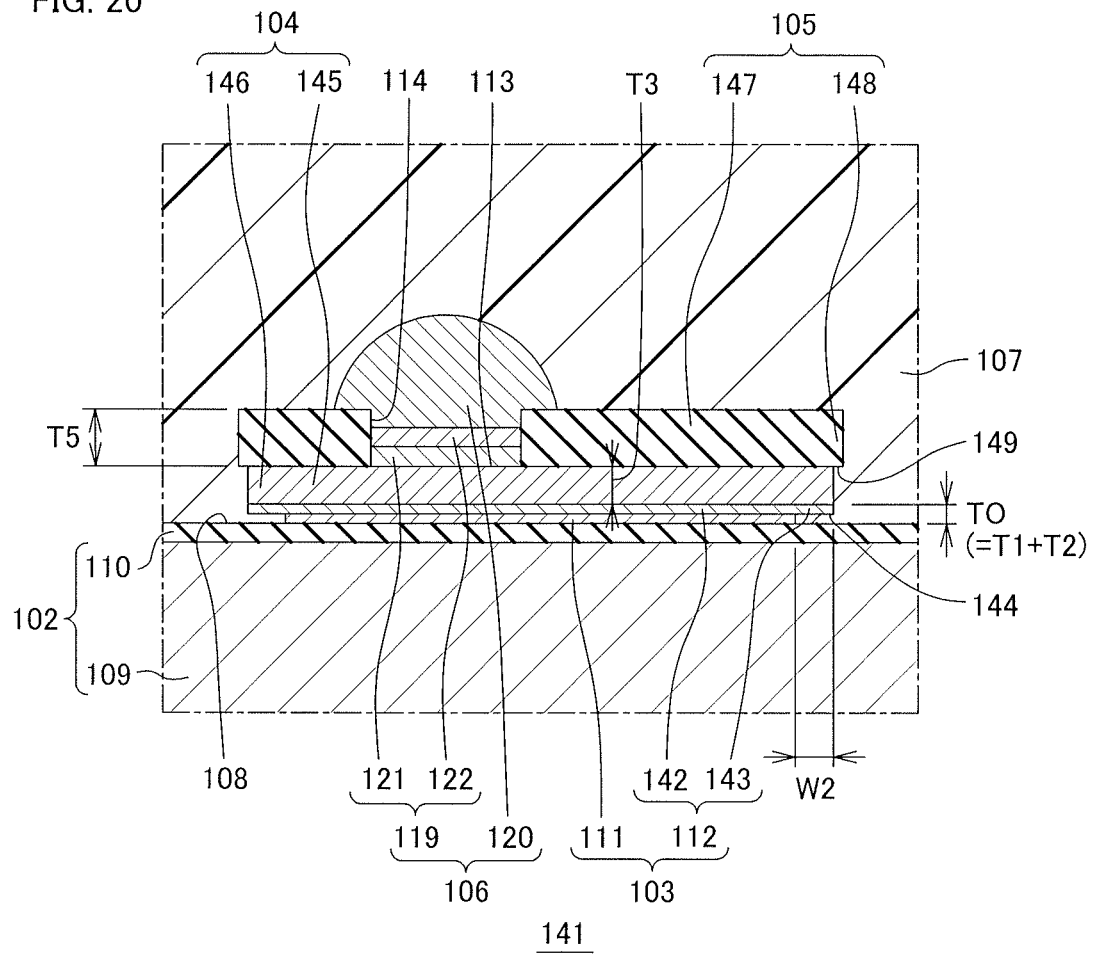
FIG. 20 is a cross-sectional view which is taken along line XX-XX shown in FIG. 19.

FIG. 19 is a plan view which shows a wiring structure body 141 according to the sixth preferred embodiment of the present invention. FIG. 20 is a cross-sectional view which is taken along line XX-XX shown in FIG. 19. In the following, structures corresponding to the structures in the wiring structure body 101 (refer to FIG. 16, FIG. 17 and others) will be given the same reference signs, and a description thereof is omitted.

With reference to FIG. 19 and FIG. 20, the wiring structure body 141 includes a support substrate 102, a base electrode layer 103, a wiring layer 104, an insulation layer 105, a bump structure 106 and a sealing insulation layer 107. In FIG. 19 and FIG. 20, there is shown a state that a chip component is not connected to the wiring structure body 141. In FIG. 19, an internal structure of the wiring structure body 141 is shown by seeing through the sealing insulation layer 107.

A second electrode layer 112 of the base electrode layer 103 protrudes to a region outside a first electrode layer 111 from above the first electrode layer 111. The second electrode layer 112 protrudes in a transverse direction along a major surface of the first electrode layer 111. The second electrode layer 112 faces a major surface 108 in a normal direction of the major surface 108 at the region outside the first electrode layer 111.

More specifically, the second electrode layer 112 includes an electrode base portion 142 and an electrode protruding portion 143. The electrode base portion 142 covers the first electrode layer 111. The electrode protruding portion 143 extends from the electrode base portion 142 to a side opposite to the first electrode layer 111.

More specifically, the electrode protruding portion 143 extends in the transverse direction along the major surface of the first electrode layer 111 and protrudes to the region outside the first electrode layer 111. The electrode protruding portion 143 faces the major surface 108 in a normal direction of the major surface 108 at the region outside the first electrode layer 111. The electrode protruding portion 143 defines a first space 144 together with the major surface 108 and a side surface of the first electrode layer 111. The first space 144 is recessed toward the side of the first electrode layer 111.

A ratio W2/T1, which is a ratio of a width W2 of the electrode protruding portion 143 in relation to the thickness T1 of the first electrode layer in, may be 1 or more and 10 or less. The ratio W2/T1 may be 1 or more and 2 or less, from 2 or more and 4 or less, from 4 or more and 6 or less, from 6 or more and 8 or less, or from 8 or more and 10 or less. It is preferable that the ratio W2/T1 is 1 or more and 5 or less.

The width W2 may be 0.01 µm or more and 6.0 µm or less. The width W2 may be 0.01 µm or more and 1.0 µm or less, from 1.0 µm or more and 2.0 µm or less, from 2.0 µm or more and 3.0 µm or less, from 3.0 µm or more and 4.0 µm or less, from 4.0 µm or more and 5.0 µm or less, or from 5.0 µm or more and 6.0 µm or less.

The wiring layer 104 is formed on the base electrode layer 103. The wiring layer 104 covers collectively the electrode base portion 142 and the electrode protruding portion 143 of the second electrode layer 112. More specifically, the wiring layer 104 includes a wiring base portion 145 and a wiring protruding portion 146.

The wiring base portion 145 covers the electrode base portion 142 of the second electrode layer 112. The wiring protruding portion 146 covers the electrode protruding portion 143 of the second electrode layer 112. In the preferred embodiment, a side surface of the wiring layer 104 is connected to a side surface of the second electrode layer 112 without any difference in level.

The wiring protruding portion 146 may protrude to a region outside the second electrode layer 112 from above the second electrode layer 112. The wiring protruding portion 146 may face the major surface 108 in a normal direction of the major surface 108 at the region outside the second electrode layer 112. More specifically, the wiring protruding portion 146 may protrude in a transverse direction along a major surface of the second electrode layer 112. A step portion may be formed between the side surface of the wiring layer 104 and the side surface of the second electrode layer 112.

The insulation layer 105 is formed on the wiring layer 104. The insulation layer 105 protrudes to a region outside the wiring layer 104 from above the wiring layer 104. The insulation layer 105 protrudes in a transverse direction along a major surface of the wiring layer 104. The insulation layer 105 faces the major surface 108 in a normal direction of the major surface 108 at the region outside the wiring layer 104. The insulation layer 105 exposes the side surface of the wiring layer 104.

More specifically, the insulation layer 105 includes an insulating base portion 147 and an insulating protruding portion 148. The insulating base portion 147 covers the wiring base portion 145 of the wiring layer 104. The insulating protruding portion 148 covers the wiring protruding portion 146 of the wiring layer 104. The insulating protruding portion 148 extends in the transverse direction along the major surface of the wiring layer 104 and protrudes to the region outside the wiring layer 104. The width of the insulating protruding portion 148 may be equal to or more than the thickness T1 of the first electrode layer 111.

The insulating protruding portion 148 faces the major surface 108 in the normal direction of the major surface 108 at the region outside the wiring layer 104. The insulating protruding portion 148 defines a second space 149 together with the major surface 108 and the side surface of the wiring layer 104. The second space 149 is recessed toward the side of the wiring layer 104. The second space 149 is communicatively connected to the first space 144.

A thickness T5 of the insulation layer 105 may be 0.5 µm or more and 40 µm or less. The thickness T5 may be 0.5 µm or more and 10 µm or less, from 10 µm or more and 20 µm or less, from 20 µm or more and 30 µm or less, or from 30 µm or more and 40 µm or less.

The bump structure 106 is formed inside a pad opening 114 of the insulation layer 105. The pad opening 114 exposes the wiring base portion 145 of the wiring layer 104. Therefore, the bump structure 106 is connected to the wiring base portion 145 of the wiring layer 104.

The sealing insulation layer 107 seals the base electrode layer 103, the wiring layer 104, the insulation layer 105 and the bump structure 106 on the major surface 108. The sealing insulation layer 107 fills the first space 144 and the second space 149. Where a chip component is connected to the wiring structure body 141 through an electroconductive bonding material 120, the sealing insulation layer 107 also seals the chip component.

FIG. 21A to FIG. 21F are cross-sectional views showing various process steps in an example of a method for manufacturing the wiring structure body 141 shown in FIG. 19.

Figure 21A:
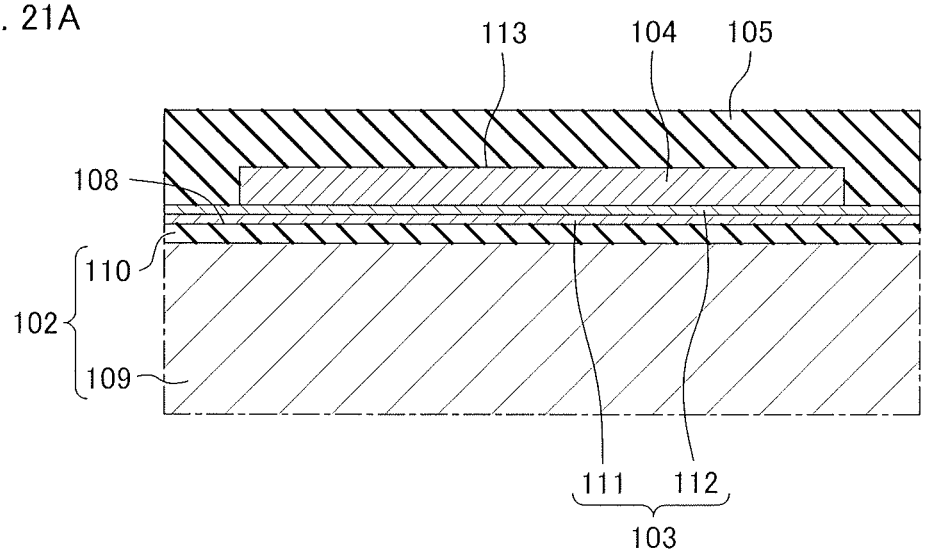

With reference to FIG. 21A, by substantially the same steps as those described previously in FIG. 18A to FIG. 18D, the base electrode layer 103, the wiring layer 104 and the insulation layer 105 are formed on the support substrate 102.

Then, with reference to FIG. 21B, an unnecessary portion of the insulation layer 105 is removed. In the preferred embodiment, a region at which the pad opening 114 is to be formed in the insulation layer 105 and a region outside the wiring layer 104 are removed. Thereby, the insulation layer 105 is formed only on the wiring layer 104.

Then, with reference to FIG. 21C, by substantially the same steps as those in FIG. 18F to FIG. 18G, the bump structure 106 is formed.

Figure 21D:
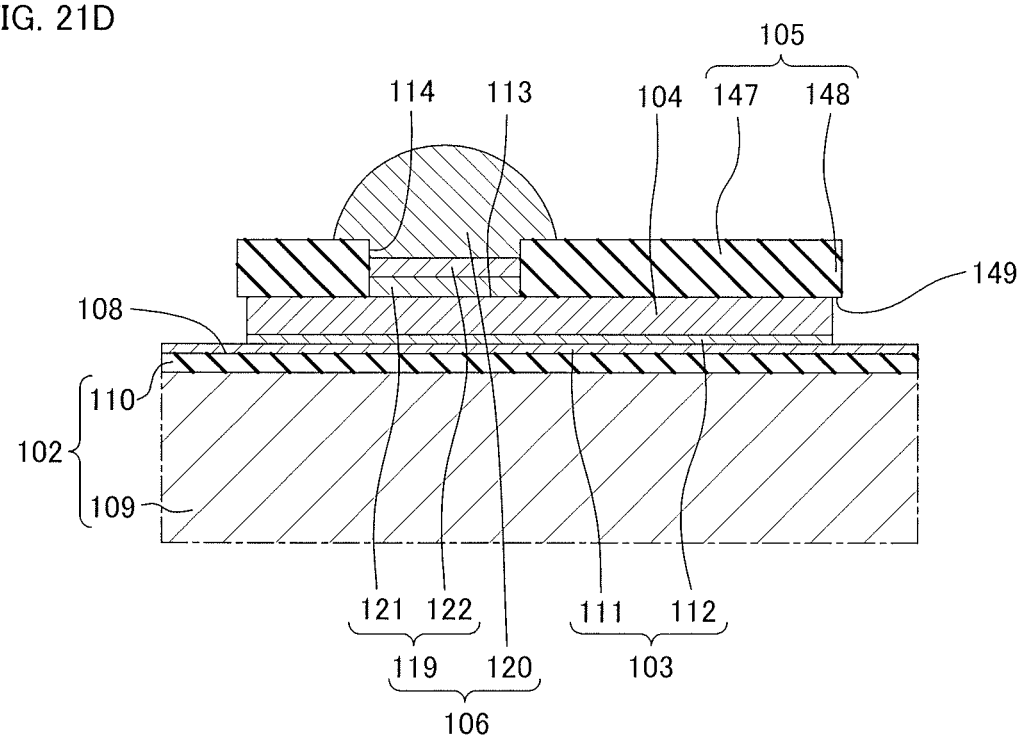

Then, with reference to FIG. 21D, an unnecessary portion of the base electrode layer 103 is removed. In this step, an unnecessary portion of the second electrode layer 112 is first removed. More specifically, a portion which is exposed from the wiring layer 104 in the second electrode layer 112 is removed by etching. The etching may be isotropic etching (for example, wet etching).

In this step, a portion which is exposed from the insulation layer 105 in the wiring layer 104 is also removed. The wiring layer 104 is removed only by a portion which corresponds to the thickness T2 of the second electrode layer 112. Thereby, the side surface of the wiring layer 104 and the side surface of the second electrode layer 112 are formed at a region further inside than a peripheral edge portion of the insulation layer 105.

Figure 21E:
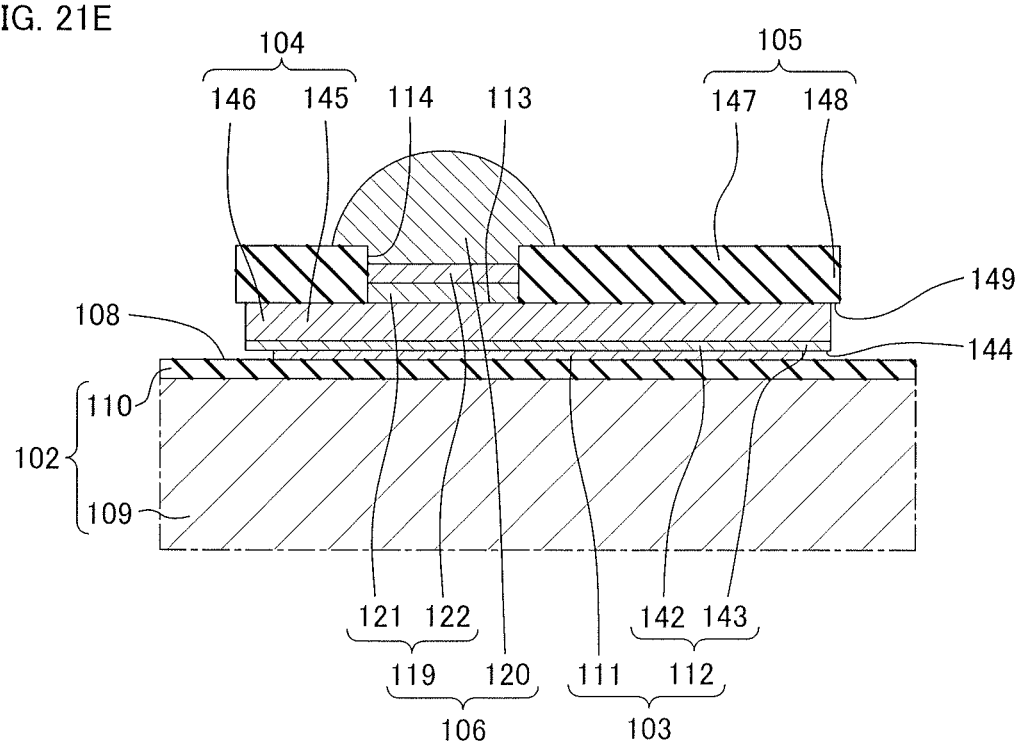

Then, with reference to FIG. 21E, an unnecessary portion of the first electrode layer 111 is removed. More specifically, a portion which is exposed from the second electrode layer 112 in the first electrode layer 111 is removed by etching. The etching may be isotropic etching (for example, wet etching).

In this step, a portion which is positioned directly under a peripheral edge portion of the second electrode layer 112 in the first electrode layer 111 is also removed. Thereby, a peripheral edge portion of the first electrode layer 111 is formed at a region which is further inside than the peripheral edge portion of the second electrode layer 112. As described above, there is formed the base electrode layer 103 having a predetermined pattern.

Then, with reference to FIG. 21F, the sealing insulation layer 107 is formed on the major surface 108. The sealing insulation layer 107 fills the first space 144 and the second space 149, thereby sealing the base electrode layer 103, the wiring layer 104, the insulation layer 105 and the bump structure 106. The wiring structure body 141 is formed by the steps including the above.

Where a chip component is connected to the bump structure 106 (electroconductive bonding material 120), the chip component is connected to the bump structure 106 (electroconductive bonding material 120) prior to the step of forming the sealing insulation layer 107.

As described so far, the wiring structure body 141 includes the wiring layer 104 which is formed on the base electrode layer 103 so as to protrude to a region outside the base electrode layer 103. The insulation layer 105 is formed on the wiring layer 104 so as to expose a pad portion 113 of the wiring layer 104. The electroconductive bonding material 120 is formed on the pad portion 113. Thereby, the molten electroconductive bonding material 120 can be prevented from wetting and spreading by the insulation layer 105. Thus, it is possible to prevent the electroconductive bonding material 120 from outflowing.

More specifically, the insulation layer 105 has the pad opening 114 which exposes the pad portion 113 of the wiring layer 104. The bump structure 106 which includes the electroconductive bonding material 120 is formed inside the pad opening 114. Thereby, it is possible to prevent the electroconductive bonding material 120 from making contact with the wiring layer 104 and then possible to appropriately prevent the molten electroconductive bonding material 120 from outflowing by the insulation layer 105.

The base electrode layer 103 is positioned at a region further inside than the wiring layer 104. Therefore, even if the molten electroconductive bonding material 120 oozes outside the insulation layer 105, the molten electroconductive bonding material 120 can spread to the wiring layer 104 and the base electrode layer 103. The electroconductive bonding material 120 spreads along the base electrode layer 103 at the region further inside than the wiring layer 104. Thereby, it is possible to appropriately prevent the electroconductive bonding material 120 from outflowing to a region outside the wiring layer 104.

Further, the first space 144 which is defined at a region between the major surface 108 and the protruding portion 117 of the wiring layer 104 is filled with the sealing insulation layer 107. Thereby, where the molten electroconductive bonding material 120 is present at the first space 144, the electroconductive bonding material 120 can be sealed inside the first space 144. It is, thus, possible to appropriately prevent the molten electroconductive bonding material 120 from outflowing.

Further, the second space 149 defined at a region between the major surface 108 and the insulating protruding portion 148 of the insulation layer 105 is filled with the sealing insulation layer 107. Thereby, where the molten electroconductive bonding material 120 is present at the second space 149, the electroconductive bonding material 120 can be sealed inside the second space 149. It is, thus, possible to appropriately prevent the molten electroconductive bonding material 120 from outflowing.

FIG. 22 is a cross-sectional view which shows a wiring structure body 151 according to the seventh preferred embodiment of the present invention. In the following, structures corresponding to the structures in the wiring structure body 141 (refer to FIG. 19, FIG. 20 and others) will be given the same reference signs, and a description thereof is omitted.

With reference to FIG. 22, in the preferred embodiment, an insulation layer 105 is free of an insulating protruding portion 148. The insulation layer 105 is formed at a region further inside than a peripheral edge portion of a wiring layer 104. The insulation layer 105 covers at least a wiring base portion 145 of the wiring layer 104. The insulation layer 105 may cover portion a wiring protruding portion 146 of the wiring layer 104.

There is formed a recess portion 152 which is recessed toward the side of a base electrode layer 103 at an exposed portion which is exposed from the insulation layer 105 on a major surface of the wiring layer 104. The recess portion 152 may be connected to a side surface of the insulation layer 105 without any difference in level.

The wiring structure body 151 is manufactured by forming the insulation layer 105 at a region which is further inside than the peripheral edge portion of the wiring layer 104 in the previously described step of forming the insulation layer 105 (refer to FIG. 21B). The recess portion 152 is formed by removing a portion of the wiring layer 104 in the previously described step of removing the second electrode layer 112 (refer to FIG. 21D).

As described so far, the wiring structure body 151 is also able to provide substantially the same technical effects as those described with regard to the wiring structure body 141.

Figure 23:
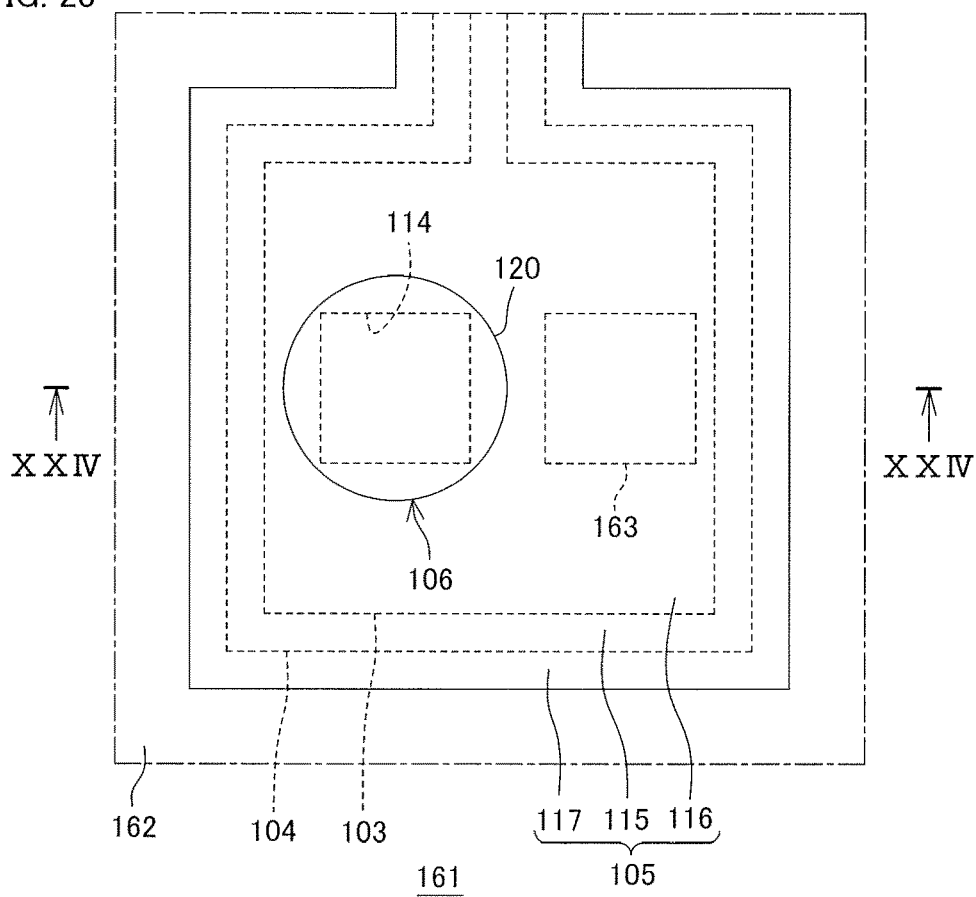
FIG. 23 is a plan view which shows a wiring structure body according to an eighth preferred embodiment of the present invention.
Figure 24:
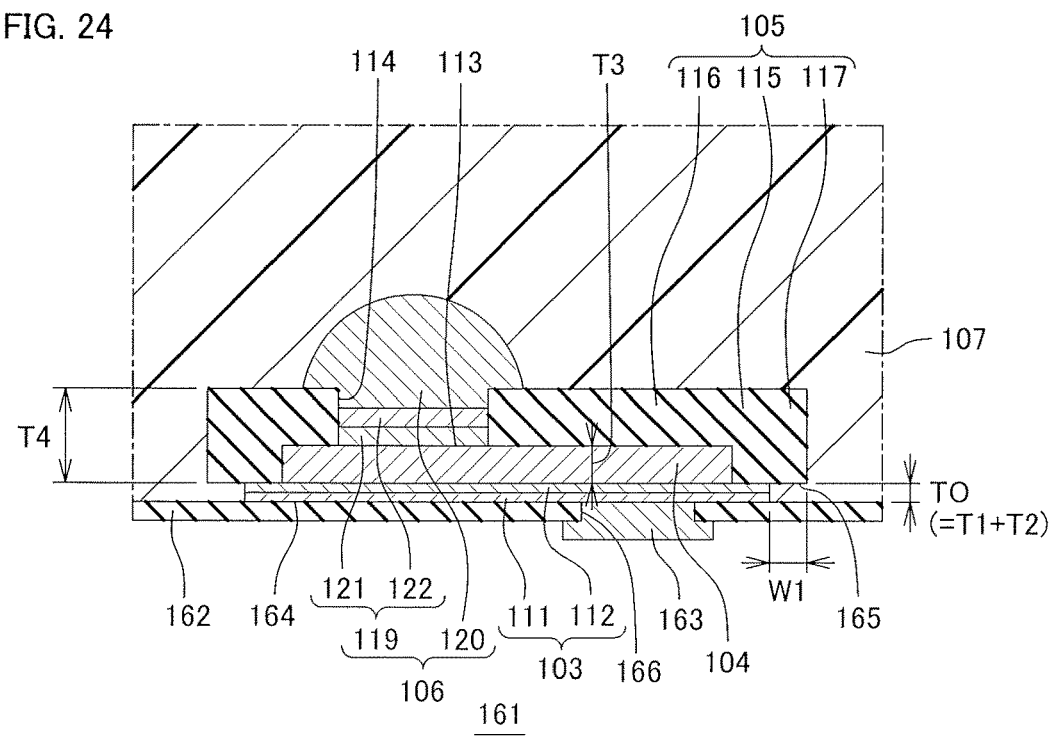
FIG. 24 is a cross-sectional view which is taken along line XXIV-XXIV shown in FIG. 23.

FIG. 23 is a plan view which shows a wiring structure body 161 according to the eighth preferred embodiment of the present invention. FIG. 24 is a cross-sectional view which is taken along line XXIV-XXIV shown in FIG. 23. In the following, structures corresponding to the structures in the wiring structure body 101 (refer to FIG. 16, FIG. 17 and others) will be given the same reference signs, and a description thereof is omitted.

With reference to FIG. 23 and FIG. 24, the wiring structure body 161 includes a base electrode layer 103, a wiring layer 104, an insulation layer 105, a bump structure 106, a sealing insulation layer 107, a base insulation layer 162 and a terminal electrode layer 163. In FIG. 23 and FIG. 24, there is shown a state that a chip component is not connected to the wiring structure body 161. In FIG. 23, there is shown an internal structure of the wiring structure body 161 by seeing through the sealing insulation layer 107.

The wiring structure body 161 is different from the previously described wiring structure body 101 in that it does not include a support substrate 102. A protruding portion 117 of the insulation layer 105 forms a step portion 165 between itself and the base electrode layer 103 in place of a space 118.

The sealing insulation layer 107 seals the wiring layer 104, the insulation layer 105 and the bump structure 106. The sealing insulation layer 107 covers the step portion 165 so as to expose the base electrode layer 103. A portion which covers the step portion 165 in the sealing insulation layer 107 forms a stopper portion which prevents the insulation layer 105 from falling off from the sealing insulation layer 107. Where a chip component is connected to the wiring structure body 161 through the electroconductive bonding material 120, the sealing insulation layer 107 also seals the chip component.

The sealing insulation layer 107 exposes a major surface of the base electrode layer 103 at a side thereof opposite to the wiring layer 104. In the following, the exposed surface of the base electrode layer 103 is referred to as an electrode surface 164. The electrode surface 164 of the base electrode layer 103 is formed by a first electrode layer 111. The electrode surface 164 of the base electrode layer 103 is formed so as to be flush with an outer surface of the sealing insulation layer 107. One flat surface is formed by the electrode surface 164 of the base electrode layer 103 and an outer surface of the sealing insulation layer 107. This flat surface is not a ground surface.

The base insulation layer 162 covers the electrode surface 164 of the base electrode layer 103. A major surface of the base insulation layer 162 on a side thereof opposite to the base electrode layer 103 is an exposed surface which is exposed outside. The base insulation layer 162 extends from the side of the base electrode layer 103 to the side of the sealing insulation layer 107 to cover an outer surface of the sealing insulation layer 107.

More specifically, the base insulation layer 162 collectively covers a flat surface formed by the base electrode layer 103 and the sealing insulation layer 107. The base insulation layer 162 faces the protruding portion 117 of the insulation layer 105 with the sealing insulation layer 107 (stopper portion) interposed therebetween. Thereby, it is possible to appropriately prevent the insulation layer 105 from falling off.

The base insulation layer 162 may include an inorganic insulator or an organic insulator. The base insulation layer 162 may include at least any one of silicon oxide, silicon nitride, silicon oxynitride, aluminum oxide, aluminum nitride and aluminum oxynitride as an example of the inorganic insulator.

The base insulation layer 162 may include at least anyone of a polyimide resin, a polyamide resin, an epoxy resin, a polybenzoxazole resin and a phenol resin as an example of the organic insulator. The organic insulator may include a photosensitive resin.

The base insulation layer 162 includes a lower pad opening 166 which exposes any given region of the electrode surface 164 of the base electrode layer 103 as a pad portion. In the preferred embodiment, the lower pad opening 166 is formed at a region which will not overlap with the bump structure 106 in plan view.

The terminal electrode layer 163 penetrates through the base insulation layer 162 and is connected to the base electrode layer 103. More specifically, the terminal electrode layer 163 is formed inside the lower pad opening 166 of the base insulation layer 162. That is, the terminal electrode layer 163 is formed at a region which will not overlap with bump structure 106 in plan view. The terminal electrode layer 163 is connected to the base electrode layer 103 inside the lower pad opening 166.

The terminal electrode layer 163 protrudes from a major surface of the base insulation layer 162 in a direction opposite to the base electrode layer 103. The terminal electrode layer 163 may be formed as an external terminal electrode which is to be connected externally. The terminal electrode layer 163 may have an overlap portion which covers the major surface of the base insulation layer 162. The terminal electrode layer 163 may have a stacked-layer structure which includes an Ni layer, a Pd layer and an Au layer formed in this order from the side of the base electrode layer 103.

FIG. 25A to FIG. 25E are cross-sectional views showing various process steps in an example of a method for manufacturing the wiring structure body 161 shown in FIG. 23.

Figure 25A:
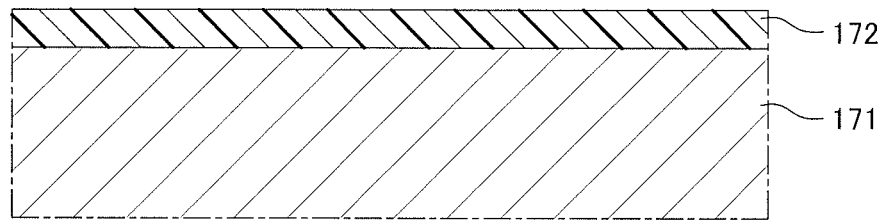
FIG. 25A to FIG. 25E are cross-sectional views showing various process steps in an example of a method for manufacturing the wiring structure body shown in FIG. 23.

With reference to FIG. 25A, a support substrate 171 is prepared. Any member may be used in the support substrate 171 as long as the member can be removed in the middle of the manufacturing. The support substrate 171 is removed by grinding, detachment and/or etching of the support substrate 171.

The support substrate 171 may be a semiconductor substrate or a metal substrate. The semiconductor substrate may be a silicon substrate. The metal substrate may be a copper substrate or a stainless steel substrate. In the following, a description will be given of a case where the support substrate 171 is made up of a stainless steel substrate.

After the support substrate 171 has been prepared, a resin layer 172 is formed on a major surface of the support substrate 171. The resin layer 172 is also called a permanent film. The resin layer 172 may include a negative type photosensitive resin.

The resin layer 172 may be formed by sticking a film-shaped resin sheet to the major surface of the support substrate 171. The resin layer 172 may be formed by coating a liquid resin on the major surface of the support substrate 171. The resin layer 172 is cured by a photographic exposure step.

Figure 25B:
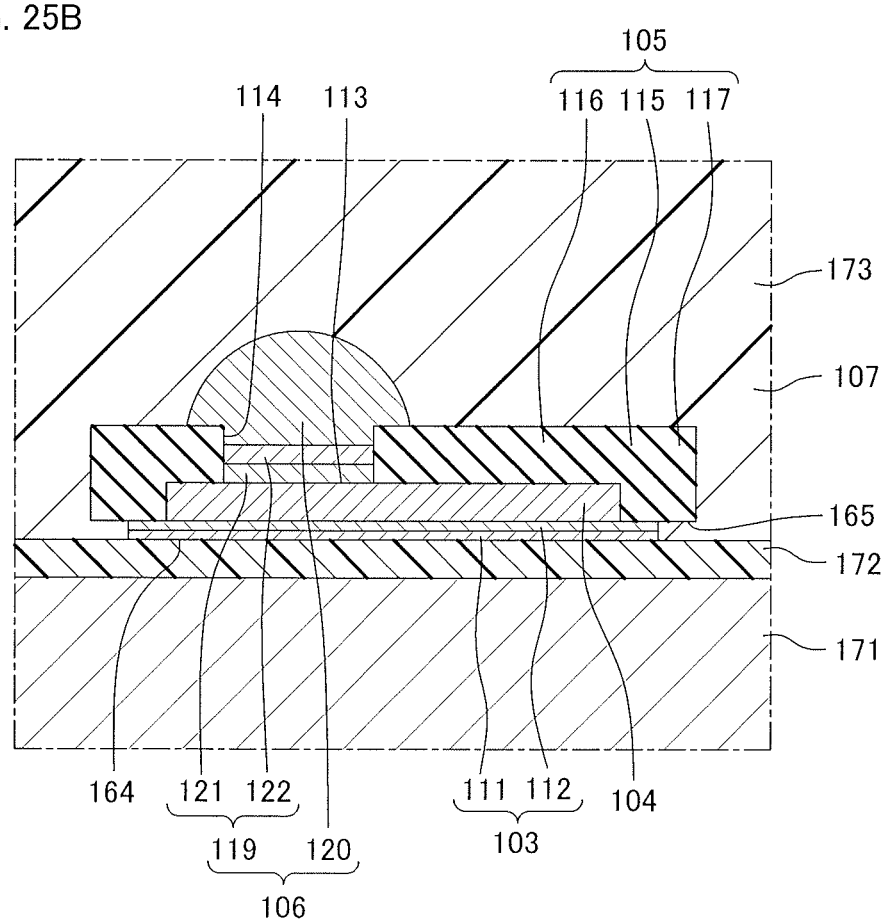

Then, with reference to FIG. 25B, a sealing structure 173 which includes the base electrode layer 103, the wiring layer 104, the insulation layer 105, the bump structure 106 and the sealing insulation layer 107 is formed on the resin layer 172. The sealing structure 173 is formed by substantially the same steps as those of the method for manufacturing the wiring structure body 101 (refer to FIG. 18A to FIG. 18I).

The sealing structure 173 is formed on a major surface of the resin layer 172. Therefore, a surface of the sealing structure 173 which makes contact with the resin layer 172 (hereinafter, referred to as "lower surface") is formed to be flat. The lower surface of the sealing structure 173 is formed by the electrode surface 164 of the base electrode layer 103 and the sealing insulation layer 107. The lower surface of the sealing structure 173 is not a ground surface.

Figure 25C:
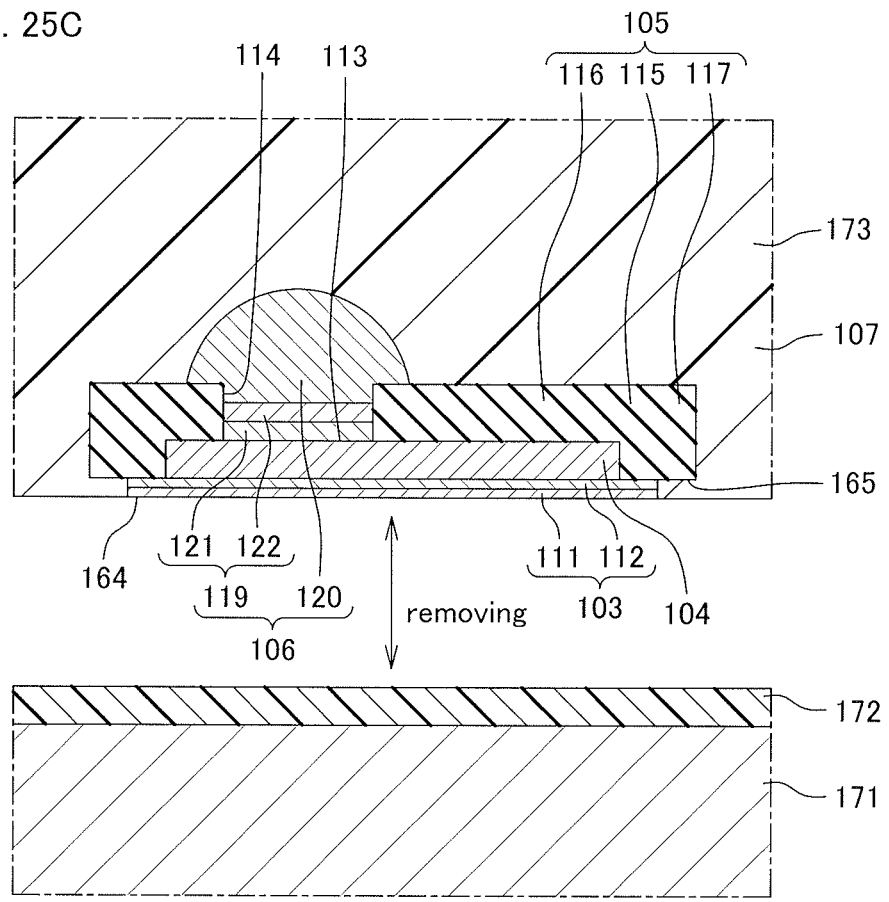

Then, with reference to FIG. 25C, the sealing structure 173 is detached from the resin layer 172. Thereby, the lower surface of the sealing structure 173 is exposed. On the lower surface of the sealing structure 173, the electrode surface 164 of the base electrode layer 103 is formed so as to be flush with an outer surface of the sealing insulation layer 107. The support substrate 171 detached from the sealing structure 173 may be reused as a support substrate for manufacturing another wiring structure body 161.

Figure 25D:
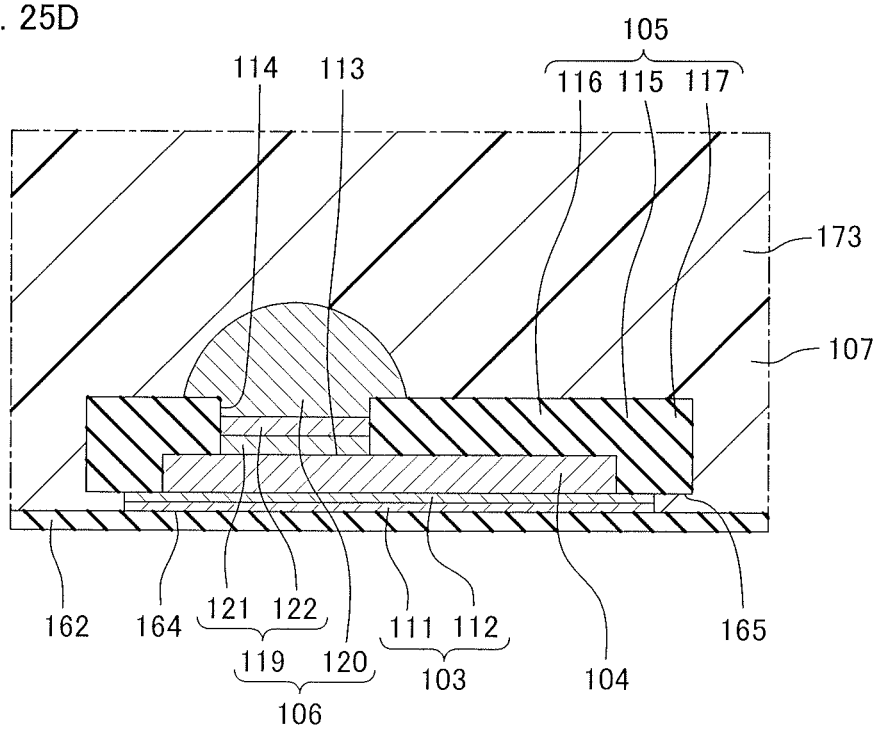

Then, with reference to FIG. 25D, the base insulation layer 162 is formed on the lower surface of the sealing structure 173. More specifically, the base insulation layer 162 covers the base electrode layer 103 and the sealing insulation layer 107. Where the base insulation layer 162 includes an inorganic insulator, the base insulation layer 162 may be formed by a CVD method. Where the base insulation layer 162 includes an organic insulator, the base insulation layer 162 may be formed by coating a photosensitive resin on the lower surface of the sealing structure 173.

Figure 25E:
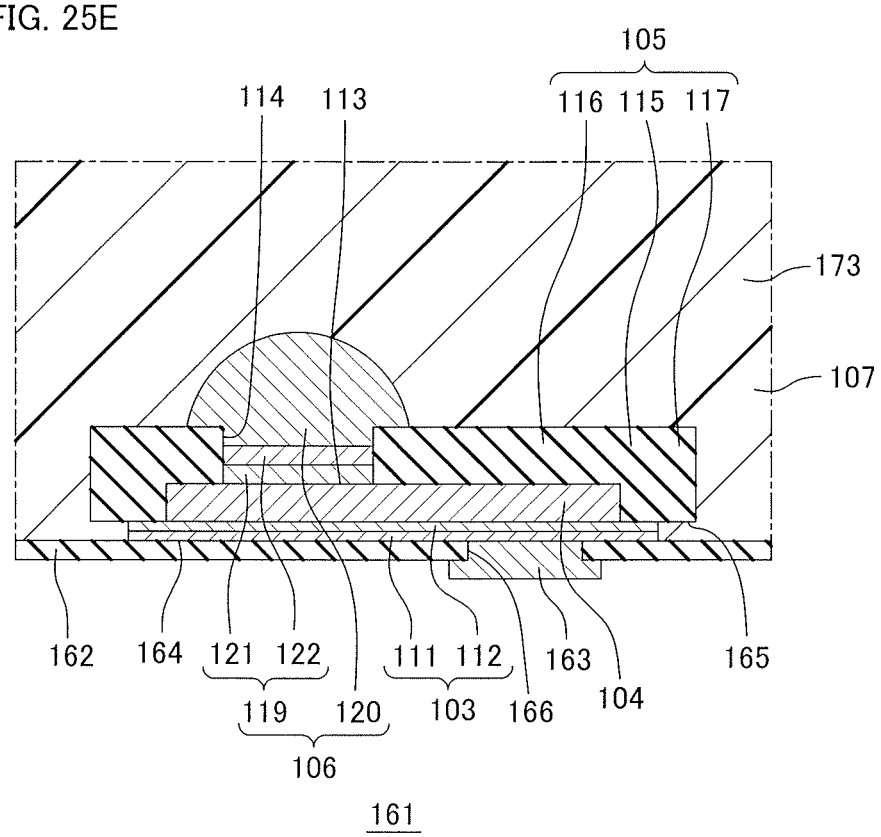

Then, with reference to FIG. 25E, a pad opening 114 which exposes the base electrode layer 103 is formed in the base insulation layer 162. Where the base insulation layer 162 includes an inorganic insulator, an unnecessary portion of the base insulation layer 162 may be removed by etching through a mask (not shown). Where the base insulation layer 162 includes an organic insulator, the unnecessary portion of the base insulation layer 162 may be removed by a photographic exposure step and a development step. Thereby, the base insulation layer 162 which includes the pad opening 114 is formed.

Then, the terminal electrode layer 163 is formed inside the lower pad opening 166. The step of forming the terminal electrode layer 163 includes a step of forming an Ni layer, a Pd layer and an Au layer in this order from the side of the base electrode layer 103. The Ni layer, the Pd layer and the Au layer may be individually formed by an electroless plating method. The wiring structure body 161 is manufactured by the steps including the above.

Where a chip component is connected to the bump structure 106 (electroconductive bonding material 120), the chip component is connected to the bump structure 106 (electroconductive bonding material 120) prior to the step of forming the sealing insulation layer 107.

As described so far, the wiring structure body 161 is also able to provide substantially the same technical effects as those described in the wiring structure body 101.

Figure 26:
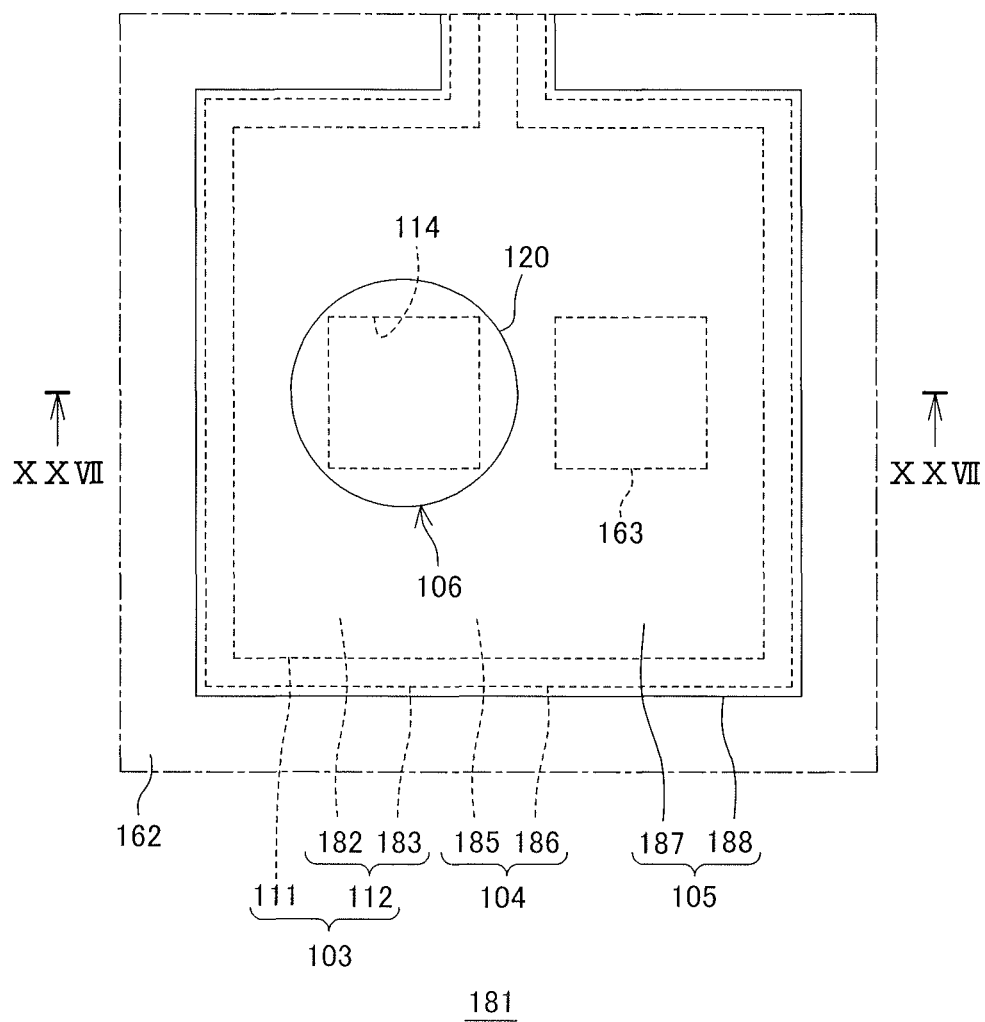
FIG. 26 is a plan view which shows a wiring structure body according to a ninth preferred embodiment of the present invention.
Figure 27:
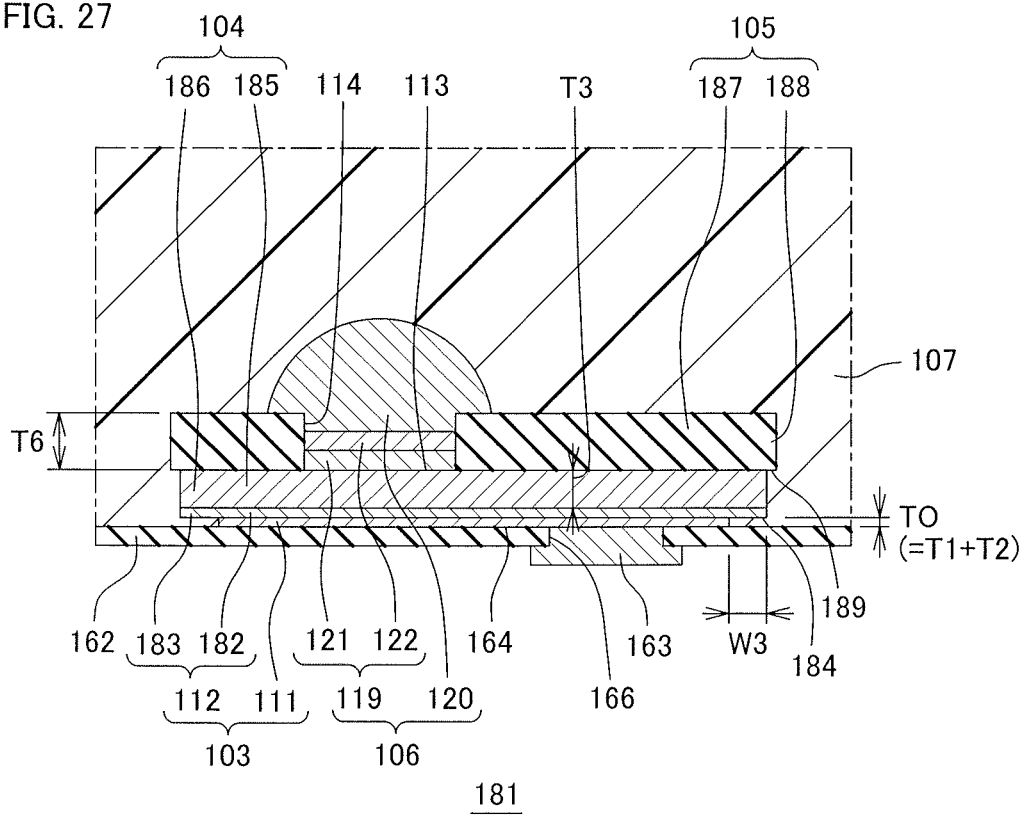
FIG. 27 is a cross-sectional view which is taken along line of XXVII-XXVII shown in FIG. 26.

FIG. 26 is a plan view which shows a wiring structure body 181 according to the ninth preferred embodiment of the present invention. FIG. 27 is a cross-sectional view which is taken along line XXVII-XXVII shown in FIG. 26. In the following, structures corresponding to the structures in the wiring structure body 161 (refer to FIG. 23, FIG. 24 and others) will be given the same reference signs, and a description thereof is omitted.

With reference to FIG. 26 and FIG. 27, the wiring structure body 181 includes abase electrode layer 103, a wiring layer 104, an insulation layer 105, a bump structure 106, a sealing insulation layer 107, a base insulation layer 162 and a terminal electrode layer 163. In FIG. 26 and FIG. 27, there is shown a state that a chip component is not connected to the wiring structure body 181. In FIG. 26, there is shown an internal structure of the wiring structure body 181 by seeing through the sealing insulation layer 107.

A second electrode layer 112 of the base electrode layer 103 protrudes to a region outside the base electrode layer 103 from above a first electrode layer 111. The second electrode layer 112 protrudes in a transverse direction along a major surface of the first electrode layer 111. More specifically, the second electrode layer 112 includes an electrode base portion 182 and an electrode protruding portion 183.

The electrode base portion 182 covers the first electrode layer 111. The electrode protruding portion 183 extends from the electrode base portion 182 to aside opposite to the first electrode layer 111. More specifically, the electrode protruding portion 183 extends in the transverse direction along the major surface of the first electrode layer 111 and protrudes to a region outside the first electrode layer 111. The electrode protruding portion 183 forms a first step portion 184 between itself and a side surface of the first electrode layer 111.

A ratio W3/T1, which is a ratio of a width W3 of the electrode protruding portion 183 in relation to the thickness T1 of the first electrode layer 111, may be 1 or more and 10 or less. The ratio W3/T1 may be 1 or more and 2 or less, from 2 or more and 4 or less, from 4 or more and 6 or less, from 6 or more and 8 or less, or from 8 or more and 10 or less. It is preferable that the ratio W3/T1 is 1 or more and 5 or less.

The width W3 of the electrode protruding portion 183 may be 0.01 μm or more and 5.0 μm or less. The width W3 may be 0.01 μm or more and 1.0 μm or less, from 1.0 μm or more and 2.0 μm or less, from 2.0 μm or more and 3.0 μm or less, from 3.0 μm or more and 4.0 μm or less, or from 4.0 μm or more and 5.0 μm or less.

The wiring layer 104 is formed on the base electrode layer 103. The wiring layer 104 covers collectively the electrode base portion 182 and the electrode protruding portion 183 of the second electrode layer 112. More specifically, the wiring layer 104 includes a wiring base portion 185 and a wiring protruding portion 186.

The wiring base portion 185 covers the electrode base portion 182 of the second electrode layer 112. The wiring protruding portion 186 covers the electrode protruding portion 183 of the second electrode layer 112. A side surface of the wiring layer 104 may be connected to a side surface of the second electrode layer 112 without any difference in level.

The wiring protruding portion 186 may protrude to a region outside the second electrode layer 112 from above the second electrode layer 112. The wiring protruding portion 186 may protrude in a transverse direction along a major surface of the second electrode layer 112. A step portion may be formed between the side surface of the wiring layer 104 and the side surface of the second electrode layer 112.

The insulation layer 105 is formed on the wiring layer 104. The insulation layer 105 protrudes to a region outside the wiring layer 104 from above the wiring layer 104. The insulation layer 105 protrudes in a transverse direction along a major surface of the wiring layer 104. The insulation layer 105 exposes the side surface of the wiring layer 104. More specifically, the insulation layer 105 includes an insulating base portion 187 and an insulating protruding portion 188.

The insulating base portion 187 covers the wiring base portion 185 of the wiring layer 104. The insulating protruding portion 188 covers the wiring protruding portion 186 of the wiring layer 104. The insulating protruding portion 188 extends in the transverse direction along the major surface of the wiring layer 104 and protrudes to the region outside the wiring layer 104. The insulating protruding portion 188 forms a second step portion 189 between itself and the side surface of the wiring layer 104. The width of the insulating protruding portion 188 may be equal to or more than the thickness T1 of the first electrode layer 111.

A thickness T6 of the insulation layer 105 may be 0.5 μm or more and 40 μm or less. The thickness T6 may be 0.5 μm or more and 10 μm or less, from 10 μm or more and 20 μm or less, from 20 μm or more and 30 μm or less, or from 30 μm or more and 40 μm or less.

The sealing insulation layer 107 seals the wiring layer 104, the insulation layer 105 and the bump structure 106. The sealing insulation layer 107 covers the first step portion 184 and the second step portion 189 and exposes an electrode surface 164 of the base electrode layer 103. Where a chip component is connected to the wiring structure body 181 through the electroconductive bonding material 120, the sealing insulation layer 107 also seals the chip component.

A portion which covers the first step portion 184 in the sealing insulation layer 107 forms a first stopper portion which prevents the wiring layer 104 from falling off from the sealing insulation layer 107. A portion which covers the second step portion 189 in the sealing insulation layer 107 forms a second stopper portion which prevents the insulation layer 105 from falling off from the sealing insulation layer 107.

The base insulation layer 162 faces the electrode protruding portion 183 of the wiring layer 104 and the insulating protruding portion 188 of the insulation layer 105 with the sealing insulation layer 107 (the first stopper portion and the second stopper portion) interposed therebetween. Thereby, the wiring layer 104 and the insulation layer 105 are appropriately prevented from falling off.

FIG. 28A to FIG. 28F are cross-sectional views showing various process steps in an example of a method for manufacturing the wiring structure body 181 shown in FIG. 26.

Figure 28A:
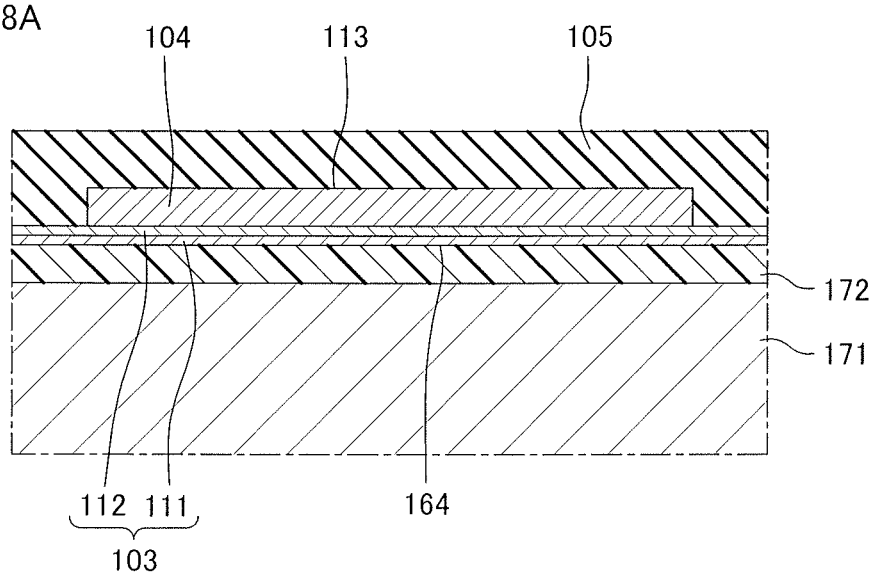

With reference to FIG. 28A, a resin layer 172 is formed on a support substrate 171 by substantially the same step as the step described previously in FIG. 25A. Then, the base electrode layer 103, the wiring layer 104 and the insulation layer 105 are formed on the resin layer 172 by substantially the same steps as those described previously in FIG. 18B to FIG. 18D.

Then, with reference to FIG. 28B, an unnecessary portion of the insulation layer 105 is removed. In the preferred embodiment, a region at which a pad opening 114 is to be formed in the insulation layer 105 and a region outside the wiring layer 104 are removed. Thereby, the insulation layer 105 is formed only on the wiring layer 104.

Then, with reference to FIG. 28C, the bump structure 106 is formed by substantially the same steps as those described previously in FIG. 18F to FIG. 18G.

Figure 28D:
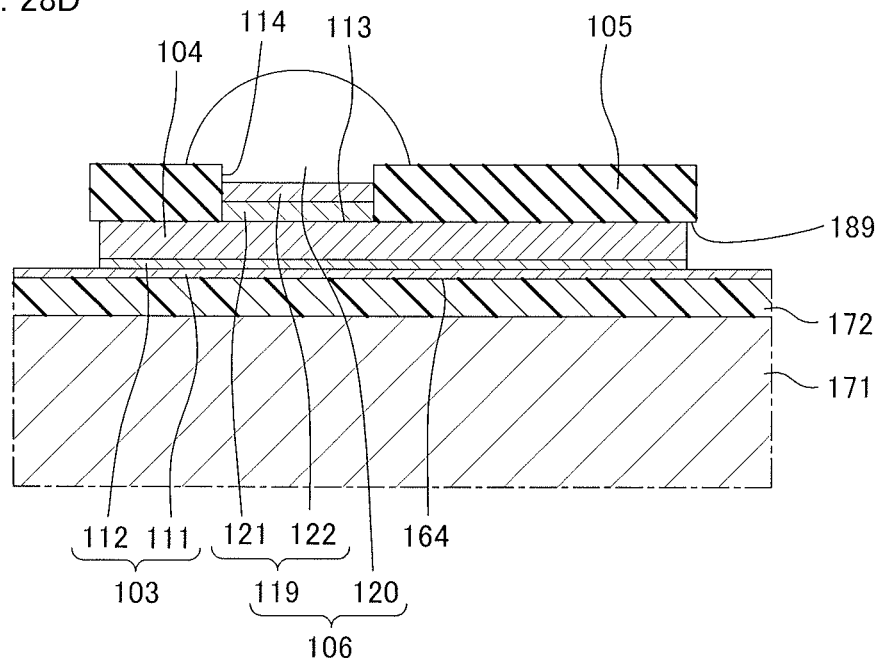

Then, with reference to FIG. 28D, an unnecessary portion of the base electrode layer 103 is removed. In this step, an unnecessary portion of the second electrode layer 112 is first removed. More specifically, a portion which is exposed from the wiring layer 104 in the second electrode layer 112 is removed by etching. The etching may be isotropic etching (for example, wet etching).

In this step, a portion which is exposed from the insulation layer 105 in the wiring layer 104 is also removed. The wiring layer 104 is removed only by a portion corresponding to the thickness T2 of the second electrode layer 112. Thereby, a side surface of the wiring layer 104 and a side surface of the second electrode layer 112 are formed at a region further inside than a peripheral edge portion of the insulation layer 105.

Figure 28E:
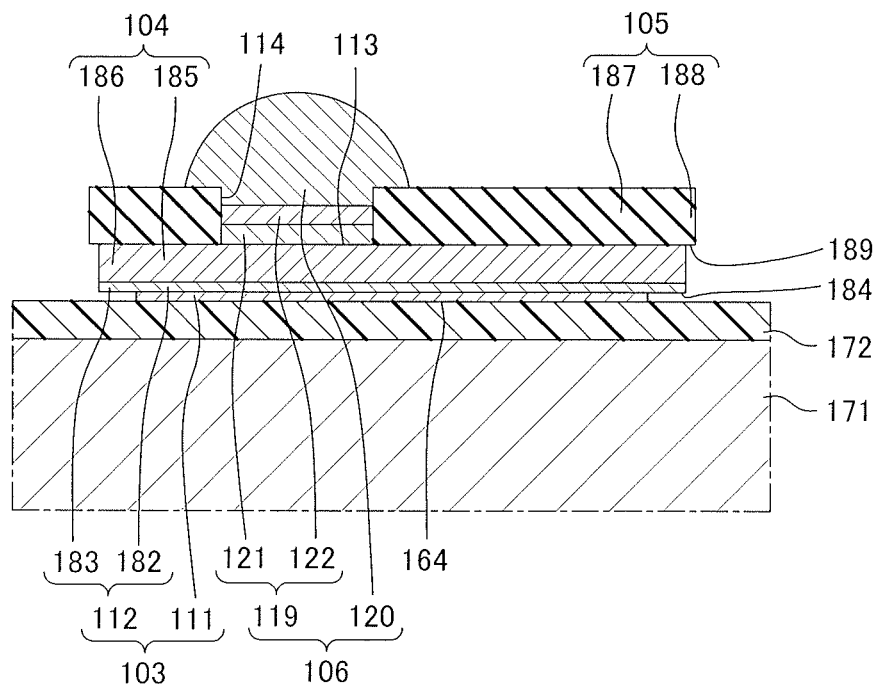

Then, with reference to FIG. 28E, an unnecessary portion of the first electrode layer 111 is removed. More specifically, a portion which is exposed from the second electrode layer 112 in the first electrode layer 111 is removed by etching. The etching may be isotropic etching (for example, wet etching).

In this step, a portion which is positioned directly under a peripheral edge portion of the second electrode layer 112 in the first electrode layer 111 is also removed by etching. Thereby, a peripheral edge portion of the first electrode layer 111 is formed at a region further inside than the peripheral edge portion of the second electrode layer 112. As described above, there is formed the base electrode layer 103 having a predetermined pattern.

Figure 28F:
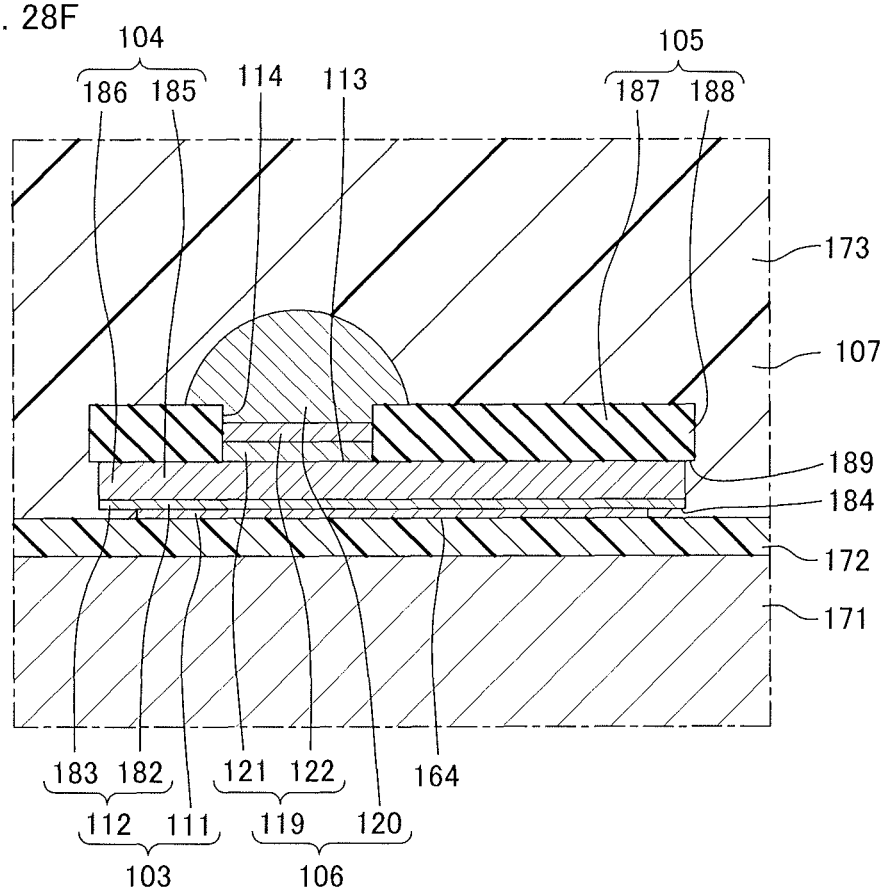

Then, with reference to FIG. 28F, the sealing insulation layer 107 is formed on the resin layer 172. Thereby, a sealing structure 173 is formed. Thereafter, the wiring structure body 181 is manufactured by substantially the same step as those described previously in FIG. 25C to FIG. 25E.

Where a chip component is connected to the bump structure 106 (electroconductive bonding material 120), the chip component is connected to the bump structure 106 (electroconductive bonding material 120) prior to the step of forming the sealing insulation layer 107.

As described so far, the wiring structure body 181 is also able to provide substantially the same technical effects as those described in the wiring structure body 161.

Figure 29:
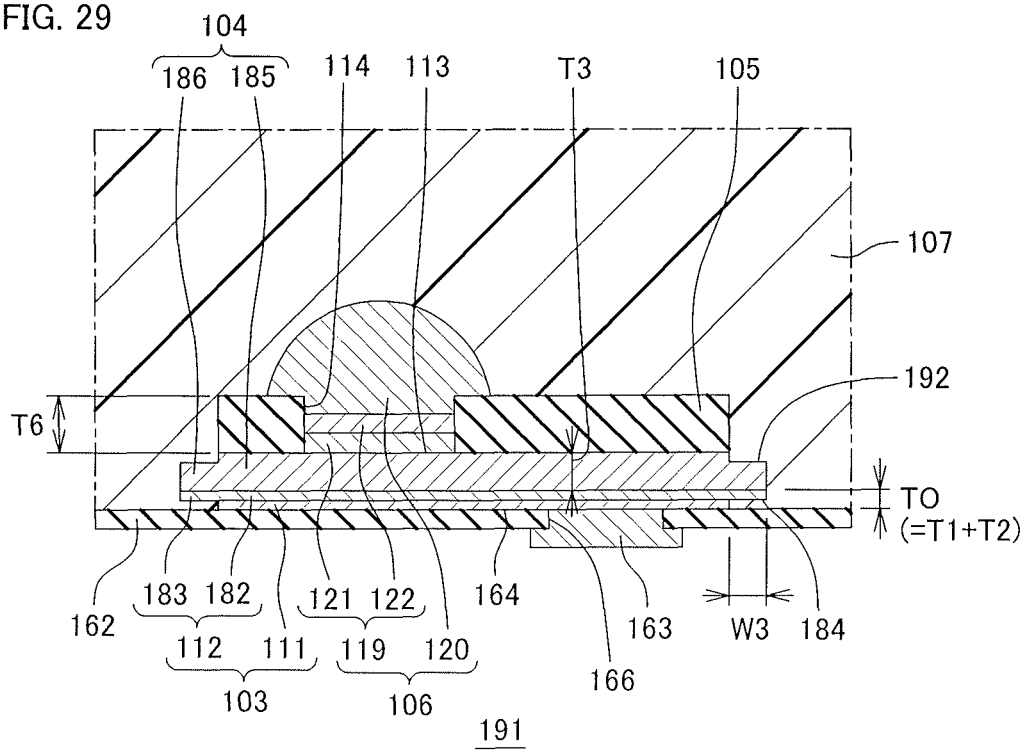
FIG. 29 is a cross-sectional view which shows a wiring structure body according to a tenth preferred embodiment of the present invention.

FIG. 29 is a cross-sectional view which shows a wiring structure body 191 according to the tenth preferred embodiment of the present invention. In the following, structures corresponding to the structures in the wiring structure body 181 (refer to FIG. 26, FIG. 27 and others) will be given the same reference signs, and a description thereof is omitted.

With reference to FIG. 29, the wiring structure body 191 is different from the wiring structure body 181 in that an insulation layer 105 is free of an insulating protruding portion 188. The insulation layer 105 is formed at a region further inside than a peripheral edge portion of a wiring layer 104. The insulation layer 105 covers at least a wiring base portion 185 of the wiring layer 104. The insulation layer 105 may cover a portion of a wiring protruding portion 186 of the wiring layer 104.

At an exposed portion which is exposed from the insulation layer 105 in a major surface of the wiring layer 104, there is formed a recess portion 192 which is recessed toward the side of a base electrode layer 103. The recess portion 192 may be connected to a side surface of the insulation layer 105 without any difference in level.

The wiring structure body 191 is manufactured by forming the insulation layer 105 at a region further inside than a peripheral edge portion of the wiring layer 104 in the previously described step of forming the insulation layer 105 (refer to FIG. 28B). The recess portion 192 is formed by removing a portion of the wiring layer 104 in the previously described step of removing the second electrode layer 112 (refer to FIG. 28D).

As described so far, the wiring structure body 191 is also able to provide substantially the same technical effects as those described in the wiring structure body 181.

Figure 30:
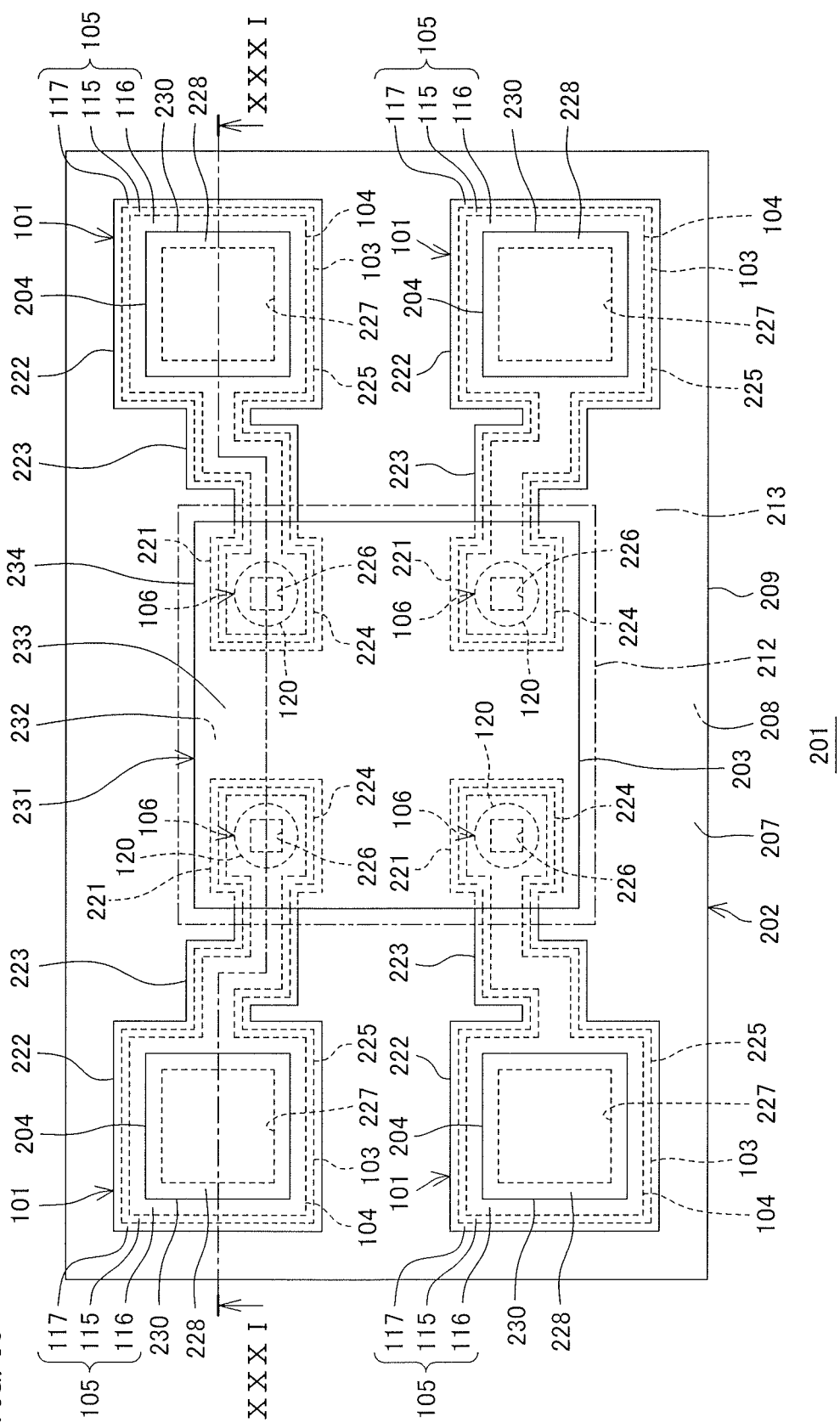
FIG. 30 is a plan view which shows an electronic component according to an eleventh preferred embodiment of the present invention.
Figure 31:
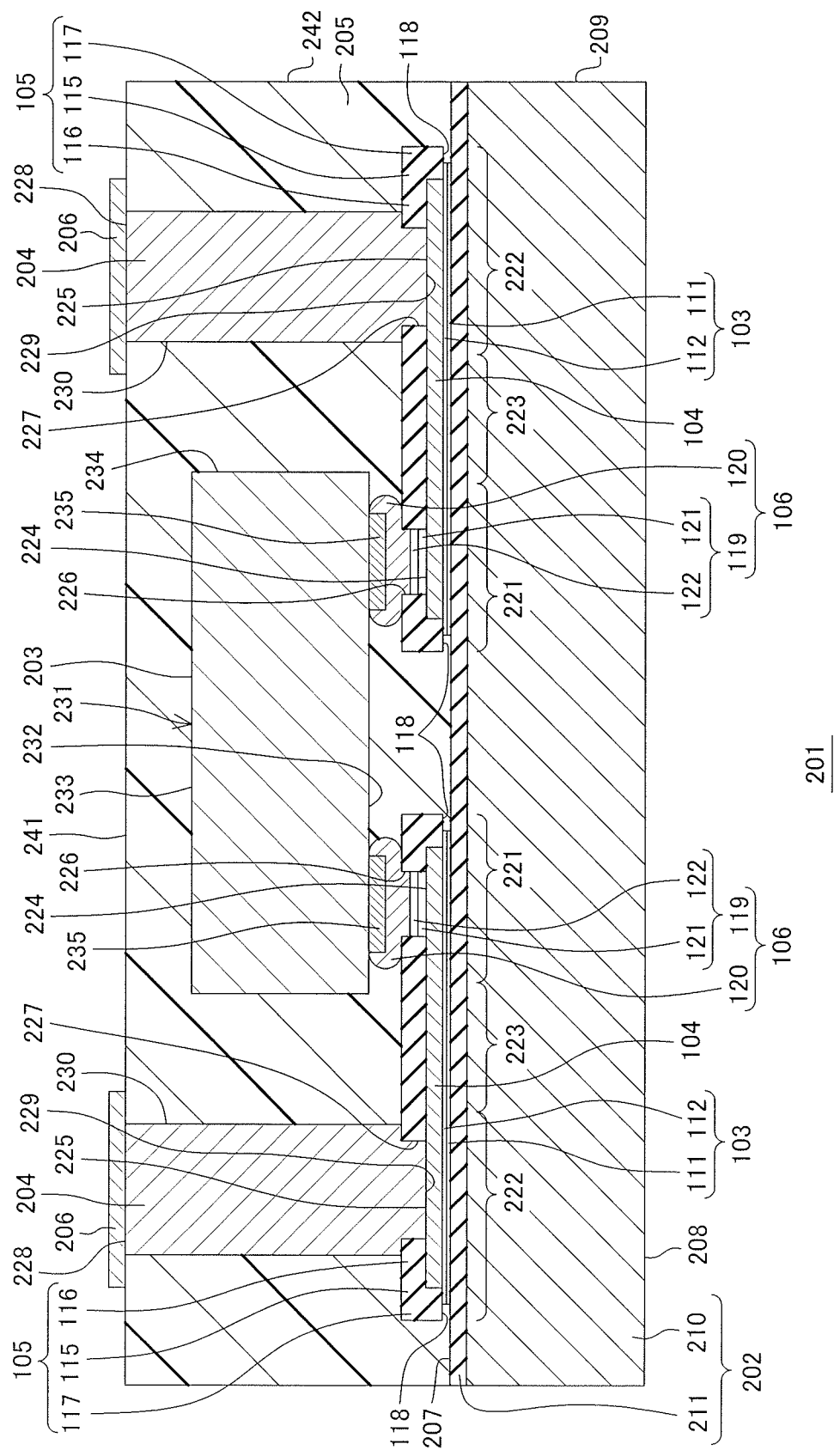
FIG. 31 is a cross-sectional view which is taken along line XXXI-XXXI shown in FIG. 30.

FIG. 30 is a plan view which shows an electronic component 201 according to the eleventh preferred embodiment of the present invention. FIG. 31 is a cross-sectional view which is taken along line XXXI-XXXI shown in FIG. 30. The electronic component 201 is an electronic component in which the previously described wiring structure body 101 (refer to FIG. 16 and FIG. 17) is incorporated. In the following, structures corresponding to the structures in the wiring structure body 101 will be given the same reference signs, and some of descriptions including those on dimensions, etc., of each structure of the wiring structure body 101 will be omitted.

The electronic component 201 includes an interposer 202 as a pitch conversion substrate, a plurality of wiring structure bodies 101, a chip component 203, a plurality of electrode bodies 204, a sealing insulation layer 205 and a plurality of external terminals 206.

The interposer 202 and the sealing insulation layer 205 correspond to the support substrate 102 and the sealing insulation layer 107 of the wiring structure body 101. That is, in the preferred embodiment, the wiring structure bodies 101 each include a portion of the interposer 202, a portion of the sealing insulation layer 205, the base electrode layer 103, the wiring layer 104, the insulation layer 105 and the bump structure 106.

The interposer 202 has a first major surface 207 on one side, a second major surface 208 on the other side and a side surface 209 which connects the first major surface 207 and the second major surface 208. The first major surface 207 and the second major surface 208 are both formed so as to be flat. The first major surface 207 and the second major surface 208 are formed in a quadrangle shape (in a rectangular shape in the preferred embodiment) in a plan view taken from their normal directions (hereinafter, simply referred to as "plan view").

The interposer 202 includes a base body 210 and a major surface insulation layer 211. The base body 210 and the major surface insulation layer 211 correspond respectively to the base body 109 and the major surface insulation layer 110 of the wiring structure body 101. The base body 210 may be a semiconductor substrate. The base body 210 may be a silicon substrate. The major surface insulation layer 211 covers a major surface of the base body 210. The major surface insulation layer 211 may include silicon oxide or silicon nitride.

A chip region 212 and an outer region 213 are set in the interposer 202. The chip region 212 is a region at which the chip component 203 is disposed. The chip region 212 is set at a center portion of the major surface insulation layer 211. The chip region 212 is set in a quadrangle shape corresponding to a planar shape of the chip component 203 in plan view. The outer region 213 is a region outside the chip region 212. The outer region 213 is set in an endless shape (quadrangular annular shape) which surrounds the chip region 212 in plan view.

The plurality of wiring structure bodies 101 (four in the preferred embodiment) are formed to be spaced from each other on the first major surface 207 of the interposer 202. The plurality of wiring structure bodies 101 each extend over the chip region 212 and the outer region 213. The plurality of wiring structure body 101 each include a first pad region 221, a second pad region 222 and a wiring region 223.

The first pad region 221 of each of the wiring structure bodies 101 is formed at the chip region 212. A chip component 203 which will be described later is connected to each of the first pad region 221. In the preferred embodiment, the first pad regions 221 are each formed in a quadrangle shape in plan view. The first pad regions 221 are not limited to be each formed in a quadrangle shape but may be each formed in any given planar shape.

The second pad region 222 of each of the wiring structure bodies 101 is formed at the outer region 213. An electrode body 204 which will be described later is connected to each of the second pad regions 222. In the preferred embodiment, the second pad regions 222 are each formed in a quadrangle shape in plan view. The second pad regions 222 are not limited to be each formed in a quadrangle shape but may be each formed in any given planar shape.

The wiring region 223 of each of the wiring structure bodies 101 connects the first pad region 221 and the second pad region 222 of the corresponding wiring layer 104. The wiring regions 223 are each drawn around in a line shape at a region between the first pad region 221 and the second pad region 222 of the corresponding wiring layer 104. The wiring regions 223 may be each drawn around in any mode.

The base electrode layer 103 of each of the wiring structure bodies 101 is formed on the first major surface 207 of the interposer 202. The base electrode layer 103 has a planar shape corresponding to the first pad region 221, the second pad region 222 and the wiring region 223.

The base electrode layer 103 has a stacked-layer structure which includes a first electrode layer 111 and a second electrode layer 112 stacked in this order from the side of the interposer 202. A side surface of the second electrode layer 112 may be formed so as to be flush with a side surface of the first electrode layer 111. The side surface of the second electrode layer 112 may protrude outside in relation to the side surface of the first electrode layer 111. The side surface of the second electrode layer 112 may be formed inside in relation to the side surface of the first electrode layer 111.

The wiring layer 104 of each of the wiring structure bodies 101 is formed on the base electrode layer 103. The wiring layer 104 has a planar shape corresponding to the first pad region 221, the second pad region 222 and the wiring region 223. The wiring layer 104 is formed to be spaced inwardly from a peripheral edge portion of the base electrode layer 103, and exposes the peripheral edge portion of the base electrode layer 103.

The wiring layer 104 includes a first pad portion 224 (connection portion) and a second pad portion 225. The first pad portion 224 corresponds to the previously described pad portion 113 (refer to FIG. 16, FIG. 17 and others). The first pad portion 224 is formed at the first pad region 221. The second pad portion 225 is formed at the second pad region 222.

The insulation layer 105 of each of the wiring structure bodies 101 is formed on the base electrode layer 103. The insulation layer 105 has a planar shape corresponding to the first pad region 221, the second pad region 222 and the wiring region 223. A first pad opening 226 covers the wiring layer 104 so as to expose the first pad portion 224 and the second pad portion 225 of the wiring layer 104. Thereby, the first pad opening 226 and a second pad opening 227 are formed in the insulation layer 105.

The insulation layer 105 protrudes to a region outside the base electrode layer 103 from above a peripheral edge portion of the base electrode layer 103. The insulation layer 105 protrudes in a transverse direction along a major surface of the base electrode layer 103. The insulation layer 105 faces the first major surface 207 in a normal direction of the first major surface 207 at the region outside the base electrode layer 103.

More specifically, the insulation layer 105 includes a base portion 115, a covering portion 116 and a protruding portion 117. The base portion 115 is formed on the peripheral edge portion of the base electrode layer 103. The covering portion 116 extends from the base portion 115 toward above the wiring layer 104 and demarcate the first pad opening 226 and the second pad opening 227.

The protruding portion 117 extends from the base portion 115 in a direction opposite to the wiring layer 104. The protruding portion 117 extends in the transverse direction along the major surface of the base electrode layer 103 and protrudes to the region outside the base electrode layer 103. The protruding portion 117 faces the first major surface 207 in the normal direction of the first major surface 207 at the region outside the base electrode layer 103. The protruding portion 117 defines a space 118 together with the first major surface 207 and a side surface of the base electrode layer 103. The space 118 is recessed toward the side of the base electrode layer 103.

The bump structure 106 of each of the wiring structure bodies 101 is formed on the first pad portion 224 of the corresponding wiring layer 104. The bump structure 106 each includes a UBM layer 119 and an electroconductive bonding material 120 stacked in this order from the side of the wiring layer 104.

The UBM layer 119 is formed inside the first pad opening 226 of the insulation layer 105. The UBM layer 119 includes a first electrode layer 121 and a second electrode layer 122 stacked in this order from the side of the wiring layer 104. The electroconductive bonding material 120 may include a portion positioned inside the first pad opening 226 and a portion positioned outside the first pad opening 226. The electroconductive bonding material 120 may cover a major surface of the insulation layer 105 outside the first pad opening 226.

The plurality of electrode bodies 204 (four in the preferred embodiment) are each formed on the second pad portion 225 of the corresponding wiring layer 104. The electrode bodies 204 are formed in a block shape or in a pillar shape. The electrode body 204 has a single layer structure which includes a copper layer (more specifically, a copper plating layer).

Each of the electrode bodies 204 has a first electrode surface 228 on one side, a second electrode surface 229 on the other side and an electrode side surface 230 which connects the first electrode surface 228 and the second electrode surface 229. The second electrode surface 229 of each of the electrode bodies 204 is bonded to the second pad portion 225 of the corresponding wiring layer 104. The electrode body 204 may overlap with the insulation layer 105.

The chip component 203 is disposed on the first major surface 207 of the interposer 202. The chip component 203 includes a chip main body 231 formed in a rectangular parallelepiped shape. The chip main body 231 has a mounting surface 232 on one side, a non-mounting surface 233 on the other side and a chip side surface 234 which connects the mounting surface 232 and the non-mounting surface 233. The non-mounting surface 233 is free of an electrode.

The chip main body 231 may include at least any one of silicon, a nitride semiconductor material (for example, gallium nitride), an oxide semiconductor material (for example, gallium oxide), silicon oxide, silicon nitride and ceramic. The chip main body 231 includes a functional device. The chip main body 231 may be a discrete device which is made up of a single functional device. The chip component 203 may be an integrated circuit device having multiple functional devices.

The chip component 203 includes a plurality of chip terminal electrodes 235 (four in the preferred embodiment) formed on the mounting surface 232. The plurality of chip terminal electrodes 235 are electrically connected to the functional devices. The mounting surface 232 may be covered with an insulation layer. In the insulation layer, there may be formed a wiring (wiring layer) which is electrically connected to the chip terminal electrode 235 and the functional device. In this case, the plurality of chip terminal electrodes 235 may protrude outside from the insulation layer.

The chip component 203 is disposed over the first major surface 207 in a posture that the mounting surface 232 faces the interposer 202. The plurality of chip terminal electrodes 235 are electrically connected to the first pad region 221 of the wiring layer 104 through the corresponding bump structure 106 (electroconductive bonding material 120).

The sealing insulation layer 205 fills the space 118 on the first major surface 207, thereby sealing the plurality of wiring structure bodies 101, the chip component 203 and the plurality of electrode bodies 204. The sealing insulation layer 205 includes a sealing major surface 241 and a sealing side surface 242.

The sealing major surface 241 faces the first major surface 207. The sealing major surface 241 is formed so as to be substantially parallel to the first major surface 207 (second major surface 208). The sealing side surface 242 extends toward the interposer 202 from a peripheral edge portion of the sealing major surface 241.

The sealing side surface 242 is connected to the side surface 209 of the interposer 202 without any difference in level. The sealing side surface 242 and the side surface 209 form one flat surface which extends continuously. This flat surface is formed by one ground surface. That is, the sealing side surface 242 is formed so as to be flush with the side surface 209.

The sealing major surface 241 is connected to the first electrode surface 228 of each of the electrode bodies 204 without any difference in level. The sealing major surface 241 forms one continuously extending flat surface with the first electrode surface 228 of each of the electrode bodies 204. More specifically, the sealing major surface 241 forms one ground surface with the first electrode surface 228 of each of the electrode bodies 204. That is, the sealing major surface 241 is formed so as to be flush with the first electrode surface 228 of each of the electrode bodies 204.

The plurality of external terminals 206 (four in the preferred embodiment) are each formed on the first electrode surface 228 of the corresponding electrode body 204. Each of the external terminals 206 may include an overlap portion which covers the sealing major surface 241. Each of the external terminals 206 may have a stacked-layer structure which includes a plurality of electrode layers. Each of the external terminals 206 may have a stacked-layer structure which includes an Ni layer, a Pd layer and an Au layer stacked in this order from the first electrode surface 228-side of the electrode body 204.

As described so far, according to the electronic component 201, the wiring structure body 101 is interposed between the first major surface 207 of the interposer 202 and the mounting surface 232 of the chip component 203. The wiring structure body 101 includes the insulation layer 105 which is formed on a peripheral edge portion of the base electrode layer 103 so as to protrude to a region outside the base electrode layer 103 from above the base electrode layer 103. The wiring structure body 101 also includes the electroconductive bonding material 120 which is formed on the wiring layer 104. Thereby, the molten electroconductive bonding material 120 can be prevented from wetting and spreading by the insulation layer 105. It is, thus, possible to prevent the electroconductive bonding material 120 from outflowing.

More specifically, the insulation layer 105 covers the wiring layer 104 and has the first pad opening 226 which exposes the first pad region 221 of the wiring layer 104. Inside the first pad opening 226, there is formed the bump structure 106 which includes the electroconductive bonding material 120. Thereby, the electroconductive bonding material 120 can be prevented from making contact with the wiring layer 104. Thus, it is possible to appropriately prevent the molten electroconductive bonding material 120 from outflowing by the insulation layer 105.

Further, the base electrode layer 103 is positioned at a region further inside than the insulation layer 105. Therefore, even if the molten electroconductive bonding material 120 oozes outside the insulation layer 105, the electroconductive bonding material 120 can travel to the base electrode layer 103 at the region further inside than the insulation layer 105. Thereby, it is possible to prevent the electroconductive bonding material 120 from outflowing to a region outside the insulation layer 105.

Further, according to the electronic component 201, the space 118 formed at a region between the protruding portion 117 of the insulation layer 105 and the first major surface 207 of the interposer 202 is sealed by the sealing insulation layer 205. Thereby, where the molten electroconductive bonding material 120 is present at the space 118, the electroconductive bonding material 120 can be sealed inside the space 118. It is, thereby, possible to appropriately prevent the molten electroconductive bonding material 120 from outflowing.

In the preferred embodiment, a description has been given of an example that the electronic component 201 includes the external terminal 206. However, the electronic component 201 may be free of the external terminal 206. In this case, the first electrode surface 228 of each of the electrode bodies 204 may be formed as an external terminal.

Figure 32:
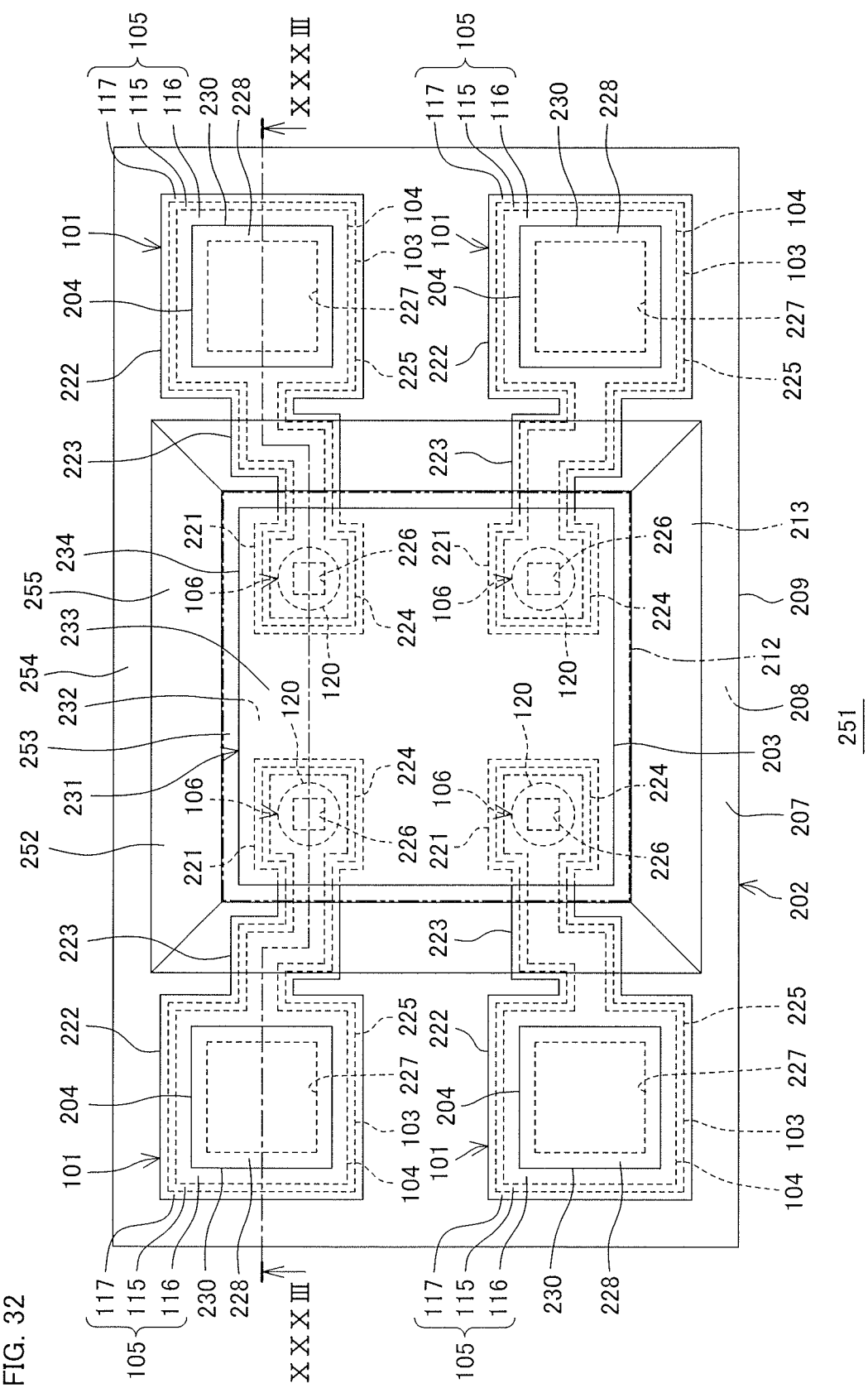
FIG. 32 is a plan view which shows an electronic component according to a twelfth preferred embodiment of the present invention.
Figure 33:
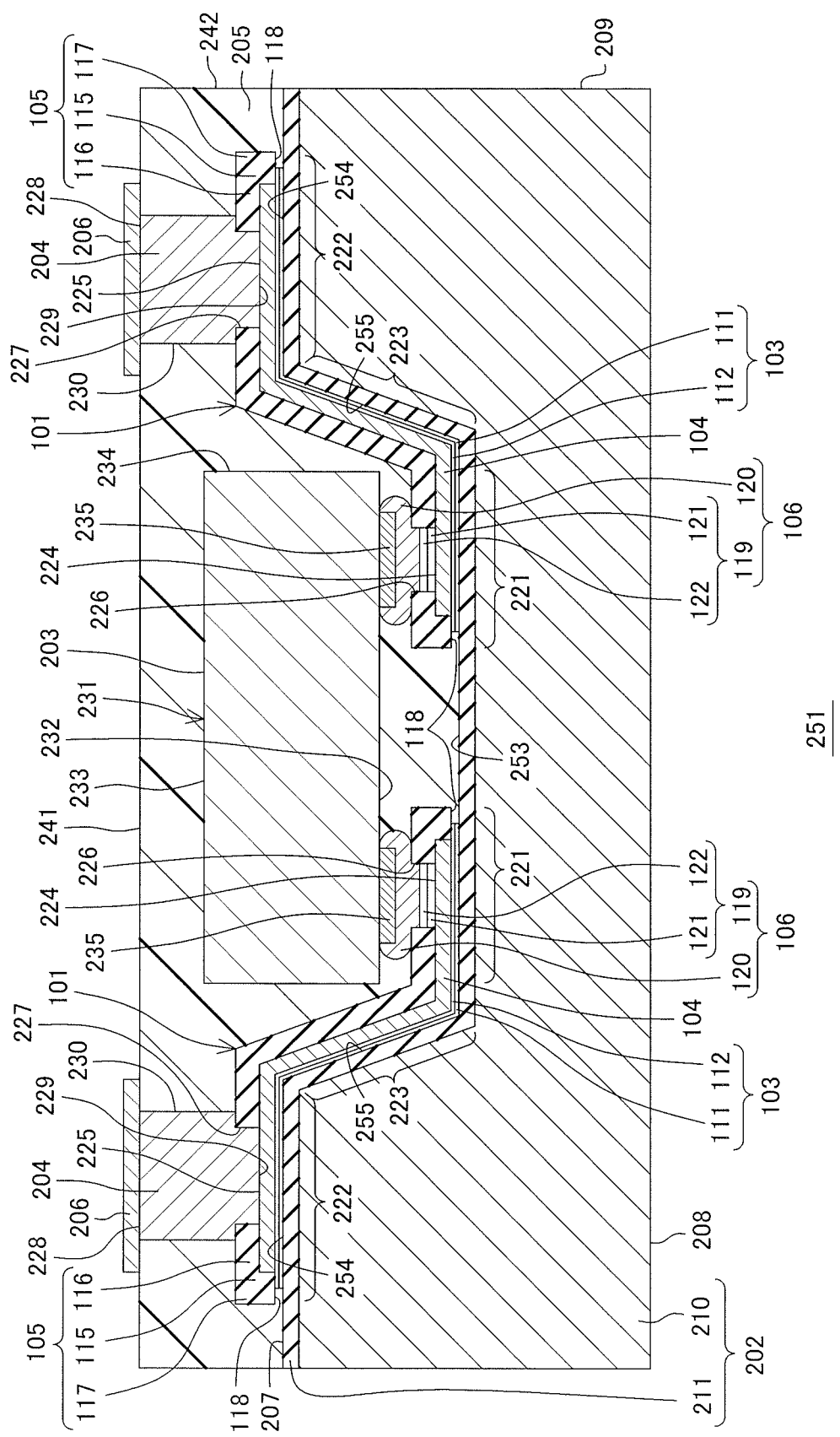
FIG. 33 is a cross-sectional view which is taken along line XXXIII-XXXIII shown in FIG. 32.

FIG. 32 is a plan view which shows an electronic component 251 according to the twelfth preferred embodiment of the present invention. FIG. 33 is a cross-sectional view which is taken along line XXXIII-XXXIII shown in FIG. 32. In the following, structures corresponding to the structures in the electronic component 201 (refer to FIG. 30 and FIG. 31) will be given the same reference signs, and a description thereof is omitted.

With reference to FIG. 32 and FIG. 33, there is formed a recess portion 252 which is recessed toward the side of a second major surface 208 on a first major surface 207 of an interposer 202. The second major surface 208 of the interposer 202 is formed to be flat.

The recess portion 252 is formed at a center portion of the first major surface 207 to be spaced inwardly from a side surface 209 of the interposer 202 in plan view. The recess portion 252 is formed in a quadrangle shape which has four sides substantially parallel to the respective four sides of the interposer 202 in plan view.

The recess portion 252 is not limited to be formed in a quadrangle shape but may be formed in any given planar shape. The recess portion 252 may be formed in a triangular shape, a hexagonal shape, a circular shape or an elliptical shape in plan view. The recess portion 252 may be communicatively connected to the side surface 209 of the interposer 202.

In the first major surface 207, there is formed a low region 253, a high region 254 and a connection portion 255 by the recess portion 252. The low region 253 is made up of a bottom portion of the recess portion 252. The high region 254 is made up of a region around the recess portion 252. The connection portion 255 connects the low region 253 and the high region 254.

The low region 253 is formed in a quadrangle shape having four sides substantially parallel to the respective four sides of the interposer 202 in plan view. The high region 254 is formed in an endless shape (quadrangular annular shape) which surrounds the recess portion 252 in plan view. The connection portion 255 has an inclined surface which is inclined downward from the high region 254 to the low region 253.

That is, the recess portion 252 is formed in a tapered shape in which an opening is reduced in width from the high region 254 to the low region 253 in a cross-sectional view. The previously described chip region 212 is formed at the low region 253. The previously described outer region 213 is formed at the high region 254.

A first pad region 221 of each of the wiring structure bodies 101 is formed at the low region 253. A second pad region 222 of each of the wiring structure bodies 101 is formed at the high region 254. A wiring region 223 of each of the wiring structure bodies 101 is drawn around in a line shape at a region between the low region 253 and the high region 254 so as to cross the connection portion 255.

In the preferred embodiment, an insulation layer 105 (protruding portion 117) of each of the wiring structure bodies 101 faces the low region 253, the high region 254 and the connection portion 255 in a normal direction of the first major surface 207 at a region outside a base electrode layer 103.

A chip component 203 is disposed inside the recess portion 252. The chip component 203 is disposed over the low region 253 in a posture that a mounting surface 232 faces the low region 253. A chip terminal electrode 235 of the chip component 203 is bonded to the first pad region 221 of a wiring layer 104 through a corresponding bump structure 106 (electroconductive bonding material 120).

The mounting surface 232 of the chip component 203 is positioned at a region between the low region 253 and the high region 254. A non-mounting surface 233 of the chip component 203 may protrude above the high region 254. The non-mounting surface 233 may be positioned at a region between the low region 253 and the high region 254.

The mounting surface 232 and the non-mounting surface 233 have an area which is less than an area of the low region 253 in plan view. The entirety of the mounting surface 232 faces the low region 253. That is, the chip component 203 is positioned at a region surrounded by a peripheral edge of the low region 253.

The mounting surface 232 and the non-mounting surface 233 may have an area that exceeds an area of the low region 253 in plan view. In this case, the mounting surface 232 may face a portion of the low region 253 and a portion of the connection portion 255.

In the preferred embodiment, the sealing insulation layer 205 fills the recess portion 252, thereby sealing the wiring structure body 101, the chip component 203 and the electrode body 204. The sealing insulation layer 205 seals a space 118 at regions inside and outside the recess portion 252.

As described so far, the electronic component 251 is also able to provide substantially the same technical effects as those described in the electronic component 201.

Figure 34:
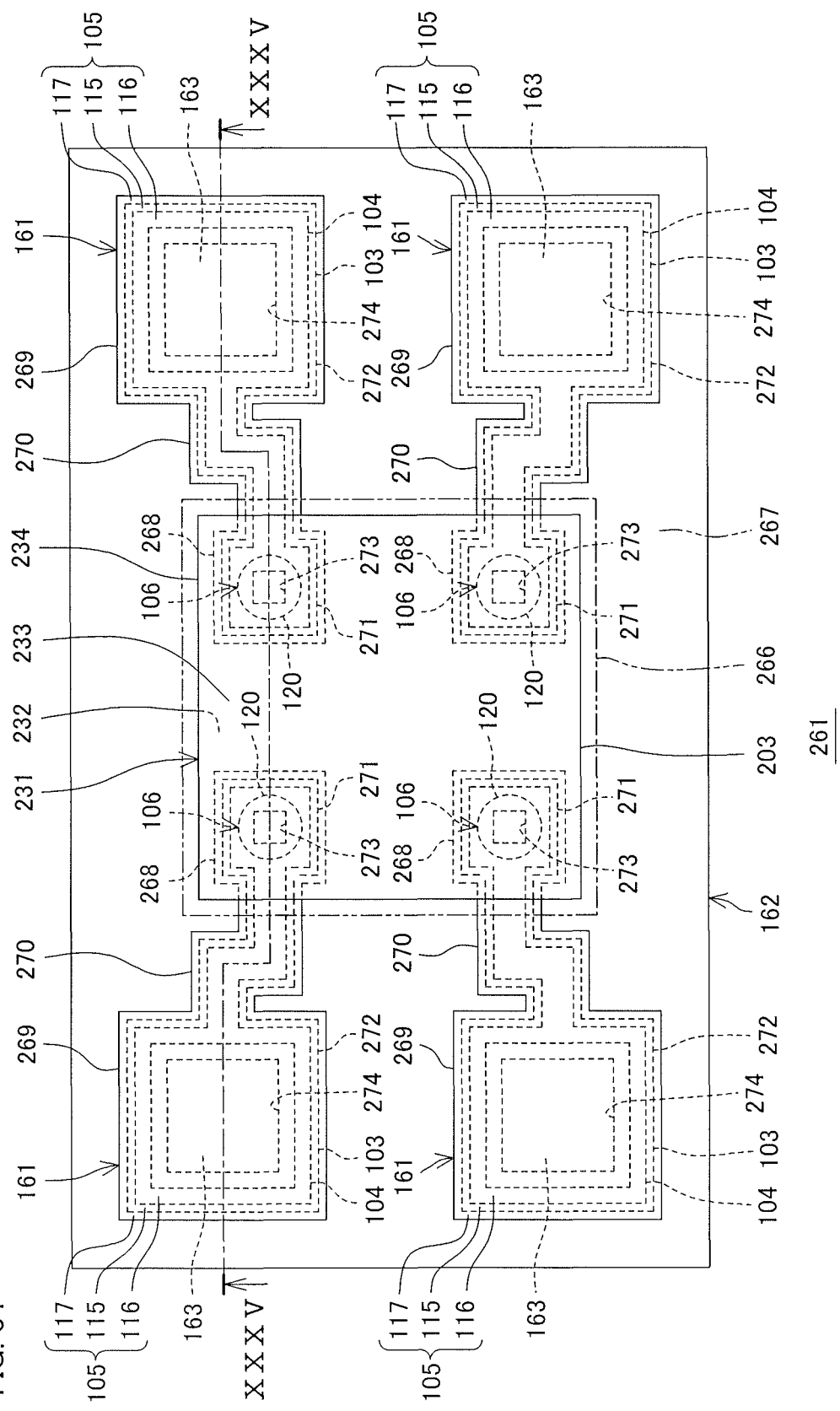
FIG. 34 is a plan view which shows an electronic component according to a thirteenth preferred embodiment of the present invention.
Figure 35:
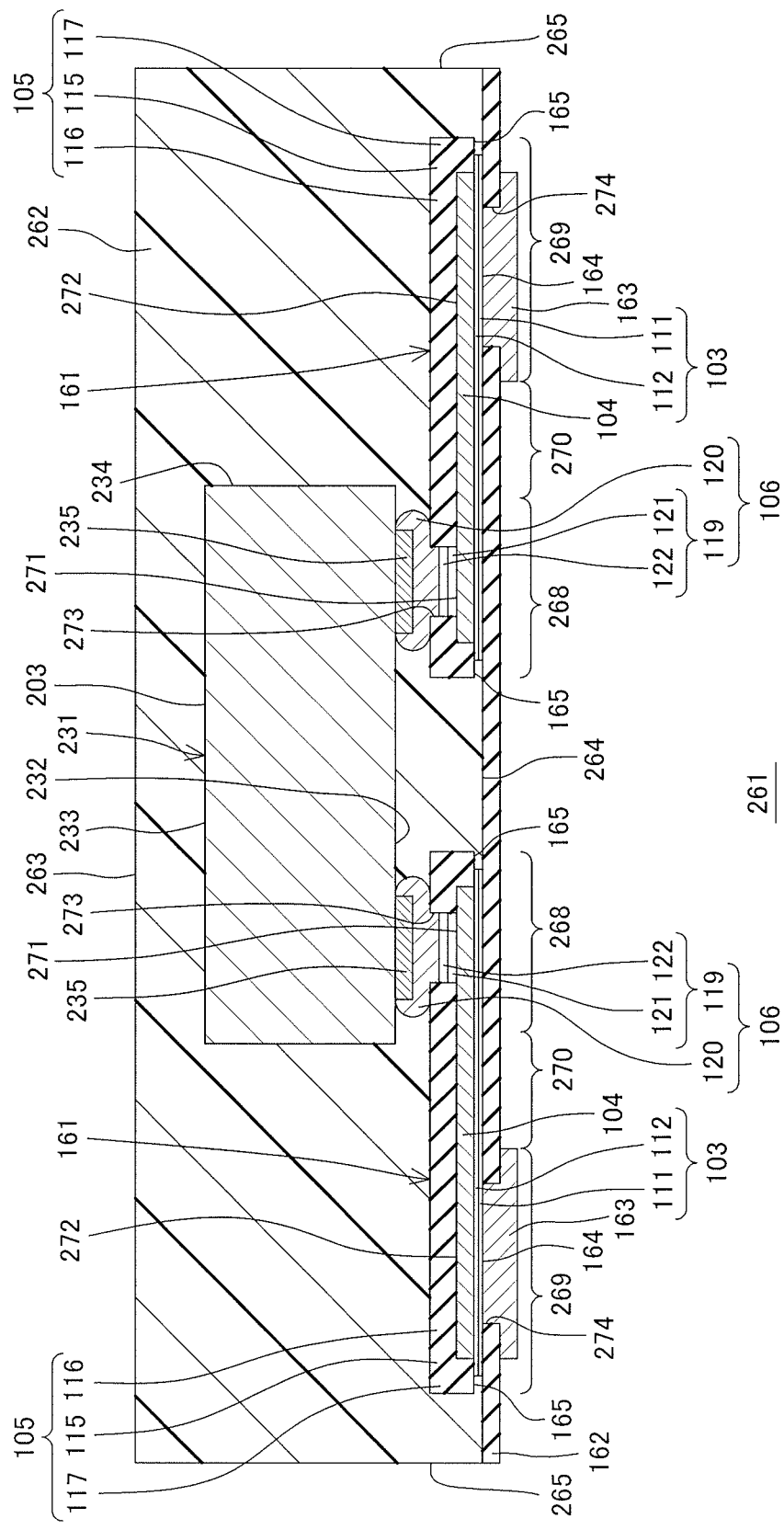
FIG. 35 is a cross-sectional view which is taken along line XXXV-XXXV shown in FIG. 34.

FIG. 34 is a plan view which shows an electronic component 261 according to the thirteenth preferred embodiment of the present invention. FIG. 35 is a cross-sectional view taken along line XXXV-XXXV shown in FIG. 34. The electronic component 261 is a component in which the previously described wiring structure body 161 (refer to FIG. 23 and FIG. 24) is incorporated. In the following, structures corresponding to the structures in the wiring structure body 161 will be given the same reference signs, and some of descriptions including those on dimensions, etc., of each structure of the wiring structure body 161 will be omitted.

The electronic component 261 includes a sealing insulation layer 262, a plurality of wiring structure bodies 161, a chip component 203, a base insulation layer 162 and a plurality of terminal electrode layers 163. Each of the wiring structure bodies 161 includes a portion of the sealing insulation layer 262, a base electrode layer 103, a wiring layer 104, an insulation layer 105, a bump structure 106, the base insulation layer 162 and the terminal electrode layer 163.

The sealing insulation layer 262 seals the wiring structure body 161 and the chip component 203. The sealing insulation layer 262 has a first sealing major surface 263 on one side, a second sealing major surface 264 on the other side and a sealing side surface 265 which connects the first sealing major surface 263 and the second sealing major surface 264.

The first sealing major surface 263 and the second sealing major surface 264 are formed in a quadrangle shape (more specifically, in a rectangular shape) in plan view taken from their normal directions. The sealing side surface 265 extends along a normal direction of the first sealing major surface 263. The first sealing major surface 263 may be a ground surface. The sealing side surface 265 may be a ground surface. The second sealing major surface 264 is not a ground surface.

A chip region 266 and an outer region 267 are set inside the sealing insulation layer 262. The chip region 266 is a region at which the chip component 203 is disposed. The chip region 266 is set at a center portion of the sealing insulation layer 262 to be spaced from the sealing side surface 265 in plan view. The chip region 266 is set in a quadrangle shape in plan view. The outer region 267 is a region outside the chip region 266. The outer region 267 is set in an endless shape (quadrangular annular shape) which surrounds the chip region 266 in plan view.

The plurality of wiring structure bodies 161 (four in the preferred embodiment) are disposed to be spaced from each other inside the sealing insulation layer 262. The plurality of wiring structure bodies 161 are each formed so as to extend over the chip region 266 and the outer region 267. The plurality of wiring structure bodies 161 each include a first pad region 268, a second pad region 269, and a wiring region 270.

The first pad region 268 of each of the wiring structure bodies 161 is formed at the chip region 266. Each of the first pad regions 268 is connected to the chip component 203. In the preferred embodiment, the first pad regions 268 are each formed in a quadrangle shape in plan view. The first pad regions 268 are not limited to be each formed in a quadrangle shape but may be each formed in any given planar shape.

The second pad region 269 of each of the wiring structure bodies 161 is formed at the outer region 267. The terminal electrode layer 163 is connected to each second pad region 269. In the preferred embodiment, the second pad regions 269 are each formed in a quadrangle shape in plan view. The second pad regions 269 are not limited to be each formed in a quadrangle shape but may be each formed in any given planar shape including.

The wiring region 270 of each of the wiring structure bodies 161 connects the first pad region 268 and the second pad region 269 which correspond thereto. In the preferred embodiment, the wiring regions 270 are each drawn around in a line shape at a region between the first pad region 268 and the second pad region 269 which correspond thereto. The wiring regions 270 may be each drawn around in any mode.

The base electrode layer 103 of each of the wiring structure bodies 161 has a planar shape corresponding to the first pad region 268, the second pad region 269 and the wiring region 270. The base electrode layer 103 has a stacked-layer structure which includes a first electrode layer 111 and a second electrode layer 112 stacked in this order from the second sealing major surface 264-side of the sealing insulation layer 262.

A side surface of the second electrode layer 112 may be formed so as to be flush with a side surface of the first electrode layer 111. The side surface of the second electrode layer 112 may protrude outside in relation to the side surface of the first electrode layer 111. The side surface of the second electrode layer 112 may be formed inside in relation to the side surface of the first electrode layer 111.

An electrode surface 164 of the base electrode layer 103 is exposed from the second sealing major surface 264. The electrode surface 164 is formed so as to be flush with the second sealing major surface 264. One flat surface is formed by the electrode surface 164 and the second sealing major surface 264. The electrode surface 164 or the second sealing major surface 264 is not a ground surface.

The wiring layer 104 of each of the wiring structure bodies 161 is formed on the base electrode layer 103. The wiring layer 104 has a planar shape corresponding to the first pad region 268, the second pad region 269 and the wiring region 270. The wiring layer 104 is formed to be spaced inwardly from a peripheral edge portion of the base electrode layer 103, so as to expose the peripheral edge portion of the base electrode layer 103.

The wiring layer 104 includes a first pad portion 271 (connection portion) and a second pad portion 272. The first pad portion 271 is formed at the first pad region 268. The second pad portion 272 is formed at the second pad region 269.

The insulation layer 105 of each of the wiring structure bodies 161 is formed on the base electrode layer 103. The insulation layer 105 has a planar shape corresponding to the first pad region 268, the second pad region 269 and the wiring region 270. The insulation layer 105 covers the wiring layer 104 so as to expose the first pad portion 271. Thereby, a pad opening 273 is formed in the insulation layer 105.

The insulation layer 105 protrudes to a region outside the base electrode layer 103 from above the peripheral edge portion of the base electrode layer 103. The insulation layer 105 protrudes in a transverse direction of a major surface of the base electrode layer 103. More specifically, the insulation layer 105 includes a base portion 115, a covering portion 116 and a protruding portion 117.

The base portion 115 is formed on the peripheral edge portion of the base electrode layer 103. The covering portion 116 extends from the base portion 115 toward above the wiring layer 104 and demarcates the pad opening 273. The protruding portion 117 extends from the base portion 115 in a direction opposite to the wiring layer 104. The protruding portion 117 extends in the transverse direction along the major surface of the base electrode layer 103 and protrudes to a region outside the base electrode layer 103. The protruding portion 117 forms a step portion 165 between itself and a side surface of the base electrode layer 103.

The bump structure 106 of each of the wiring structure bodies 161 is formed on the first pad portion 271 of the corresponding wiring layer 104. The bump structure 106 includes a UBM layer 119 and an electroconductive bonding material 120 stacked in this order from the side of the wiring layer 104.

The UBM layer 119 is formed inside the pad opening 273 of the insulation layer 105. The UBM layer 119 includes a first electrode layer 121 and a second electrode layer 122 stacked in this order from the side of the wiring layer 104. The electroconductive bonding material 120 may include a portion positioned inside the pad opening 273 and a portion outside the pad opening 273. The electroconductive bonding material 120 may cover a major surface of the insulation layer 105 outside the pad opening 273.

The chip component 203 is disposed at the chip region 266 inside the sealing insulation layer 262. The chip component 203 is connected to each of the wiring structure bodies 161 in a posture that the mounting surface 232 faces the second sealing major surface 264. The chip terminal electrode 235 of the chip component 203 is bonded to the first pad region 268 of the wiring layer 104 through the corresponding bump structure 106 (electroconductive bonding material 120).

The sealing insulation layer 262 covers a step portion 165 and seals the wiring structure body 161 and the chip component 203 so as to expose the electrode surface 164 of the base electrode layer 103. A portion which covers the step portion 165 in the sealing insulation layer 262 forms a stopper portion which prevents the insulation layer 105 from falling off from the sealing insulation layer 262.

The base insulation layer 162 covers the plurality of electrode surfaces 164. The base insulation layer 162 further covers the second sealing major surface 264. More specifically, the base insulation layer 162 collectively covers flat surfaces which are formed by the plurality of electrode surfaces 164 and the second sealing major surface 264. The base insulation layer 162 faces the protruding portion 117 of the insulation layer 105 with the sealing insulation layer 262 (stopper portion) interposed therebetween. It is, thereby, possible to appropriately prevent the insulation layer 105 from falling off.

In the base insulation layer 162, there are formed a plurality of lower pad openings 274 (four in the preferred embodiment) which expose the electrode surface 164 of the base electrode layer 103. The plurality of lower pad openings 274 expose any given region of the corresponding electrode surface 164 as a pad portion.

More specifically, the lower pad opening 274 is formed at a region which does not overlap with the bump structure 106 in plan view. Still more specifically, the lower pad opening 274 is formed in the corresponding second pad region 269. That is, the lower pad opening 274 exposes the electrode surface 164 at the corresponding second pad region 269.

The plurality of terminal electrode layers 163 (four in the preferred embodiment) penetrate through the base insulation layer 162 and are connected to the electrode surface 164 of the corresponding base electrode layer 103. More specifically, the plurality of terminal electrode layers 163 are formed inside the corresponding lower pad openings 274. That is, the plurality of terminal electrode layers 163 are formed at a region which does not overlap with the bump structure 106 in plan view.

The plurality of terminal electrode layer 163 are electrically connected to the second pad portions 272 of the wiring layer 104 through the corresponding base electrode layer 103. The plurality of terminal electrode layers 163 are formed as external terminal electrodes which are to be connected externally.

The plurality of terminal electrode layers 163 protrude from a major surface of the base insulation layer 162 in a direction opposite to the base electrode layer 103. The plurality of terminal electrode layers 163 may have an overlap portion which covers the major surface of the base insulation layer 162. The plurality of terminal electrode layers 163 may have a stacked-layer structure including an Ni layer, a Pd layer and an Au layer formed in this order from the side of the base electrode layer 103.

As described so far, the electronic component 261 is also able to provide substantially the same technical effects as those described in the electronic component 201.

Figure 36:
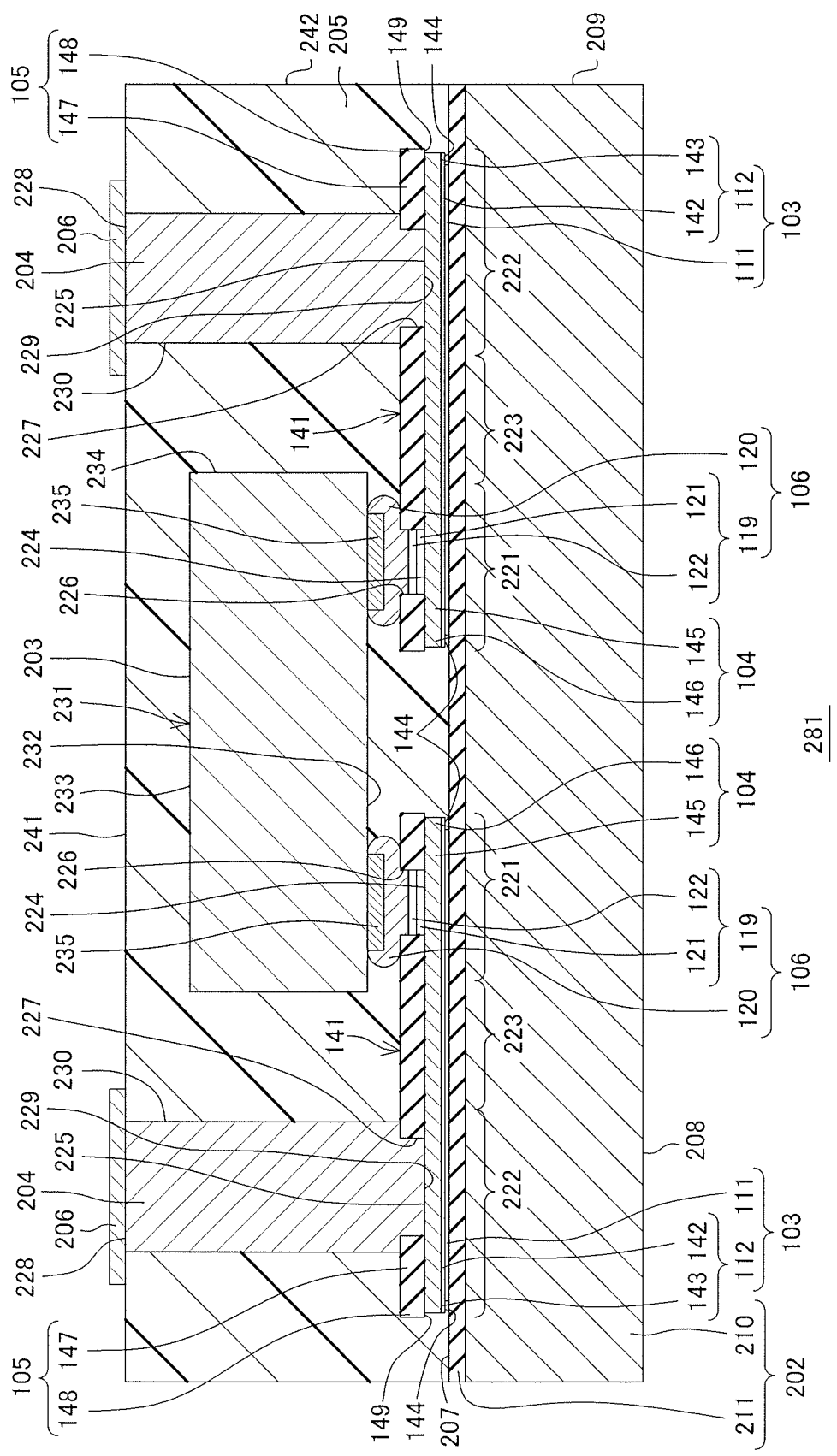
FIG. 36 is a cross-sectional view of a region corresponding to that shown in FIG. 31 and is a cross-sectional view which shows an electronic component according to a fourteenth preferred embodiment of the present invention.

FIG. 36 is a cross-sectional view of a region corresponding to that shown in FIG. 31 and is a cross-sectional view which shows an electronic component 281 according to the fourteenth preferred embodiment of the present invention. The electronic component 281 is different from the electronic component 201 in that it includes a plurality of wiring structure bodies 141 (refer to FIG. 19 and FIG. 20) in place of the plurality of wiring structure bodies 101. In the following, structures corresponding to the structures in the electronic component 201 will be given the same reference signs, and a description thereof is omitted.

With reference to FIG. 36, in the preferred embodiment, a second electrode layer 112 of a base electrode layer 103 protrudes to a region outside a first electrode layer 111 from above the first electrode layer 111. The second electrode layer 112 protrudes in a transverse direction along a major surface of the first electrode layer 111. The second electrode layer 112 faces a first major surface 207 in a normal direction of the first major surface 207 at the region outside the first electrode layer 111.

More specifically, the second electrode layer 112 includes an electrode base portion 142 and an electrode protruding portion 143. The electrode base portion 142 covers the first electrode layer 111. The electrode protruding portion 143 extends from the electrode base portion 142 to a side opposite to the first electrode layer 111.

The electrode protruding portion 143 extends in the transverse direction along the major surface of the first electrode layer 111 and protrudes to the region outside the first electrode layer 111. The electrode protruding portion 143 faces the first major surface 207 in the normal direction of the first major surface 207 at the region outside the first electrode layer 111. The electrode protruding portion 143 defines a first space 144 together with the first major surface 207 and a side surface of the first electrode layer 111.

A wiring layer 104 is formed on the base electrode layer 103, covering collectively the electrode base portion 142 and the electrode protruding portion 143 of the second electrode layer 112. More specifically, the wiring layer 104 includes a wiring base portion 145 and a wiring protruding portion 146.

The wiring base portion 145 covers the electrode base portion 142 of the second electrode layer 112. The wiring protruding portion 146 covers the electrode protruding portion 143 of the second electrode layer 112. A side surface of the wiring layer 104 is connected to a side surface of the second electrode layer 112 without any difference in level.

The wiring layer 104 may protrude to a region outside the second electrode layer 112 from above the second electrode layer 112. The wiring layer 104 may protrude in a transverse direction along a major surface of the second electrode layer 112. The wiring layer 104 may face the first major surface 207 in the normal direction of the first major surface 207 at the region outside the second electrode layer 112. A step portion may be formed between the side surface of the wiring layer 104 and the side surface of the second electrode layer 112.

An insulation layer 105 is formed on the wiring layer 104. The insulation layer 105 protrudes to a region outside the wiring layer 104 from above the wiring layer 104. The insulation layer 105 protrudes in a transverse direction along a major surface of the wiring layer 104. The insulation layer 105 faces the first major surface 207 in the normal direction of the first major surface 207 at the region outside the wiring layer 104. The insulation layer 105 exposes the side surface of the wiring layer 104.

More specifically, the insulation layer 105 includes an insulating base portion 147 and an insulating protruding portion 148. The insulating base portion 147 covers the wiring base portion 145 of the wiring layer 104. The insulating protruding portion 148 covers the wiring protruding portion 146 of the wiring layer 104.

The insulating protruding portion 148 extends in the transverse direction along the major surface of the wiring layer 104 and protrudes to the region outside the wiring layer 104. The insulating protruding portion 148 faces the first major surface 207 in the normal direction of the first major surface 207 at the region outside the wiring layer 104. The insulating protruding portion 148 defines a second space 149 together with the first major surface 207 and the side surface of the wiring layer 104. The second space 149 is recessed toward the side of the wiring layer 104. The second space 149 is communicatively connected to the first space 144.

A bump structure 106 is formed inside a first pad opening 226 formed in the insulation layer 105. The first pad opening 226 exposes the wiring base portion 145 of the wiring layer 104. Thereby, the bump structure 106 is connected to the wiring base portion 145 of the wiring layer 104.

A sealing insulation layer 205 seals the wiring structure body 141, a chip component 203 and an electrode body 204 on the first major surface 207. The sealing insulation layer 205 enters into the first space 144 and the second space 149.

As described so far, the electronic component 281 is also able to provide substantially the same technical effects as those described in the electronic component 201.

Figure 37:
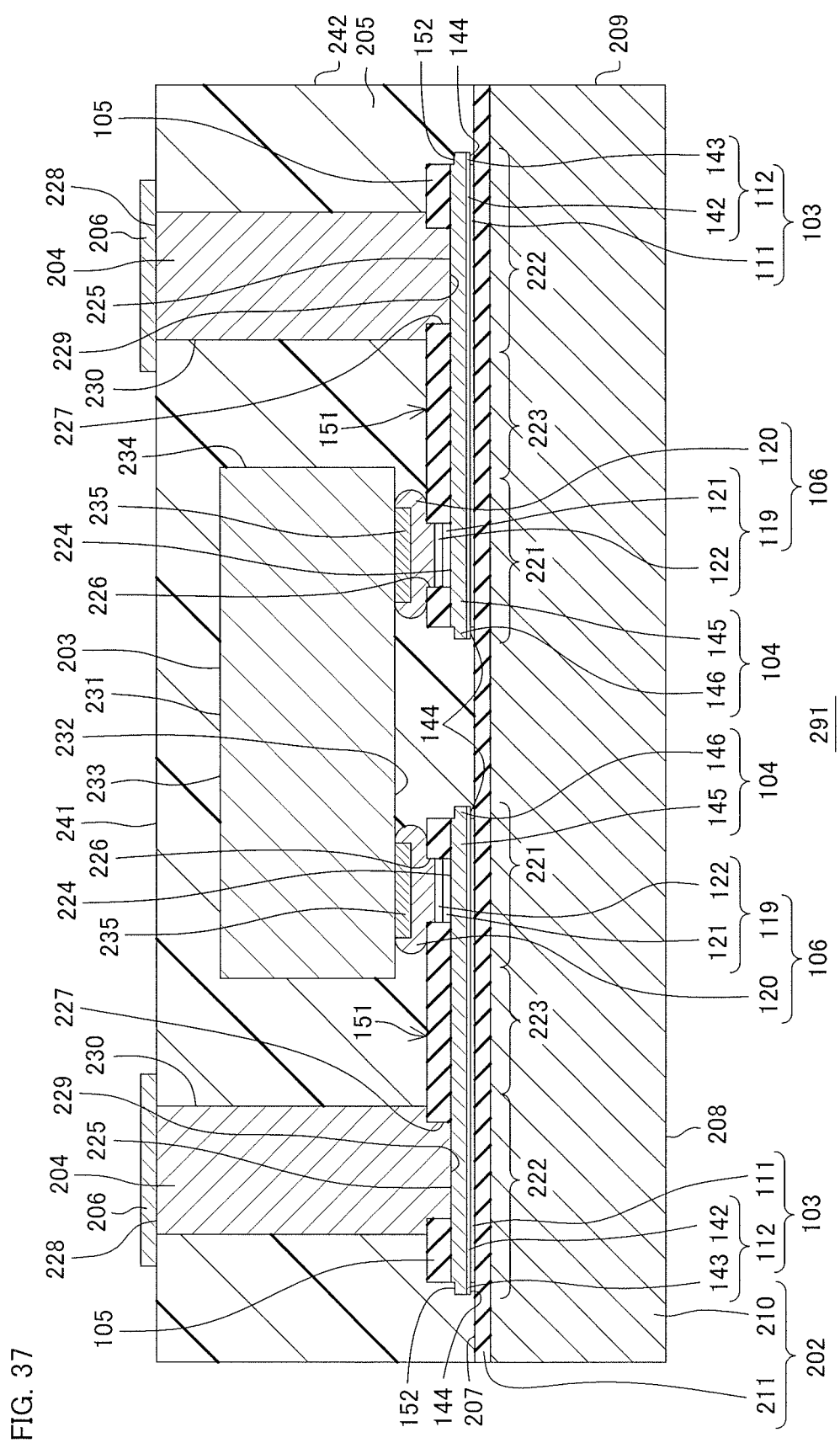
FIG. 37 is a cross-sectional view of a region corresponding to that shown in FIG. 31 and is a cross-sectional view which shows an electronic component according to a fifteenth preferred embodiment of the present invention.

FIG. 37 is a cross-sectional view of a region corresponding to that shown in FIG. 31 and is a cross-sectional view which shows an electronic component 291 according to the fifteenth preferred embodiment of the present invention. The electronic component 291 is different from the electronic component 281 in that it includes a wiring structure body 151 (refer to FIG. 22 and FIG. 23) in place of the wiring structure body 141. In the following, structures corresponding to the structures in the electronic component 281 will be given the same reference signs, and a description thereof is omitted.

With reference to FIG. 37, in the preferred embodiment, an insulation layer 105 is free of an insulating protruding portion 148. The insulation layer 105 is formed at a region further inside than a peripheral edge portion of a wiring layer 104. The insulation layer 105 covers at least a wiring base portion 145 of the wiring layer 104. The insulation layer 105 may cover a portion of a wiring protruding portion 146 of the wiring layer 104.

A recess portion 152 which is recessed toward the side of a base electrode layer 103 is formed at an exposed portion which is exposed from the insulation layer 105 on a major surface of the wiring layer 104. The recess portion 152 may be connected to a side surface of the insulation layer 105 without any difference in level.

As described so far, the electronic component 291 is also able to provide substantially the same technical effects as those described in the electronic component 201.

Figure 38:
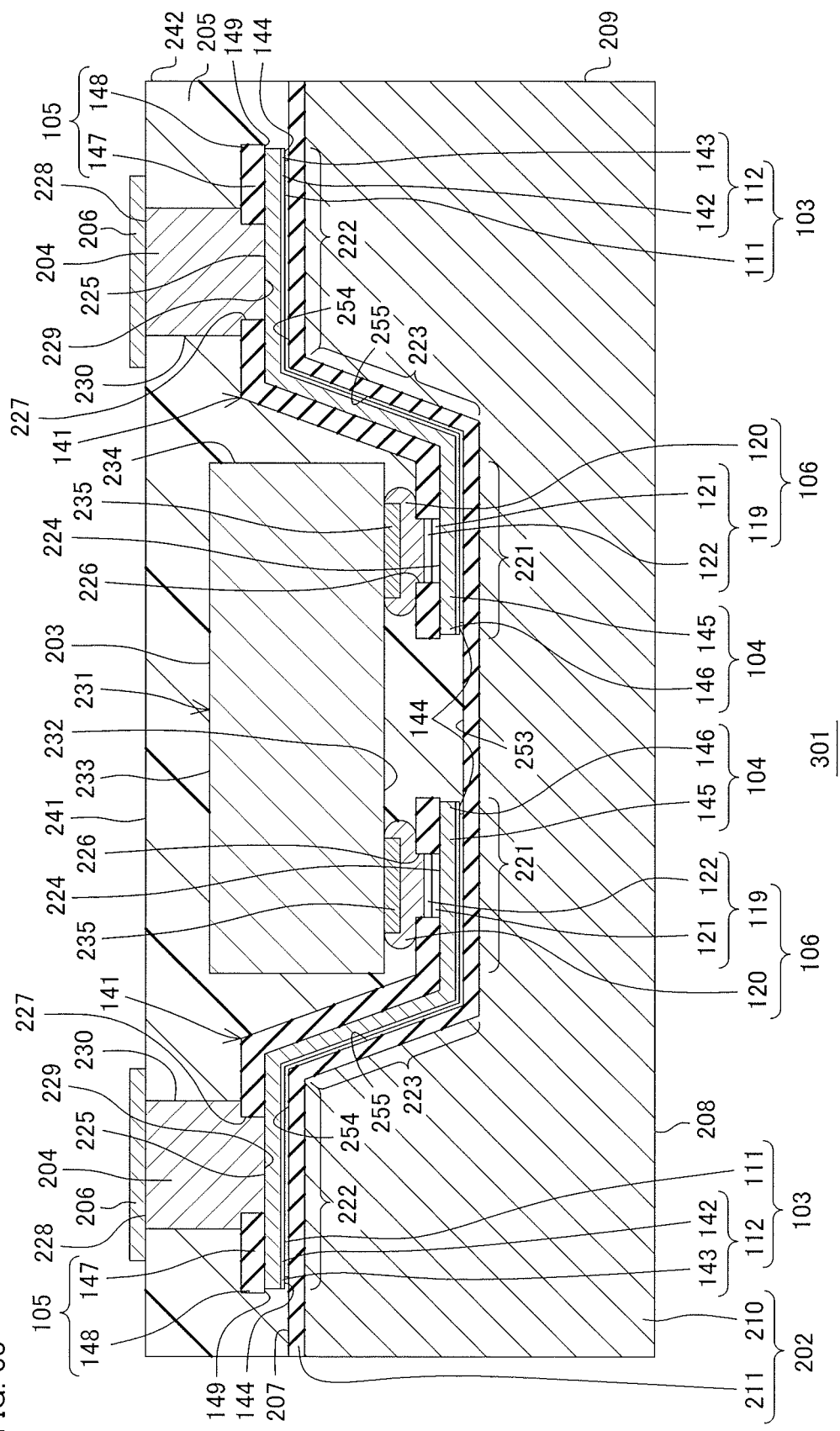
FIG. 38 is a cross-sectional view of a region corresponding to that shown in FIG. 33 and is a cross-sectional view which shows an electronic component according to a sixteenth preferred embodiment of the present invention.

FIG. 38 is a cross-sectional view of a region corresponding to that shown in FIG. 33 and is a cross-sectional view which shows an electronic component 301 according to the sixteenth preferred embodiment of the present invention. The electronic component 301 is different from the electronic component 251 in that it includes a wiring structure body 141 in place of the wiring structure body 101. In the following, structures corresponding to the structures in the electronic component 251 will be given the same reference signs, and a description thereof is omitted.

With reference to FIG. 38, in the preferred embodiment, a second electrode layer 112 of a base electrode layer 103 protrudes to a region outside a first electrode layer 111 from above the first electrode layer 111. The second electrode layer 112 protrudes in a transverse direction along a major surface of the first electrode layer 111. The second electrode layer 112 faces a first major surface 207 (a low region 253, a high region 254 and a connection portion 255) in a normal direction of the first major surface 207 at the region outside the first electrode layer 111.

More specifically, the second electrode layer 112 includes an electrode base portion 142 and an electrode protruding portion 143. The electrode base portion 142 covers the first electrode layer 111. The electrode protruding portion 143 extends from the electrode base portion 142 to a side opposite to the first electrode layer 111.

The electrode protruding portion 143 extends in the transverse direction of the major surface of the first electrode layer 111 and protrudes to the region outside the first electrode layer 111. The electrode protruding portion 143 faces the first major surface 207 (the low region 253, the high region 254 and the connection portion 255) in the normal direction of the first major surface 207 at the region outside the first electrode layer 111. The electrode protruding portion 143 defines a first space 144 together with the first major surface 207 and a side surface of the first electrode layer 111. The first space 144 is recessed toward the side of the first electrode layer 111.

A wiring layer 104 is formed on the base electrode layer 103. The wiring layer 104 covers collectively the electrode base portion 142 and the electrode protruding portion 143 of the second electrode layer 112. More specifically, the wiring layer 104 includes a wiring base portion 145 and a wiring protruding portion 146.

The wiring base portion 145 covers the electrode base portion 142 of the second electrode layer 112. The wiring protruding portion 146 covers the electrode protruding portion 143 of the second electrode layer 112. A side surface of the wiring layer 104 may be connected to a side surface of the second electrode layer 112 without any difference in level.

The wiring layer 104 may protrude to a region outside the second electrode layer 112 from above the second electrode layer 112. The wiring layer 104 may protrude in a transverse direction along a major surface of the second electrode layer 112. The wiring layer 104 may face the first major surface 207 (the low region 253, the high region 254 and the connection portion 255) in the normal direction of the first major surface 207 at the region outside the second electrode layer 112. A step portion may be formed between the side surface of the wiring layer 104 and the side surface of the second electrode layer 112.

An insulation layer 105 is formed on the wiring layer 104. The insulation layer 105 protrudes to a region outside the wiring layer 104 from above the wiring layer 104. The insulation layer 105 protrudes in a transverse direction along a major surface of the wiring layer 104. The insulation layer 105 faces the first major surface 207 (the low region 253, the high region 254 and the connection portion 255) in the normal direction of the first major surface 207 at the region outside the wiring layer 104. The insulation layer 105 exposes the side surface of the wiring layer 104.

More specifically, the insulation layer 105 includes an insulating base portion 147 and an insulating protruding portion 148. The insulating base portion 147 covers the wiring base portion 145 of the wiring layer 104. The insulating protruding portion 148 covers the wiring protruding portion 146 of the wiring layer 104.

The insulating protruding portion 148 extends in the transverse direction along the major surface of the wiring layer 104 and protrudes to the region outside the wiring layer 104. The insulating protruding portion 148 faces the first major surface 207 (the low region 253, the high region 254 and the connection portion 255) in the normal direction of the first major surface 207 at the region outside the wiring layer 104. The insulating protruding portion 148 defines a second space 149 together with the first major surface 207 and the side surface of the wiring layer 104. The second space 149 is recessed toward the side of the wiring layer 104. The second space 149 is communicatively connected to the first space 144.

A bump structure 106 is formed inside a first pad opening 226 formed on the insulation layer 105. The first pad opening 226 exposes the wiring base portion 145 of the wiring layer 104. Thereby, the bump structure 106 is connected to the wiring base portion 145 of the wiring layer 104.

A sealing insulation layer 205 fills a recess portion 252, thereby sealing the wiring structure body 141, a chip component 203 and an electrode body 204. The sealing insulation layer 205 enters into the first space 144 and the second space 149 inside and outside the recess portion 252.

As described so far, the electronic component 301 is also able to provide substantially the same technical effects as those described in the electronic component 251.

Figure 39:
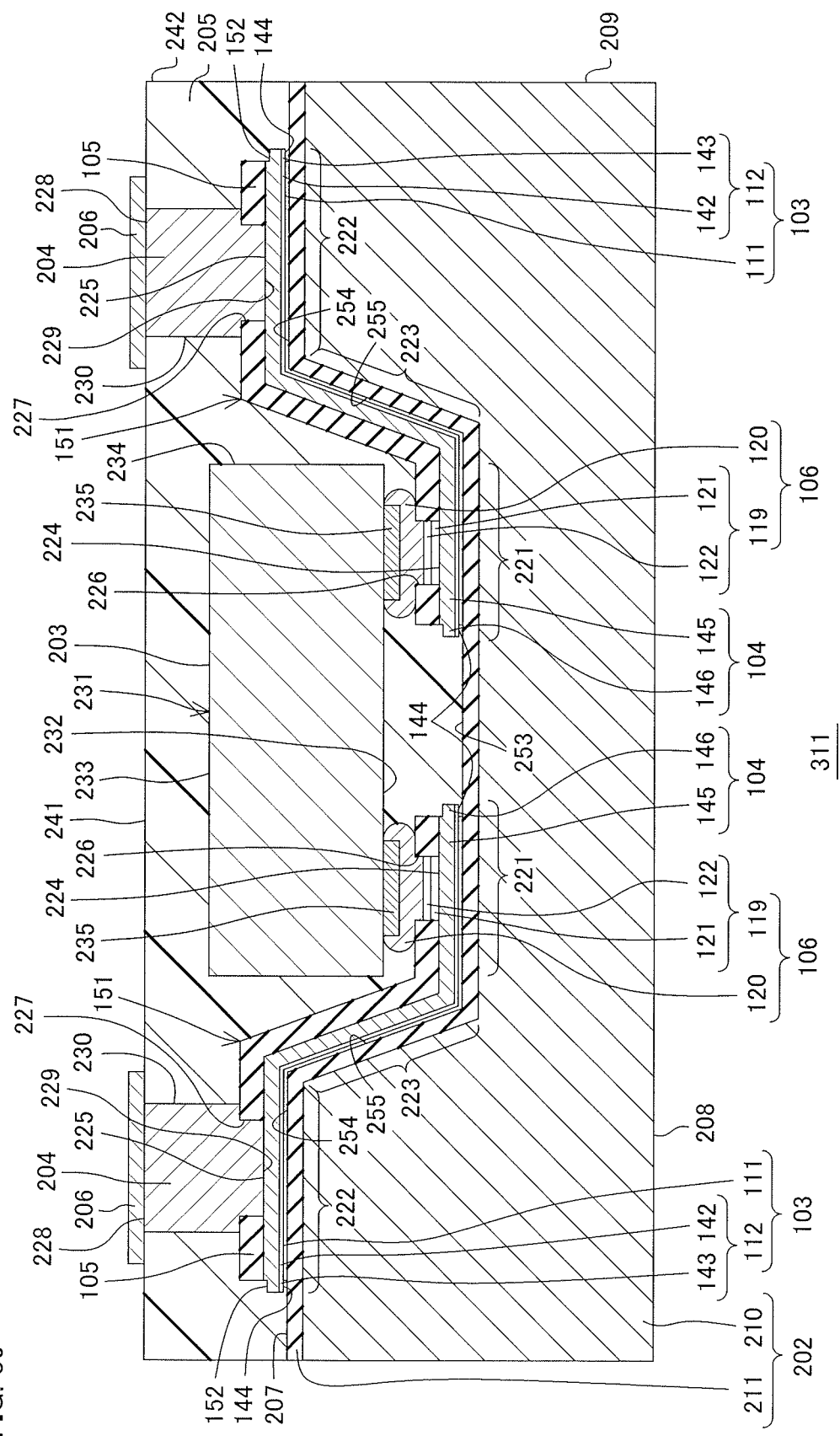
FIG. 39 is a cross-sectional view of a region corresponding to that shown in FIG. 33 and is a cross-sectional view which shows an electronic component according to a seventeenth preferred embodiment of the present invention.

FIG. 39 is a cross-sectional view of a region corresponding to that shown in FIG. 33 and is a cross-sectional view which shows an electronic component 311 according to the seventeenth preferred embodiment of the present invention. The electronic component 311 is different from the electronic component 251 in that it includes a wiring structure body 151 (refer to FIG. 22 and FIG. 23) in place of the wiring structure body 101. In the following, structures corresponding to the structures in the electronic component 251 will be given the same reference signs, and a description thereof is omitted.

In the preferred embodiment, an insulation layer 105 is free of an insulating protruding portion 148. The insulation layer 105 is formed at a region further inside than a peripheral edge portion of a wiring layer 104. The insulation layer 105 covers at least a wiring base portion 145 of the wiring layer 104. The insulation layer 105 may cover a portion of a wiring protruding portion 146 of the wiring layer 104.

There is formed a recess portion 152 which is recessed toward the side of a base electrode layer 103 at an exposed portion which is exposed from the insulation layer 105 on a major surface of the wiring layer 104. The recess portion 152 may be connected to a side surface of the insulation layer 105 without any difference in level.

As described so far, the electronic component 311 is also able to provide substantially the same technical effects as those described in the electronic component 251.

Figure 40:
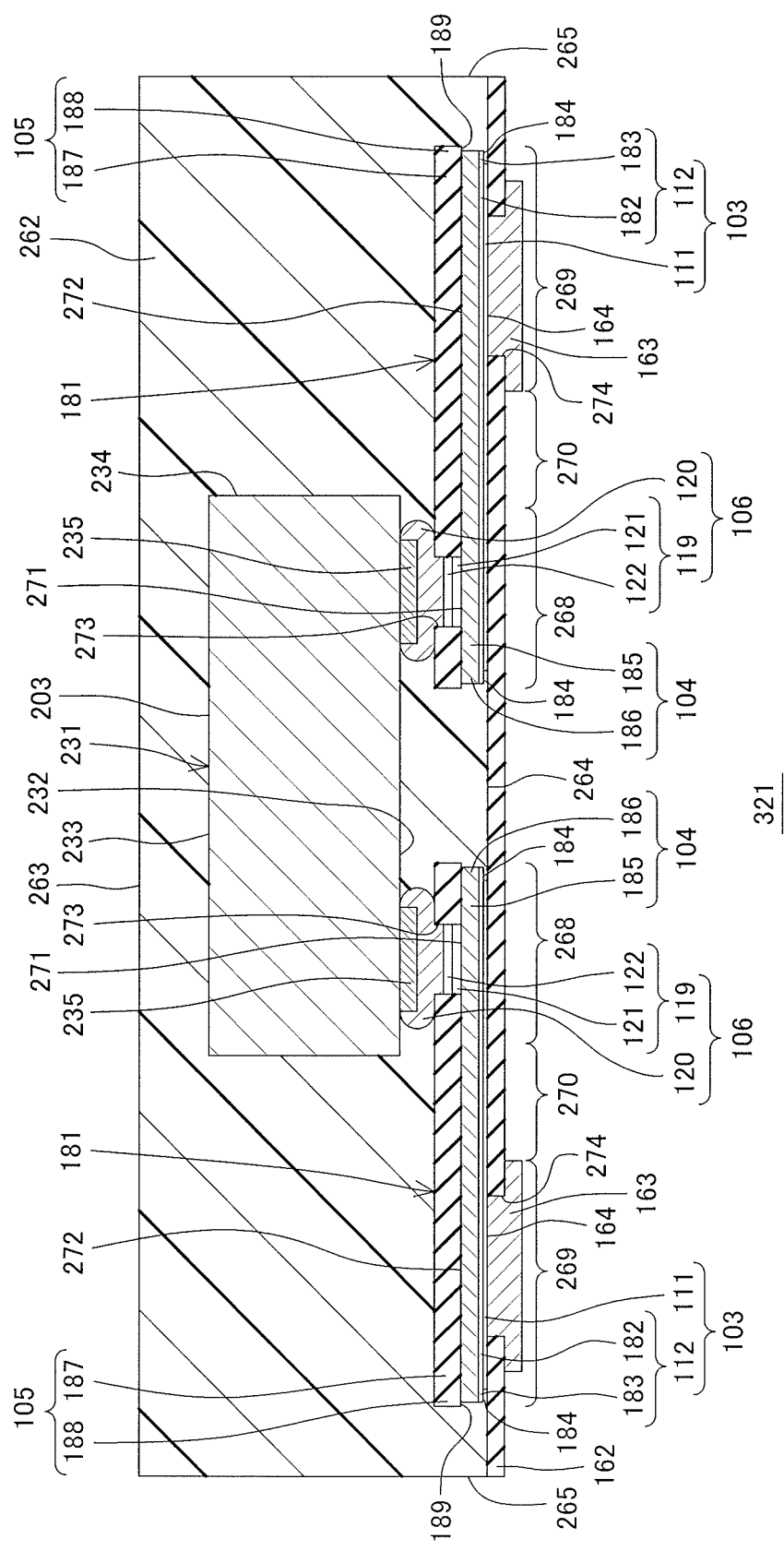
FIG. 40 is a cross-sectional view of a region corresponding to that shown in FIG. 35 and is a cross-sectional view which shows an electronic component according to an eighteenth preferred embodiment of the present invention.

FIG. 40 is a cross-sectional view of a region corresponding to that shown in FIG. 35 and is a cross-sectional view which shows an electronic component 321 according to the eighteenth preferred embodiment of the present invention. The electronic component 321 is different from the electronic component 261 in that it includes a wiring structure body 181 (refer to FIG. 26 and FIG. 27) in place of the wiring structure body 161. In the following, structures corresponding to the structures in the electronic component 261 will be given the same reference signs, and a description thereof is omitted.

With reference to FIG. 40, in the preferred embodiment, a second electrode layer 112 of a base electrode layer 103 protrudes to a region outside the base electrode layer 103 from above a first electrode layer 111. The second electrode layer 112 protrudes in a transverse direction along a major surface of the first electrode layer 111.

More specifically, the second electrode layer 112 includes an electrode base portion 182 and an electrode protruding portion 183. The electrode base portion 182 covers the first electrode layer 111. The electrode protruding portion 183 extends from the electrode base portion 182 to a side opposite to the first electrode layer 111. The electrode protruding portion 183 extends in the transverse direction along the major surface of the first electrode layer 111 and protrudes to a region outside the first electrode layer 111. The electrode protruding portion 183 forms a first step portion 184 between itself and a side surface of the first electrode layer 111.

A wiring layer 104 is formed on the base electrode layer 103. The wiring layer 104 covers collectively the electrode base portion 182 and the electrode protruding portion 183 of the second electrode layer 112. More specifically, the wiring layer 104 includes a wiring base portion 185 and a wiring protruding portion 186.

The wiring base portion 185 covers the electrode base portion 182 of the second electrode layer 112. The wiring protruding portion 186 covers the electrode protruding portion 183 of the second electrode layer 112. A side surface of the wiring layer 104 may be connected to a side surface of the second electrode layer 112 without any difference in level.

The wiring protruding portion 186 may protrude to a region outside the second electrode layer 112 from above the second electrode layer 112. The wiring protruding portion 186 may protrude in a transverse direction along a major surface of the second electrode layer 112. A step portion may be formed between the side surface of the wiring layer 104 and the side surface of the second electrode layer 112.

An insulation layer 105 is formed on the wiring layer 104. The insulation layer 105 protrudes to a region outside the wiring layer 104 from above the wiring layer 104. The insulation layer 105 protrudes in a transverse direction along a major surface of the wiring layer 104. The insulation layer 105 exposes the side surface of the wiring layer 104. More specifically, the insulation layer 105 has an insulating base portion 187 and an insulating protruding portion 188.

The insulating base portion 187 covers the wiring base portion 185 of the wiring layer 104. The insulating protruding portion 188 covers the wiring protruding portion 186 of the wiring layer 104. The insulating protruding portion 188 extends in the transverse direction along the major surface of the wiring layer 104 and protrudes to the region outside the wiring layer 104. The insulating protruding portion 188 forms a second step portion 189 between itself and the side surface of the wiring layer 104.

A sealing insulation layer 262 seals a chip component 203 and the wiring structure body 181. The sealing insulation layer 262 covers the first step portion 184 and the second step portion 189 and exposes an electrode surface 164 of the base electrode layer 103.

A portion which covers the first step portion 184 in the sealing insulation layer 262 forms a first stopper portion which prevents the wiring layer 104 from falling off from the sealing insulation layer 262. A portion which covers the second step portion 189 in the sealing insulation layer 262 forms a second stopper portion which prevents the insulation layer 105 from falling off from the sealing insulation layer 262.

A base insulation layer 162 faces the electrode protruding portion 183 of the wiring layer 104 and the insulating protruding portion 188 of the insulation layer 105 with the sealing insulation layer 262 (the first stopper portion and the second stopper portion) interposed therebetween. It is, thereby, possible to appropriately prevent the wiring layer 104 and the insulation layer 105 from falling off.

As described so far, the electronic component 321 is also able to provide substantially the same technical effects as those described in the electronic component 261.

Figure 41:
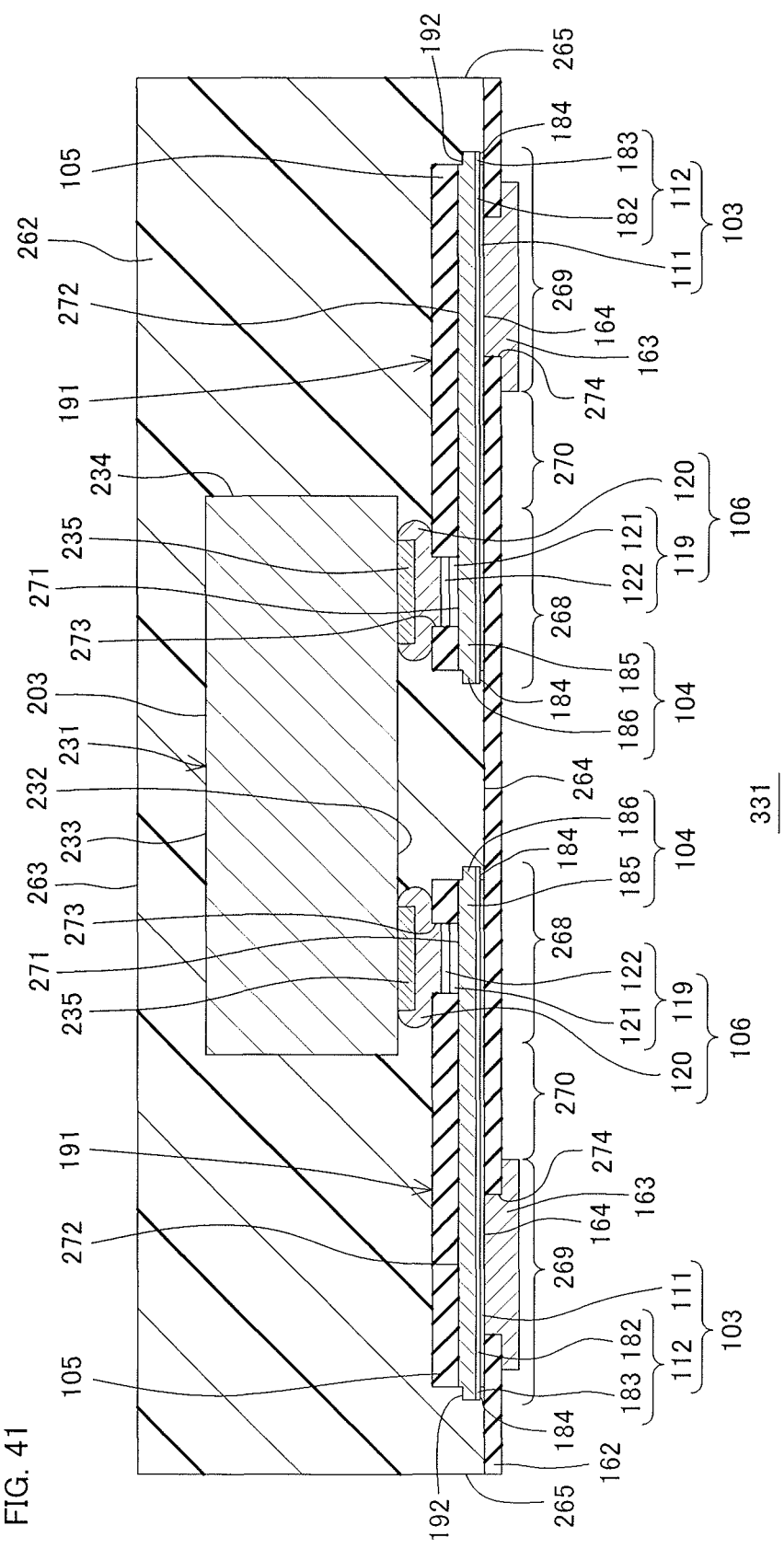
FIG. 41 is a cross-sectional view of a region corresponding to that shown in FIG. 35 and is a cross-sectional view which shows an electronic component according to a nineteenth preferred embodiment of the present invention.

FIG. 41 is a cross-sectional view of a region corresponding to that shown in FIG. 35 and is a cross-sectional view which shows an electronic component 331 according to the nineteenth preferred embodiment of the present invention. The electronic component 331 is different from the electronic component 261 in that it includes a wiring structure body 191 (refer to FIG. 29) in place of the wiring structure body 161. In the following, structures corresponding to the structures in the electronic component 261 will be given the same reference signs, and a description thereof is omitted.

With reference to FIG. 41, in the preferred embodiment, an insulation layer 105 is free of an insulating protruding portion 188. The insulation layer 105 is formed at a region further inside than a peripheral edge portion of a wiring layer 104. The insulation layer 105 covers at least a wiring base portion 185 of the wiring layer 104. The insulation layer 105 may cover a portion of a wiring protruding portion 186 of the wiring layer 104.

A recess portion 192 which is recessed toward the side of a base electrode layer 103 is formed at an exposed portion which is exposed from the insulation layer 105 on a major surface of the wiring layer 104. The recess portion 192 may be connected to a side surface of the insulation layer 105 without any difference in level.

The wiring structure body 191 is manufactured by forming the insulation layer 105 at a region further inside than the peripheral edge portion of the wiring layer 104 in the previously described step of forming the insulation layer 105 (refer to FIG. 28B). The recess portion 192 is formed by removing a portion of the wiring layer 104 in the previously described step of removing the second electrode layer 112 (refer to FIG. 28D).

As described so far, the electronic component 331 is also able to provide substantially the same technical effects as those described in the electronic component 261.

Figure 42:
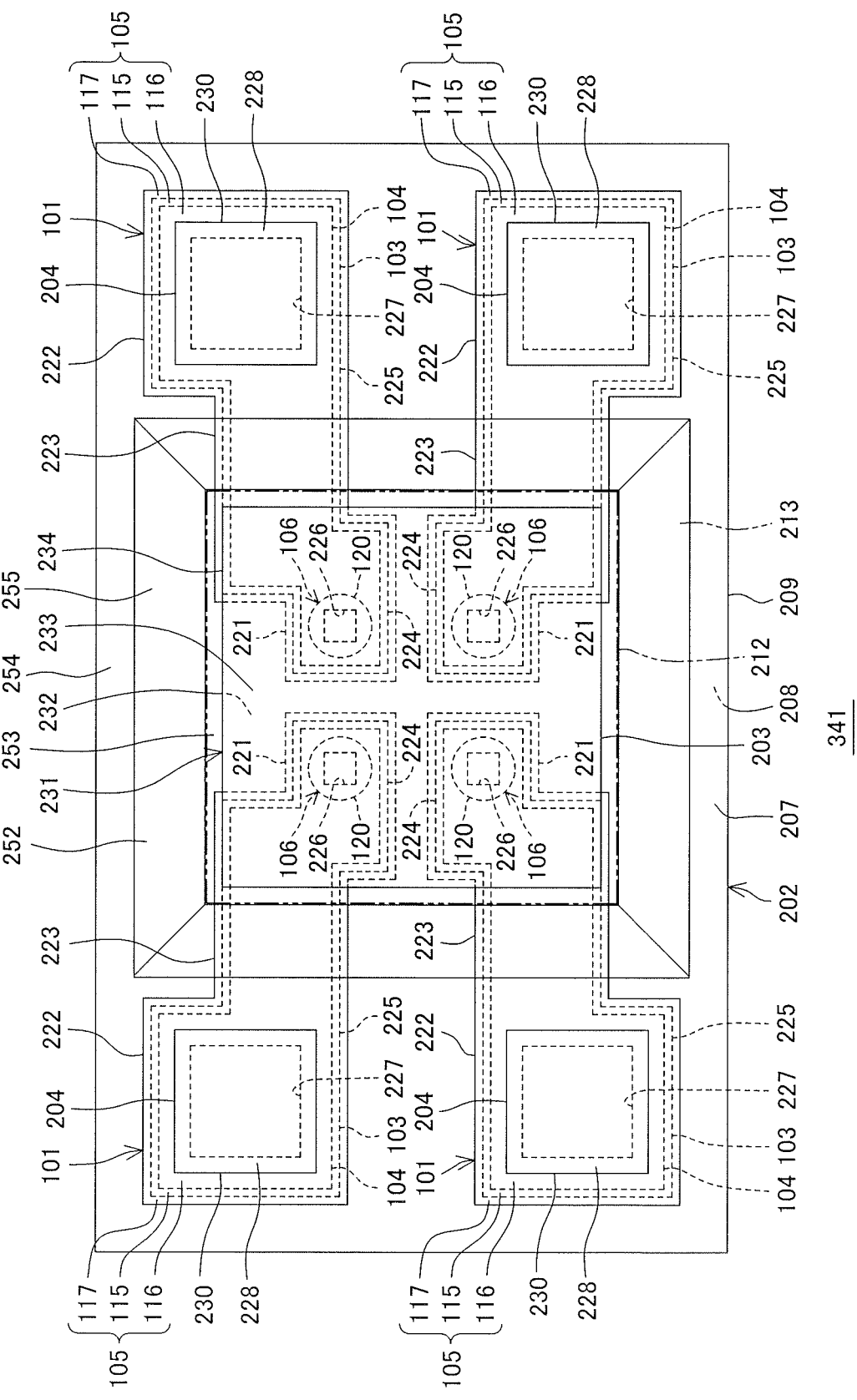
FIG. 42 is a plan view of a region corresponding to that shown in FIG. 32 and is a plan view which shows an electronic component according to a twentieth preferred embodiment of the present invention.

FIG. 42 is a plan view of a region corresponding to that shown in FIG. 32 and is a plan view which shows an electronic component 341 according to the twentieth preferred embodiment of the present invention. The electronic component 341 is different from the previously described electronic component 251 in that each of wiring structure bodies 101 includes a wiring region 223 which extends rectilinearly on an inclined surface of a connection portion 255. In the following, structures corresponding to the structures in the electronic component 251 will be given the same reference signs, and a description thereof is omitted.

With reference to FIG. 42, the wiring region 223 of each of the wiring structure bodies 101 extends rectilinearly from a high region 254 toward a low region 253 on the inclined surface of the connection portion 255. That is, the wiring region 223 of each of the wiring structure bodies 101 is free of a curve portion on the inclined surface of the connection portion 255.

As described so far, the electronic component 341 is also able to provide substantially the same technical effects as those described in the electronic component 251. The electronic component 341 also includes the wiring region 223 which extends rectilinearly on the inclined surface of the connection portion 255. According to the above-described structure, since the wiring region 223 is free of a curve portion at the connection portion 255, it is possible to appropriately form the wiring structure body 101.

That is, in the photographic exposure step of a mask 131 (refer to FIG. 18B) which is conducted during the step of forming each of the wiring structure bodies 101, since the connection portion 255 is inclined downward, a distance between alight source and the low region 253 is larger than a distance between the light source and the high region 254. Therefore, there is a possibility that a position at which the mask 131 is irradiated with light may misalign between the high region 254 and the low region 253.

In particular, where the wiring region 223 has a curve portion at the connection portion 255, due to misalignment in the irradiation position of the mask 131 with light, the curve portion of the wiring region 223 may not be appropriately formed. In order to avoid the above-described problem, the mask 131 is required to be irradiated with light under strictly controlled conditions, thus resulting in an increased difficulty in manufacture.

Therefore, in the electronic component 341, there is formed the wiring region 223 which extends rectilinearly on the inclined surface of the connection portion 255. It is, thereby, possible to minimize the influence resulting from misalignment in the irradiation position with light. As a result, it is possible to avoid the increased difficulty in manufacture.

The structure of the electronic component 341 is applicable to any and all modes in which the recess portion 252 is formed. The structure of the electronic component 341 shall not exclude a structure in which the wiring region 223 has a curve portion at the connection portion 255.

Figure 43:
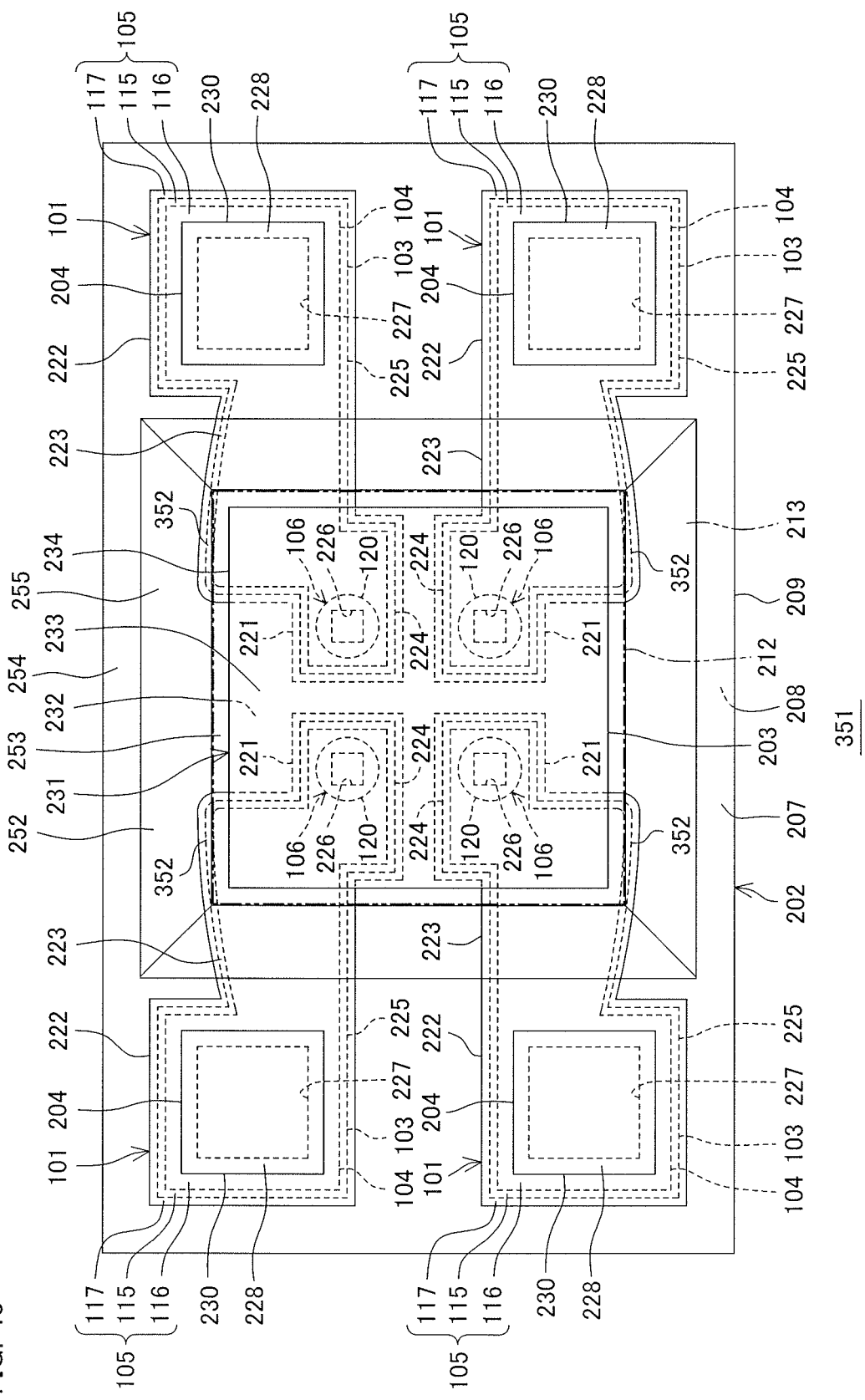
FIG. 43 is a plan view of a region corresponding to that shown in FIG. 42 and is a plan view which shows an electronic component according to a twenty-first preferred embodiment of the present invention.

FIG. 43 is a plan view of a region corresponding to that shown in FIG. 42 or a plan view which shows an electronic component 351 according to the twenty-first preferred embodiment of the present invention. The electronic component 351 is different from the previously described electronic component 341 in that it includes a wiring region 223 which is formed in a splayed shape (tapered shape) in plan view. In the following, structures corresponding to the structures in the electronic component 341 will be given the same reference signs, and a description thereof is omitted.

With reference to FIG. 43, in the preferred embodiment, the wiring region 223 of each of wiring structure bodies 101 is formed in a splayed shape (tapered shape) so that it extends rectilinearly on an inclined surface of a connection portion 255 in plan view and is also increased in width from a high region 254 to a low region 253.

The wiring region 223 of each of the wiring structure bodies 101 crosses an inclined surface which extends along one direction (short-side direction of an interposer 202) at the connection portion 255. The wiring region 223 of each of the wiring structure bodies 101 may have an overlap portion 352 which covers an inclined surface adjacent to the inclined surface at the connection portion 255 and also extends along an intersecting direction (a long-side direction of the interposer 202) that intersects the one direction.

As described so far, the electronic component 351 is also able to provide substantially the same technical effects as those described in the electronic component 341. Further, according to the wiring region 223 which is formed in a splayed shape (tapered shape), a wiring area can be increased. It is, therefore, possible to further reduce the influence resulting from misalignment in the irradiation position with light. Further, according to the wiring region 223 formed in a splayed shape (tapered shape), wiring resistance can be reduced within a limited area. The structure of the electronic component 341 is applicable to any and all modes in which the recess portion 252 is formed.

As above, a description has been given of the fifth to the twenty-first preferred embodiments of the present invention. The present invention can be carried out in still other modes.

Figure 44:
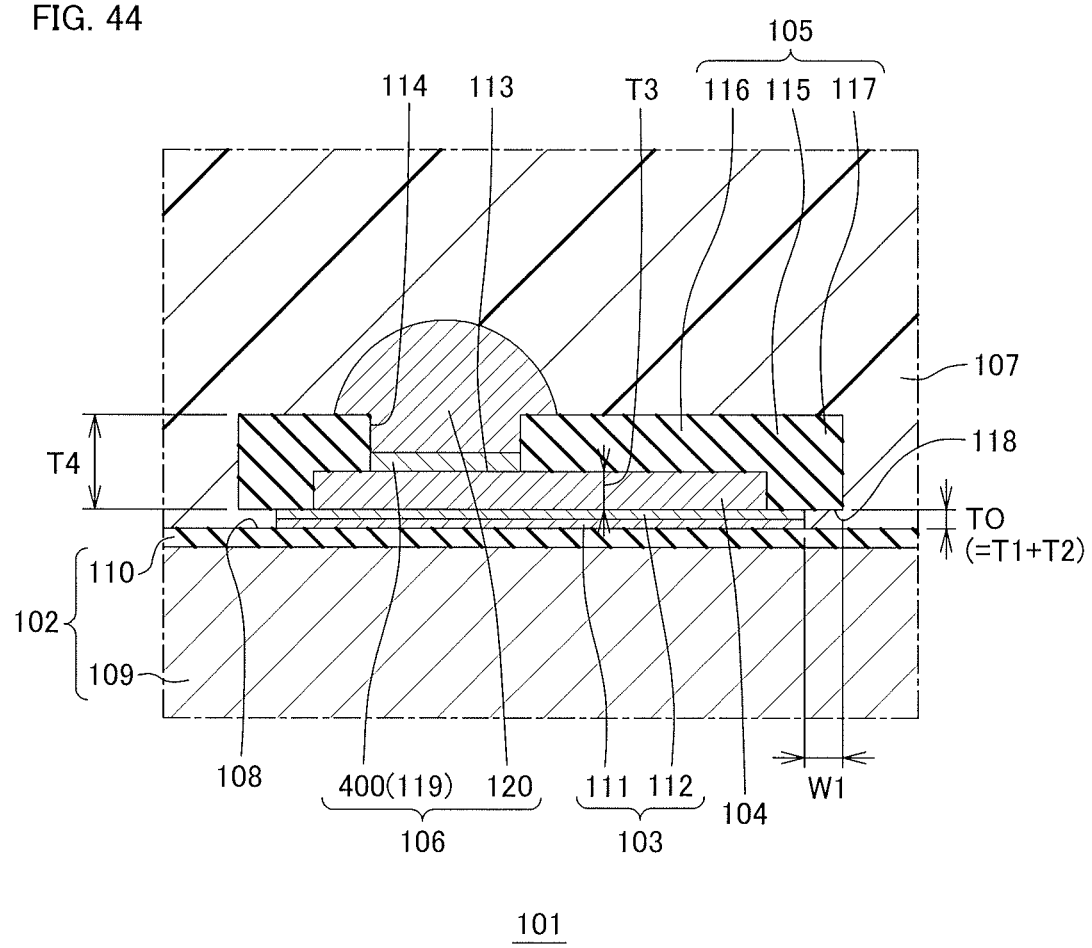
FIG. 44 is a cross-sectional view which shows a first modified example of a bump structure shown in FIG. 17.

For example, the bump structure 106 according to the previously described fifth to twenty-first preferred embodiments may have a structure shown in FIG. 44. FIG. 44 is a cross-sectional view which shows the first modified example of the bump structure 106 shown in FIG. 17. In the following, structures corresponding to the structures in the bump structure 106 shown in FIG. 17 will be given the same reference signs, and a description thereof is omitted.

With reference to FIG. 44, the bump structure 106 may include a UBM layer 119 that has a single layer structure made up of an electrode layer 400. The electrode layer 400 may include titanium. The bump structure 106 shown in FIG. 44 is applicable to all the fifth to the twenty-first preferred embodiments.

Figure 45:
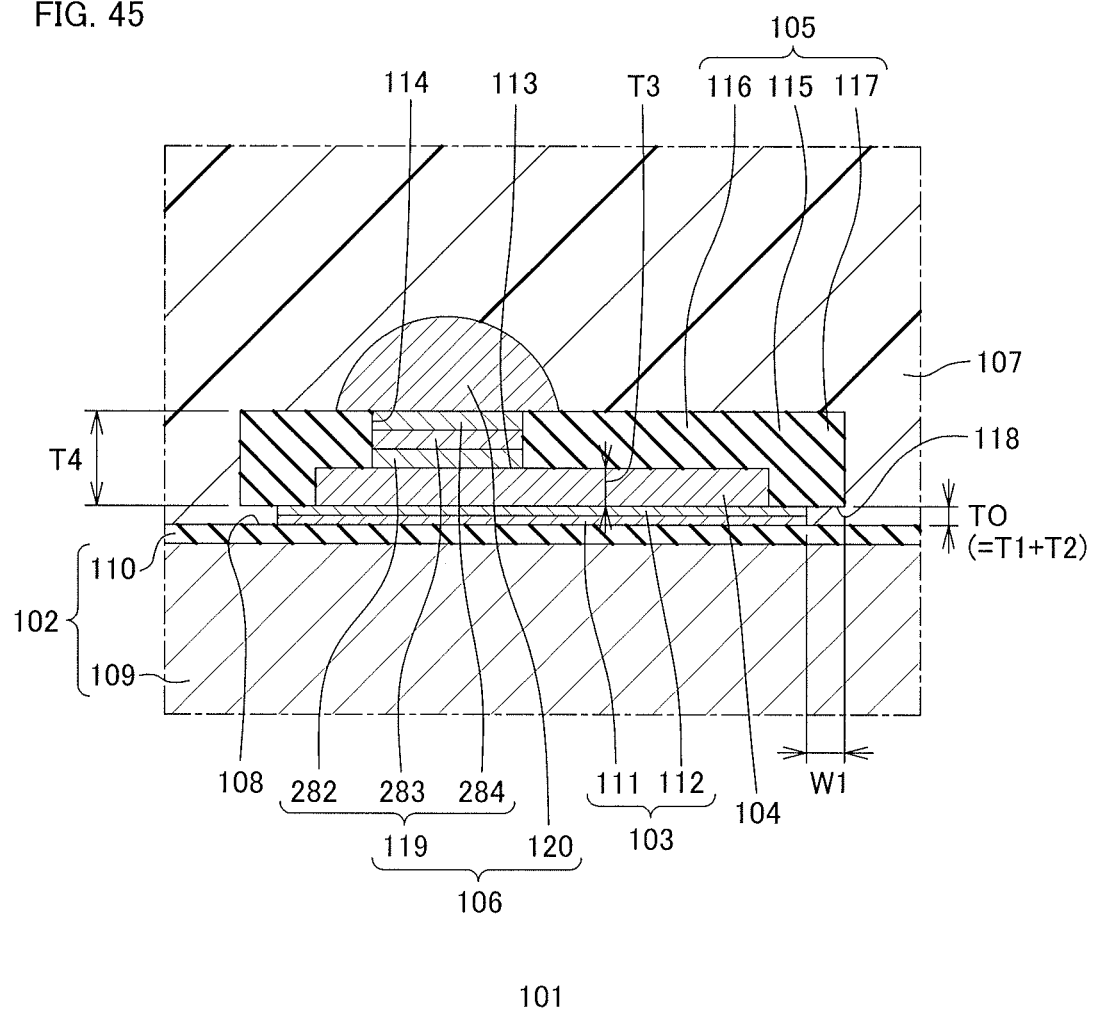
FIG. 45 is a cross-sectional view which shows a second modified example of the bump structure shown in FIG. 17.

Further, the bump structure 106 according to the previously described fifth to twenty-first preferred embodiments may have a structure shown in FIG. 45. FIG. 45 is a cross-sectional view which shows the second modified example of the bump structure 106 shown in FIG. 17. In the following, structures corresponding to the structures in the bump structure 106 shown in FIG. 17 will be given the same reference signs, and a description thereof is omitted.

With reference to FIG. 45, the bump structure 106 may include a UBM layer 119 having a stacked-layer structure which includes a first electrode layer 401, a second electrode layer 402 and a third electrode layer 403 that are stacked in this order from the side of a wiring layer 104. The first electrode layer 401 may include copper. The second electrode layer 402 may include titanium. The third electrode layer 403 may include copper. The bump structure 106 shown in FIG. 45 is applicable to all the fifth to the twenty-first preferred embodiments.

Figure 46:
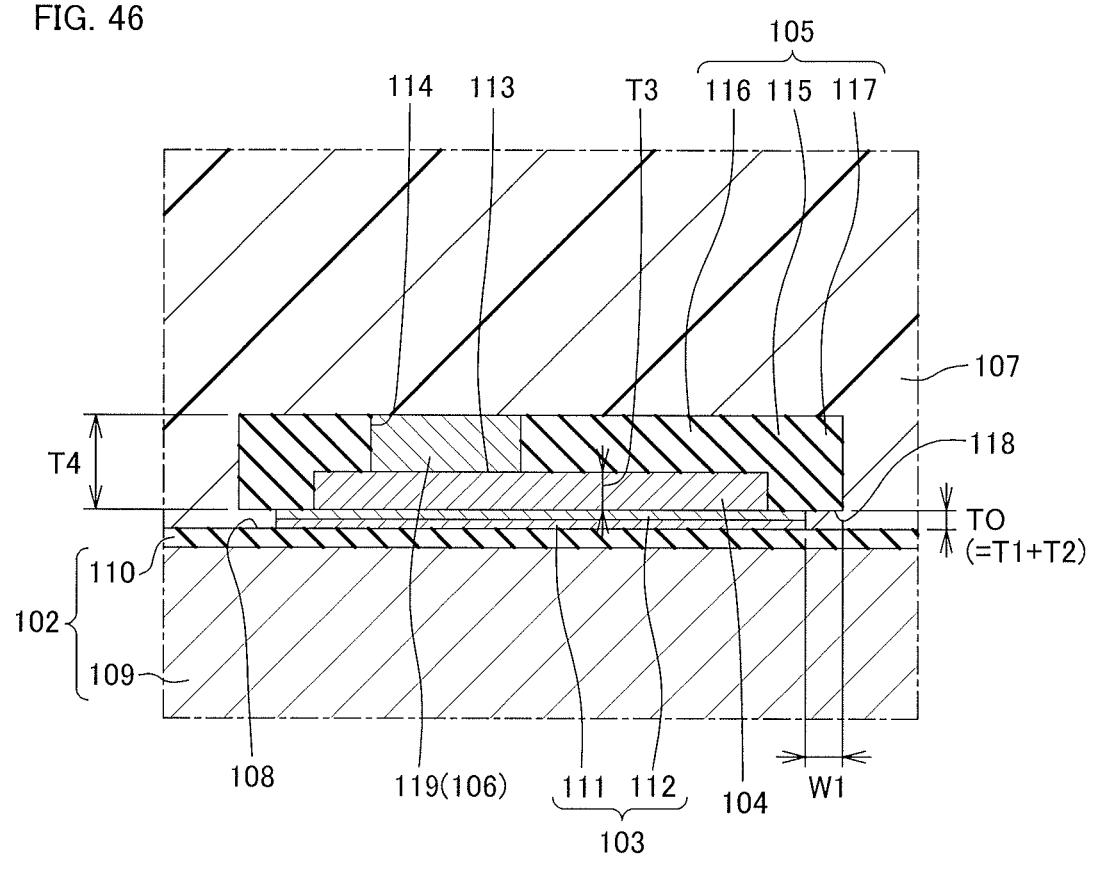
FIG. 46 is a cross-sectional view which shows a third modified example of the bump structure shown in FIG. 17.

Further, the bump structure 106 according to the previously described fifth to twenty-first preferred embodiments may have a structure shown in FIG. 46. FIG. 46 is a cross-sectional view which shows the third modified example of the bump structure 106 in FIG. 17. In the following, structures corresponding to the structures in the bump structure 106 shown in FIG. 17 will be given the same reference signs, and a description thereof is omitted.

With reference to FIG. 46, the bump structure 106 is free of an electroconductive bonding material 120 but includes only a UBM layer 119. The UBM layer 119 may have the mode shown in FIG. 17, the mode shown in FIG. 44 or the mode shown in FIG. 45. This structure is effective in a case where a chip component 203 is provided with the electroconductive bonding material 120. The bump structure 106 shown in FIG. 46 is applicable to all the fifth to the twenty-first preferred embodiments.

The present specification shall not restrict any mode of combination of the features shown in the fifth to the twenty-first preferred embodiments. The fifth to the twenty-first preferred embodiments can be combined in any given form or in any given mode among these embodiments. That is, there may be adopted such a mode that the features shown in the fifth to the twenty-first preferred embodiments are combined in any given form and in any given mode.

Hereinafter, examples of the features extracted from the fifth to the twenty-first preferred embodiments are shown.

US2014252607A1 is given as a reference example. US2014252607A1 discloses an electronic component which includes a substrate, a wiring formed on the substrate and a semiconductor chip having an electrode which is connected to the wiring through an electroconductive bonding material.

In the electronic component according to US2014252607A1, an electroconductive bonding material is formed on the wiring. Therefore, a molten electroconductive bonding material may be wetted and spread over the wiring, and the electroconductive bonding material may outflow to a region outside the wiring. The electroconductive bonding material that has outflowed to the region outside the wiring can cause an unexpected failure such as short circuit.

Thus, in the following, examples of features of a wiring structure body and those of an electronic component which can prevent an electroconductive bonding material from outflowing are shown.

[A1] A wiring structure body which includes a base electrode layer, a wiring layer which is formed on the base electrode layer so as to expose a peripheral edge portion of the base electrode layer, and an insulation layer which is formed on the peripheral edge portion of the base electrode layer so as to protrude to a region outside the base electrode layer from above the base electrode layer.

According to this wiring structure body, where an electroconductive bonding material is connected to the wiring layer, a molten electroconductive bonding material can be prevented from wetting and spreading by the insulation layer. It is, therefore, possible to prevent the electroconductive bonding material from outflowing.

[A2] The wiring structure body described in A1 in which the insulation layer has a base portion that is formed on the peripheral edge portion of the base electrode layer and a protruding portion that extends from the base portion to a side opposite to the wiring layer and protrudes further outside than the peripheral edge portion of the base electrode layer.

[A3] The wiring structure body described in A2 in which the insulation layer has a covering portion that extends from the base portion toward above the wiring layer and covers the wiring layer.

[A4] The wiring structure body described in anyone of A1 to A3 which further includes an electroconductive bonding material formed on the wiring layer.

[A5] The wiring structure body described in any one of A1 to A4 which further includes a support substrate having a major surface and in which the base electrode layer is formed on the major surface of the support substrate and the insulation layer faces the major surface of the support substrate at the region outside the base electrode layer.

[A6] The wiring structure body described in A5 which further includes a sealing insulation layer that is filled into a space formed between the insulation layer and the major surface of the support substrate, thereby sealing the insulation layer.

[A7] The wiring structure body described in A1 which further includes a sealing insulation layer that covers a step portion formed by the base electrode layer and the insulation layer and seals the insulation layer.

[A8] The wiring structure body described in A7 which further includes a base insulation layer that covers the base electrode layer from a side opposite to the insulation layer.

[A9] The wiring structure body described in A8 in which the base insulation layer covers the sealing insulation layer and faces the step portion with the sealing insulation layer interposed therebetween.

[A10] The wiring structure body described in A8 or A9 which further includes a terminal electrode layer that penetrates through the base insulation layer to be connected to the base electrode layer.

[A11] A wiring structure body which includes abase electrode layer, a wiring layer that has a connection portion to be connected externally and is formed on the base electrode layer so as to protrude to a region outside the base electrode layer from above the base electrode layer, and an insulation layer that covers the wiring layer so as to expose the connection portion.

According to this wiring structure body, where an electroconductive bonding material is connected to the connection portion, a molten electroconductive bonding material can be prevented from wetting and spreading by the insulation layer. It is, therefore, possible to prevent the electroconductive bonding material from outflowing.

[A12] The wiring structure body described in A11 in which the wiring layer has a wiring base portion that is formed on the base electrode layer and a wiring protruding portion that extends from the wiring base portion and protrudes to a region outside the base electrode layer.

[A13] The wiring structure body described in A11 or A12 which further includes an electroconductive bonding material formed on the connection portion of the wiring layer.

[A14] The wiring structure body described in any one of A11 to A13 which further includes a support substrate having a major surface and in which the base electrode layer is formed on the major surface of the support substrate, and the wiring layer faces the major surface of the support substrate at the region outside the base electrode layer.

[A15] The wiring structure body described in A14 which further includes a sealing insulation layer that is filled into a space formed between the wiring layer and the major surface of the support substrate, thereby sealing the insulation layer.

[A16] The wiring structure body described in A11 which further includes a sealing insulation layer that covers a step portion formed by the base electrode layer and the wiring layer, and seals the wiring layer.

[A17] The wiring structure body described in A16 which further includes a base insulation layer that covers the base electrode layer from a side opposite to the wiring layer.

[A18] The wiring structure body described in A17 in which the base insulation layer covers the sealing insulation layer and faces the step portion with the sealing insulation layer interposed therebetween.

[A19] The wiring structure body described in A17 or A18 which further includes a terminal electrode layer that is connected to the base electrode layer by penetrating through the base insulation layer.

[A20] An electronic component which includes a substrate that has a major surface, a wiring structure body that is formed on the major surface of the substrate, an electroconductive bonding material that is formed on the wiring structure body, and a chip that is connected to the wiring structure body through the electroconductive bonding material, wherein the wiring structure body includes a base electrode layer that is formed on the major surface of the substrate, a wiring layer that has a connection portion that is formed on the base electrode layer so as to expose a peripheral edge portion of the base electrode layer and connected to the chip through the electroconductive bonding material, and an insulation layer that is formed on a peripheral edge portion of the base electrode layer so as to protrude to a region outside the base electrode layer from above the base electrode layer.

According to this electronic component, the wiring structure body is interposed in a region between the substrate and the chip. The wiring structure body includes the insulation layer formed on the peripheral edge portion of the base electrode layer so as to protrude to a region outside the base electrode layer from above the base electrode layer. Thereby, a molten electroconductive bonding material can be prevented from wetting and spreading by the insulation layer. It is, therefore, possible to prevent the electroconductive bonding material from outflowing.

[A21] An electronic component which includes a sealing insulation layer, a wiring structure body that is disposed insides the sealing insulation layer, an electroconductive bonding material that is disposed inside the sealing insulation layer and is formed on the wiring structure body, and a chip that is disposed inside the sealing insulation layer and is connected to the wiring structure body through the electroconductive bonding material, wherein the wiring structure body includes a base electrode layer which has a facing surface that faces the chip inside the sealing insulation layer and an exposed surface that is positioned at a side opposite to the facing surface and exposed from the sealing insulation layer, a wiring layer which has a connection portion that is interposed between the base electrode layer and the chip, formed on the facing surface of the base electrode layer so as to expose a peripheral edge portion of the base electrode layer and connected to the chip through the electroconductive bonding material, and an insulation layer which is interposed between the base electrode layer and the chip and formed on a peripheral edge portion of the base electrode layer so as to protrude to a region outside the base electrode layer from above the base electrode layer.

According to this electronic component, the wiring structure body and the chip are sealed by the sealing insulation layer. The wiring structure body includes the insulation layer which is formed on the peripheral edge portion of the base electrode layer so as to protrude to a region outside the base electrode layer from above the base electrode layer. Thereby, a molten electroconductive bonding material can be prevented from wetting and spreading by the insulation layer. It is, therefore, possible to prevent the electroconductive bonding material from outflowing.

[A22] The electronic component described in A20 or A21 in which the insulation layer has a base portion that is formed on the peripheral edge portion of the base electrode layer and a protruding portion that extends from the base portion to a side opposite to the wiring layer and protrudes further outside than the peripheral edge portion of the base electrode layer.

[A23] The electronic component described in A22 in which the insulation layer has a covering portion which extends from the base portion toward above the wiring layer and covers the wiring layer so as to expose the connection portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a substrate that has a first major surface on one side and a second major surface on the other side;
    a wiring layer that is formed on the first major surface of the substrate;
    a chip that has a mounting surface on one side and a non-mounting surface on the other side and is disposed on the first major surface of the substrate in a posture that the mounting surface faces the first major surface of the substrate;
    a terminal electrode that is formed on the mounting surface of the chip and is electrically connected to the wiring layer;
    an electrode body that is formed on the wiring layer to be spaced from the chip and is electrically connected to the chip through the wiring layer;

a sealing insulation layer that seals the chip and the electrode body on the first major surface of the substrate such as to expose the non-mounting surface and a portion of the electrode body; and a cover layer that is formed on the sealing insulation layer such as to cover the non-mounting surface of the chip and expose the portion of the electrode body, wherein the cover layer has a peripheral edge formed to be spaced from a peripheral edge of the sealing insulation layer and the electrode body such as to expose a peripheral edge portion of the sealing insulation layer and positioned at a region between the peripheral edge of the sealing insulation layer and the electrode body.

2. The electronic component according to claim 1, wherein the cover layer covers an entirety of the non-mounting surface of the chip.

3. The electronic component according to claim 1, wherein the cover layer includes an insulator.

4. The electronic component according to claim 1, wherein the non-mounting surface of the chip is a ground surface.

5. The electronic component according to claim 1, wherein the sealing insulation layer has an outer surface that extends continuously from the non-mounting surface of the chip.

6. The electronic component according to claim 1, wherein the cover layer has a thickness that is equal to or less than a thickness of the sealing insulation layer.

7. The electronic component according to claim 1, wherein the cover layer has a thickness that is equal to or less than a thickness of the chip.

8. The electronic component according to claim 1, wherein the cover layer has a thickness which is 1 μm or more and 10 μm or less, from 10 μm or more and 20 μm or less, from 20 μm or more and 30 μm or less, from 30 μm or more and 40 μm or less, or from 40 μm or more and 50 μm or less.

9. The electronic component according to claim 1, wherein the first major surface of the substrate includes a recess portion that is recessed toward the second major surface, and the chip is disposed inside the recess portion.

10. The electronic component according to claim 1, wherein the first major surface of the substrate includes a low region made up of a bottom portion of a recess portion that is recessed toward the second major surface, and a high region made up of a region around the recess portion, and the chip is disposed at the high region so as to cover the recess portion.

11. The electronic component according to claim 10, further comprising a lower chip that is disposed inside the recess portion, wherein the sealing insulation layer seals the lower chip inside the recess portion.

12. The electronic component according to claim 1, wherein the first major surface of the substrate is made up of a flat surface.

13. The electronic component according to claim 1, wherein the cover layer partially covers the portion of the electrode body.

14. An electronic component comprising:

a substrate that has a first major surface on one side and a second major surface on the other side;

a wiring layer that is formed on the first major surface of the substrate;

a chip that has a mounting surface on one side and a non-mounting surface on the other side and is disposed on the first major surface of the substrate in a posture that the mounting surface faces the first major surface of the substrate;

a terminal electrode that is formed on the mounting surface of the chip and is electrically connected to the wiring layer;

an electrode body that is formed on the wiring layer to be spaced from the chip and is electrically connected to the chip through the wiring layer;

a sealing insulation layer that seals the chip and the electrode body on the first major surface of the substrate such as to expose the non-mounting surface and a portion of the electrode body; and a cover layer that is formed on the sealing insulation layer such as to cover the non-mounting surface of the chip and expose the portion of the electrode body, wherein the cover layer partially covers the portion of the electrode body.

* * * * *